United States Patent
Valcore, Jr.

(10) Patent No.: US 10,157,729 B2
(45) Date of Patent: Dec. 18, 2018

(54) SOFT PULSING

(71) Applicant: Lam Research Corporation, Fremont, CA (US)

(72) Inventor: John C. Valcore, Jr., Berkeley, CA (US)

(73) Assignee: Lam Research Corporation, Fremont, CA (US)

(*) Notice: Subject to any disclaimer, the term of this patent is extended or adjusted under 35 U.S.C. 154(b) by 497 days.

(21) Appl. No.: 14/260,051

(22) Filed: Apr. 23, 2014

(65) Prior Publication Data

US 2014/0305589 A1    Oct. 16, 2014

Related U.S. Application Data

(63) Continuation-in-part of application No. 13/666,912, filed on Nov. 1, 2012, now Pat. No. 9,171,699, which
(Continued)

(51) Int. Cl.
H01J 37/32    (2006.01)

(52) U.S. Cl.
CPC .. *H01J 37/32146* (2013.01); *H01J 37/32082* (2013.01); *H01J 37/3299* (2013.01);
(Continued)

(58) Field of Classification Search
CPC ........... H01J 37/32146; H01J 37/32183; H01J 37/32082; H01J 37/32174;
(Continued)

(56) References Cited

U.S. PATENT DOCUMENTS 4,314,879 A    2/1982    Hartman et al.
4,353,777 A    10/1982    Jacob
(Continued)

FOREIGN PATENT DOCUMENTS

CN    101110347 A    1/2008
CN    101295345 A    10/2008
(Continued)

OTHER PUBLICATIONS

Thorsten Lill et al., "Controlling ION Energy Within a Plasma Chamber", U.S. Appl. No. 13/930,138, filed Jun. 28, 2013.
(Continued)

*Primary Examiner* — Yuechuan Yu
(74) *Attorney, Agent, or Firm* — Martine Penilla Group, LLP

(57) ABSTRACT

Systems and methods for soft pulsing are described. One of the systems includes a master radiofrequency (RF) generator for generating a first portion of a master RF signal during a first state and a second portion of the master RF signal during a second state. The master RF signal is a sinusoidal signal. The system further includes an impedance matching circuit coupled to the master RF generator via an RF cable to modify the master RF signal to generate a modified RF signal and a plasma chamber coupled to the impedance matching circuit via an RF transmission line. The plasma chamber is used for generating plasma based on the modified RF signal. A statistical measure of the first portion has a positive or a negative slope.

20 Claims, 25 Drawing Sheets

Related U.S. Application Data is a continuation-in-part of application No. 13/550,719, filed on Jul. 17, 2012, now Pat. No. 9,368,329, and a continuation-in-part of application No. 13/531,491, filed on Jun. 22, 2012, now Pat. No. 9,114,666, application No. 14/260,051, which is a continuation-in-part of application No. 13/620,386, filed on Sep. 14, 2012, now Pat. No. 9,197,196, which is a continuation-in-part of application No. 13/531,491.

(60) Provisional application No. 61/701,560, filed on Sep. 14, 2012, provisional application No. 61/602,040, filed on Feb. 22, 2012, provisional application No. 61/602,041, filed on Feb. 22, 2012.

(52) U.S. Cl.
CPC .. *H01J 37/32174* (2013.01); *H01J 37/32183* (2013.01); *H01J 37/32568* (2013.01); *H01J 37/32816* (2013.01); *H01J 37/32981* (2013.01)

(58) Field of Classification Search
CPC .......... H01J 37/32981; H01J 37/32568; H01J 37/32816; H01J 37/3299
See application file for complete search history.

(56) References Cited

U.S. PATENT DOCUMENTS

| | | |
|---|---|---|
| 4,377,961 A | 3/1983 | Bode |
| 4,420,790 A | 12/1983 | Golke et al. |
| 4,454,001 A | 6/1984 | Sternheim et al. |
| 4,457,820 A | 7/1984 | Bergeron et al. |
| 4,500,563 A | 2/1985 | Ellenberger et al. |
| 4,504,799 A | 3/1985 | Elmis et al. |
| 4,585,516 A | 4/1986 | Corn et al. |
| 4,808,258 A | 2/1989 | Otsubo et al. |
| 4,855,897 A | 8/1989 | Shinskey |
| 4,863,549 A | 9/1989 | Grünwald |
| 4,987,005 A | 1/1991 | Suzuki et al. |
| 5,053,725 A | 10/1991 | Gesche et al. |
| 5,084,239 A | 1/1992 | Moulton et al. |
| 5,202,623 A | 4/1993 | LePage |
| 5,244,629 A | 9/1993 | Caputo et al. |
| 5,303,139 A | 4/1994 | Mark |
| 5,474,548 A | 12/1995 | Patrick et al. |
| 5,479,340 A | 12/1995 | Fox et al. |
| 5,562,952 A | 10/1996 | Nakahigashi et al. |
| 5,571,366 A | 11/1996 | Ishii et al. |
| 5,572,170 A | 11/1996 | Collins et al. |
| 5,645,796 A | 7/1997 | Caputo et al. |
| 5,654,043 A | 8/1997 | Shao et al. |
| 5,689,215 A | 11/1997 | Richardson et al. |
| 5,694,207 A | 12/1997 | Hung et al. |
| 5,737,177 A | 4/1998 | Mett et al. |
| 5,764,471 A | 6/1998 | Burkhart |
| 5,788,801 A | 8/1998 | Barbee et al. |
| 5,810,963 A | 9/1998 | Tomioka |
| 5,812,361 A | 9/1998 | Jones et al. |
| 5,866,985 A | 2/1999 | Coultas et al. |
| 5,889,252 A | 3/1999 | Williams et al. |
| 5,892,198 A | 4/1999 | Barnes et al. |
| 5,894,400 A | 4/1999 | Graven et al. |
| 5,900,162 A | 5/1999 | Kawahara et al. |
| 5,917,286 A | 6/1999 | Scholl et al. |
| 5,980,767 A | 11/1999 | Koshimizu et al. |
| 5,989,999 A | 11/1999 | Levine et al. |
| 6,020,794 A | 2/2000 | Wilbur |
| 6,021,672 A | 2/2000 | Lee |
| 6,042,686 A | 3/2000 | Dible et al. |
| 6,048,435 A | 4/2000 | DeOrnellas et al. |
| 6,089,181 A | 7/2000 | Suemasa et al. |
| 6,110,214 A | 8/2000 | Klimasauskas |
| 6,110,287 A | 8/2000 | Arai et al. |
| 6,129,806 A | 10/2000 | Kaji et al. |
| 6,157,867 A | 12/2000 | Hwang et al. |
| 6,165,376 A | 12/2000 | Miyake et al. |
| 6,198,616 B1 | 3/2001 | Dahimene et al. |
| 6,222,321 B1 | 4/2001 | Scholl et al. |
| 6,246,972 B1 | 6/2001 | Klimasauskas |
| 6,287,980 B1 | 9/2001 | Hanazaki et al. |
| 6,312,556 B1 | 11/2001 | Donohoe et al. |
| 6,319,355 B1 | 11/2001 | Holland |
| 6,351,683 B1 | 2/2002 | Johnson et al. |
| 6,383,635 B1 | 5/2002 | King et al. |
| 6,431,112 B1 | 8/2002 | Sill et al. |
| 6,441,555 B1 | 8/2002 | Howald et al. |
| 6,472,822 B1 | 10/2002 | Chen et al. |
| 6,488,807 B1 | 12/2002 | Collins et al. |
| 6,522,121 B2 | 2/2003 | Coumou |
| 6,535,785 B2 | 3/2003 | Johnson et al. |
| 6,563,076 B1 | 5/2003 | Benjamin et al. |
| 6,589,437 B1 | 7/2003 | Collins |
| 6,597,002 B1 | 7/2003 | Kondo |
| 6,669,783 B2 | 12/2003 | Sexton et al. |
| 6,677,246 B2 | 1/2004 | Scanlan et al. |
| 6,750,711 B2 | 6/2004 | Chawla et al. |
| 6,781,317 B1 | 8/2004 | Goodman |
| 6,823,815 B2 | 11/2004 | Han et al. |
| 6,824,813 B1 | 11/2004 | Lill et al. |
| 6,862,557 B2 | 3/2005 | Jones et al. |
| 6,873,114 B2 | 3/2005 | Avoyan et al. |
| 6,972,524 B1 | 12/2005 | Marakhtanov et al. |
| 6,983,215 B2 | 1/2006 | Coumou et al. |
| 7,019,543 B2 | 3/2006 | Quon |
| 7,029,594 B2 | 4/2006 | Yasui et al. |
| 7,042,311 B1 | 5/2006 | Hilliker et al. |
| 7,122,965 B2 | 10/2006 | Goodman |
| 7,169,625 B2 | 1/2007 | Davis et al. |
| 7,323,116 B2 | 1/2008 | Guiney et al. |
| 7,359,177 B2 | 4/2008 | Yang et al. |
| 7,361,287 B2 | 4/2008 | Laermer |
| 7,373,899 B2 | 5/2008 | Sumiya et al. |
| 7,375,038 B2 | 5/2008 | Kumar |
| 7,405,521 B2 | 7/2008 | Dhindsa et al. |
| 7,435,926 B2 | 10/2008 | Jafarian-Tehrani |
| 7,459,100 B2 | 12/2008 | Kiemasz et al. |
| 7,480,571 B2 | 1/2009 | Howald et al. |
| 7,505,879 B2 | 3/2009 | Tomoyasu et al. |
| 7,586,100 B2 | 9/2009 | Raj et al. |
| 7,589,473 B2 | 9/2009 | Suslov |
| 7,718,538 B2 | 5/2010 | Kim et al. |
| 7,728,602 B2 | 6/2010 | Valcore et al. |
| 7,737,042 B2 | 6/2010 | Kim et al. |
| 7,764,140 B2 | 7/2010 | Nagarkatti et al. |
| 7,768,269 B2 | 8/2010 | Piptone et al. |
| 7,771,606 B2 | 8/2010 | Kim et al. |
| 7,811,410 B2 | 10/2010 | Leming et al. |
| 7,858,898 B2 | 12/2010 | Bailey, III et al. |
| 7,875,859 B2 | 1/2011 | Chen et al. |
| 7,967,944 B2 | 6/2011 | Shannon et al. |
| 8,030,849 B2 | 10/2011 | Suslov |
| 8,040,068 B2 | 10/2011 | Coumou et al. |
| 8,053,991 B2 | 11/2011 | Kim et al. |
| 8,080,168 B2 | 12/2011 | Cirigliano |
| 8,080,760 B2 | 12/2011 | Dhindsa et al. |
| 8,083,961 B2 | 12/2011 | Chen et al. |
| 8,103,492 B2 | 1/2012 | Brcka |
| 8,241,701 B2 | 8/2012 | Dordi et al. |
| 8,264,238 B1 | 9/2012 | El-Chouelry |
| 8,271,121 B2 | 9/2012 | Venugopal et al. |
| 8,297,540 B1 | 10/2012 | Vijay |
| 8,368,308 B2 | 2/2013 | Banna et al. |
| 8,404,598 B2 | 3/2013 | Liao et al. |
| 8,471,484 B2 | 6/2013 | Watanabe et al. |
| 8,501,631 B2 | 8/2013 | Valcore et al. |
| 8,609,546 B2 | 12/2013 | Lee et al. |
| 8,679,358 B2 | 3/2014 | Nakagawa |
| 8,808,561 B2 | 8/2014 | Kanarik |
| 8,872,429 B2 | 10/2014 | Rosener |
| 8,883,028 B2 | 11/2014 | Kanarik |
| 8,901,004 B2 | 12/2014 | Kamp et al. |
| 8,901,935 B2 | 12/2014 | Valcore et al. |
| 8,906,196 B2 | 12/2014 | Nishio |

(56) References Cited

U.S. PATENT DOCUMENTS

| | | | |
|---|---|---|---|
| 9,076,646 | B2 | 7/2015 | Sims et al. |
| 2002/0096257 | A1 | 7/2002 | Wang et al. |
| 2002/0132380 | A1 | 9/2002 | Nakano et al. |
| 2002/0157608 | A1 | 10/2002 | Nakano et al. |
| 2002/0186001 | A1* | 12/2002 | Lee .................. H01L 21/67253 340/673 |
| 2003/0082835 | A1 | 5/2003 | McChesney et al. |
| 2003/0103793 | A1 | 6/2003 | Murakoshi et al. |
| 2003/0119308 | A1 | 6/2003 | Geefay et al. |
| 2003/0153989 | A1 | 8/2003 | Scalan et al. |
| 2004/0004708 | A1 | 1/2004 | Willis |
| 2004/0028837 | A1 | 2/2004 | Fink |
| 2004/0045506 | A1 | 3/2004 | Chen et al. |
| 2004/0060660 | A1 | 4/2004 | Klimechy et al. |
| 2004/0061448 | A1 | 4/2004 | Avoyan et al. |
| 2004/0087047 | A1 | 5/2004 | Jaiswal et al. |
| 2004/0107906 | A1 | 6/2004 | Collins et al. |
| 2004/0124077 | A1 | 7/2004 | Christie |
| 2004/0135590 | A1 | 7/2004 | Quon |
| 2004/0154540 | A1 | 8/2004 | Hayami et al. |
| 2004/0222184 | A1 | 11/2004 | Hayami et al. |
| 2004/0226657 | A1 | 11/2004 | Hoffman |
| 2004/0259276 | A1 | 12/2004 | Yue et al. |
| 2005/0034811 | A1 | 2/2005 | Mahoney et al. |
| 2005/0034816 | A1 | 2/2005 | Shannon et al. |
| 2005/0039682 | A1 | 2/2005 | Dhindsa et al. |
| 2005/0057165 | A1 | 3/2005 | Goodman |
| 2005/0067386 | A1 | 3/2005 | Mitrovic |
| 2005/0090118 | A1 | 4/2005 | Shannon et al. |
| 2005/0133163 | A1 | 6/2005 | Shannon et al. |
| 2005/0134186 | A1 | 6/2005 | Brouk et al. |
| 2005/0151479 | A1 | 7/2005 | Avoyan et al. |
| 2005/0205208 | A1 | 9/2005 | Sagae et al. |
| 2005/0205532 | A1 | 9/2005 | Patrick et al. |
| 2005/0217797 | A1 | 10/2005 | Jafarian-Tehrani |
| 2005/0234574 | A1 | 10/2005 | Lam et al. |
| 2005/0241762 | A1* | 11/2005 | Paterson ........... H01J 37/32082 156/345.28 |
| 2005/0252884 | A1 | 11/2005 | Lam et al. |
| 2005/0283321 | A1 | 12/2005 | Yue et al. |
| 2006/0005928 | A1 | 1/2006 | Howald et al. |
| 2006/0054596 | A1 | 3/2006 | Howard |
| 2006/0065623 | A1 | 3/2006 | Guiney et al. |
| 2006/0065631 | A1 | 3/2006 | Cheng et al. |
| 2006/0065632 | A1 | 3/2006 | Cheng et al. |
| 2006/0066248 | A1 | 3/2006 | Chistyakov |
| 2006/0081558 | A1 | 4/2006 | Collins et al. |
| 2006/0081564 | A1 | 4/2006 | Moroz et al. |
| 2006/0088655 | A1 | 4/2006 | Collins et al. |
| 2006/0100824 | A1 | 5/2006 | Moriya |
| 2006/0169582 | A1 | 8/2006 | Brown et al. |
| 2006/0191880 | A1* | 8/2006 | Kwon .................. H01J 37/321 219/121.57 |
| 2006/0231526 | A1 | 10/2006 | Donohue |
| 2006/0232471 | A1 | 10/2006 | Coumou |
| 2006/0267504 | A1 | 11/2006 | VanDrie et al. |
| 2006/0278608 | A1 | 12/2006 | Hoffman |
| 2007/0021935 | A1 | 1/2007 | Larson et al. |
| 2007/0065594 | A1 | 3/2007 | Chiang et al. |
| 2007/0095788 | A1 | 5/2007 | Hoffman et al. |
| 2007/0127188 | A1 | 6/2007 | Yang et al. |
| 2007/0247074 | A1 | 10/2007 | Paterson et al. |
| 2007/0252580 | A1 | 11/2007 | Dine et al. |
| 2007/0262723 | A1 | 11/2007 | Ikenouchi |
| 2007/0284246 | A1 | 12/2007 | Keil et al. |
| 2008/0029385 | A1 | 2/2008 | Koshimizu et al. |
| 2008/0050537 | A1 | 2/2008 | Godyak |
| 2008/0074255 | A1 | 3/2008 | Park et al. |
| 2008/0179297 | A1* | 7/2008 | Bailey ............... H01J 37/32366 219/69.15 |
| 2008/0237031 | A1 | 10/2008 | Sato |
| 2008/0241016 | A1 | 10/2008 | Kato et al. |
| 2009/0105980 | A1 | 4/2009 | Tetsuka et al. |
| 2009/0151871 | A1 | 6/2009 | Pease et al. |
| 2009/0210181 | A1 | 8/2009 | Swank |
| 2009/0255800 | A1 | 10/2009 | Koshimizu |
| 2009/0284156 | A1* | 11/2009 | Banna .................. H01J 37/321 315/111.21 |
| 2009/0294061 | A1 | 12/2009 | Shannon et al. |
| 2009/0294414 | A1 | 12/2009 | Shannon et al. |
| 2009/0295296 | A1 | 12/2009 | Shannon et al. |
| 2009/0308734 | A1 | 12/2009 | Krauss |
| 2010/0018648 | A1 | 1/2010 | Collins et al. |
| 2010/0039747 | A1 | 2/2010 | Sansoni et al. |
| 2010/0099266 | A1 | 4/2010 | Oswald et al. |
| 2010/0136793 | A1 | 6/2010 | Chen et al. |
| 2010/0248488 | A1 | 9/2010 | Agarwal et al. |
| 2010/0258246 | A1 | 10/2010 | Iwakoshi et al. |
| 2010/0270141 | A1 | 10/2010 | Carter et al. |
| 2010/0314048 | A1 | 12/2010 | Long et al. |
| 2010/0332201 | A1 | 12/2010 | Albarede et al. |
| 2011/0031216 | A1 | 2/2011 | Liao et al. |
| 2011/0062014 | A1 | 3/2011 | Gutsol et al. |
| 2011/0097901 | A1 | 4/2011 | Banna et al. |
| 2011/0115492 | A1 | 5/2011 | Valcore, Jr. et al. |
| 2011/0118863 | A1 | 5/2011 | Valcore, Jr. |
| 2011/0137446 | A1 | 6/2011 | Valcore, Jr. et al. |
| 2011/0139748 | A1 | 6/2011 | Donnelly et al. |
| 2012/0000887 | A1 | 1/2012 | Eto et al. |
| 2012/0052689 | A1 | 3/2012 | Tokashiki |
| 2012/0073754 | A1 | 3/2012 | De la Llera et al. |
| 2012/0160806 | A1 | 6/2012 | Godyak et al. |
| 2012/0187844 | A1 | 7/2012 | Hoffman et al. |
| 2012/0227484 | A1 | 9/2012 | Chen et al. |
| 2012/0262064 | A1 | 10/2012 | Nagarkatti et al. |
| 2013/0119018 | A1 | 5/2013 | Kanarik et al. |
| 2013/0122711 | A1 | 5/2013 | Marakbtanov et al. |
| 2013/0168354 | A1 | 7/2013 | Kanarik |
| 2013/0180951 | A1 | 7/2013 | Indrakanti et al. |
| 2013/0214828 | A1 | 8/2013 | Valcore et al. |
| 2014/0009073 | A1 | 1/2014 | Valcore et al. |
| 2014/0062303 | A1 | 3/2014 | Hoffman et al. |
| 2014/0066838 | A1 | 3/2014 | Hancock |
| 2014/0076713 | A1 | 3/2014 | Valcore, Jr. et al. |
| 2014/0167613 | A1 | 6/2014 | Fong et al. |
| 2014/0172335 | A1 | 6/2014 | Valcore, Jr. et al. |
| 2014/0305589 | A1 | 10/2014 | Valcore, Jr. et al. |
| 2014/0345802 | A1 | 11/2014 | Umehara et al. |
| 2014/0361690 | A1 | 12/2014 | Yamada et al. |
| 2015/0002018 | A1 | 1/2015 | Lill et al. |
| 2015/0007940 | A1 | 1/2015 | Kaneko et al. |
| 2015/0020971 | A1 | 1/2015 | Kanarik |

FOREIGN PATENT DOCUMENTS

| | | | |
|---|---|---|---|
| EP | 0363982 | A2 | 4/1990 |
| EP | 0474137 | A2 | 3/1992 |
| EP | 0474137 | A3 | 3/1992 |
| EP | 0838840 | A2 | 4/1998 |
| EP | 0838840 | A3 | 6/1999 |
| EP | 2405721 | A2 | 1/2012 |
| JP | S57131374 | A | 8/1982 |
| JP | H06-338476 | A | 12/1994 |
| JP | H07-142400 | A | 6/1995 |
| JP | 08-020880 | A | 1/1996 |
| JP | H10-041281 | A | 2/1998 |
| JP | H10-074730 | A | 3/1998 |
| JP | 2000200771 | A * | 7/2000 |
| JP | 2001-127045 | A | 5/2001 |
| JP | 2002-063999 | A | 2/2002 |
| JP | 2002359232 | A * | 12/2002 |
| JP | 2003-282545 | A | 10/2003 |
| JP | 2004-239211 | A | 8/2004 |
| JP | 2004239211 | A | 8/2004 |
| JP | 2004-335594 | A | 11/2004 |
| JP | 2005-130198 | A | 5/2005 |
| JP | 2005130198 | | 5/2005 |
| JP | 2005-284046 | A | 10/2005 |
| JP | 2005284046 | A | 10/2005 |
| JP | 2009-129398 | A | 6/2009 |
| JP | 2010-504614 | A | 2/2010 |
| KR | 10-2005-0088438 | A | 9/2005 |
| KR | 10-2005-0089995 | A | 9/2005 |
| KR | 10-2007-0031915 | A | 3/2007 |

(56) References Cited

FOREIGN PATENT DOCUMENTS

| TW | 201038143 A | 10/2010 |
|---|---|---|
| WO | 1999014699 A1 | 3/1999 |
| WO | WO 1999014699 A1 | 3/1999 |
| WO | 2000026956 A1 | 5/2000 |
| WO | WO 199145 A1 | 12/2001 |
| WO | WO 2006135515 A1 | 12/2006 |
| WO | 2008002938 A2 | 1/2008 |
| WO | WO 2008002938 A2 | 1/2008 |
| WO | WO 2008036210 A2 | 3/2008 |
| WO | 2012054306 A2 | 4/2012 |
| WO | WO 2012054306 A2 | 4/2012 |
| WO | WO 2013072834 A1 | 5/2013 |
| WO | 2014070838 A1 | 5/2014 |
| WO | WO 2014070838 A1 | 5/2014 |

OTHER PUBLICATIONS

Damon et al., "Synchronous Pulsed Plasma for Silicon Etch Applications", ECS Transactions, 27 (1) pp. 717-723 (2010), Publication by: The Electrochemical Society.

"Electromagnetic Waves and Antennas", Sophocles J. Orfanidis, Rutgers University, Aug. 25, 2013, Chapter 10.10.

Lars Christoph Comparison of Applied Materials DPS chambers used for poly-Si Etch process by plasma parameters Dec. 6, 2000 2nd workshop on Self excited electron plasma resonance spectroscopy Dredsen Germany.

Christoph Steuer TOOL Comparison at GC stack Etch in LAM TCP Using Plasma Parameters (SEERS) Dec. 12, 2000 2nd workshop on self excited electron plasma resonance Sepectroscopy Germany.

Blauw et al., "Ion Energy Selection With Pulse-Shaped RF-Bias", XXVIIth ICPIG, Eindhoven University of Technology, the Netherlands, Jul. 18-22, 2005, 4 pages.

Kure T, Gotoh Y, Kawakami H, Tachi S: "Highly Anisotropic Microwave Plasma Etching for High Packing Density Silicon", Jun. 2, 1992, IEEE, pp. 48-49 (2 pages).

Christoph, Lars, Comparison of Applied Materials DPS Chambers used for poly-Si Etch process by Plasma Parameters, Dec. 6, 2000, 2nd workshop on self excited electron plasma resonance spectroscopy, Dresden, Germany.

Dobbyn, Kieran, "Design and Application of a Plasma Impedance Monitor for RF Plasma Diagnostics", a thesis for the degree of M.Sc., Jun. 2000, 84 pages, Dublin City University.

Han et al., "Power Accuracy and Source-Pull Effect for a High-Power RF Generator", Abstract, Jun. 16, 2006, 67th ARFTG Conference, San Francisco, CA, 2 pages.

Han et al., "Power Accuracy and Source-Pull Effect for a High-Power RF Generator", Jun. 16, 2006, 67th ARFTG Conference, San Francisco, CA, pp. 81-92.

Steuer, Christoph, Tool Comparison at GC Stack Etch in LAM TCP Using Plasma Parameters (SEERS), Dec. 12, 2000, 2nd workshop on self excited electron plasma resonance spectroscopy, Dresden, Germany.

Yang et al., "Real-Time Fault Classification for Plasma Processes", Jul. 6, 2011, Sensors 2011, 11(7), pp. 7037-7054 (18 pages).

PCT/IB2013/051010 International Search Report and Written Opinion, dated Jul. 3, 2013 (13 pages).

PCT/US2010/057450 International Search Report and Written Opinion, dated Jul. 18, 2011 (9 pages).

PCT/US2010/057478 International Search Report and Written Opinion, dated Jul. 26, 2011 (6 pages).

PCT/US2011/063422 International Search Report and Written Opinion, dated Mar. 28, 2012 (9 pages).

* cited by examiner

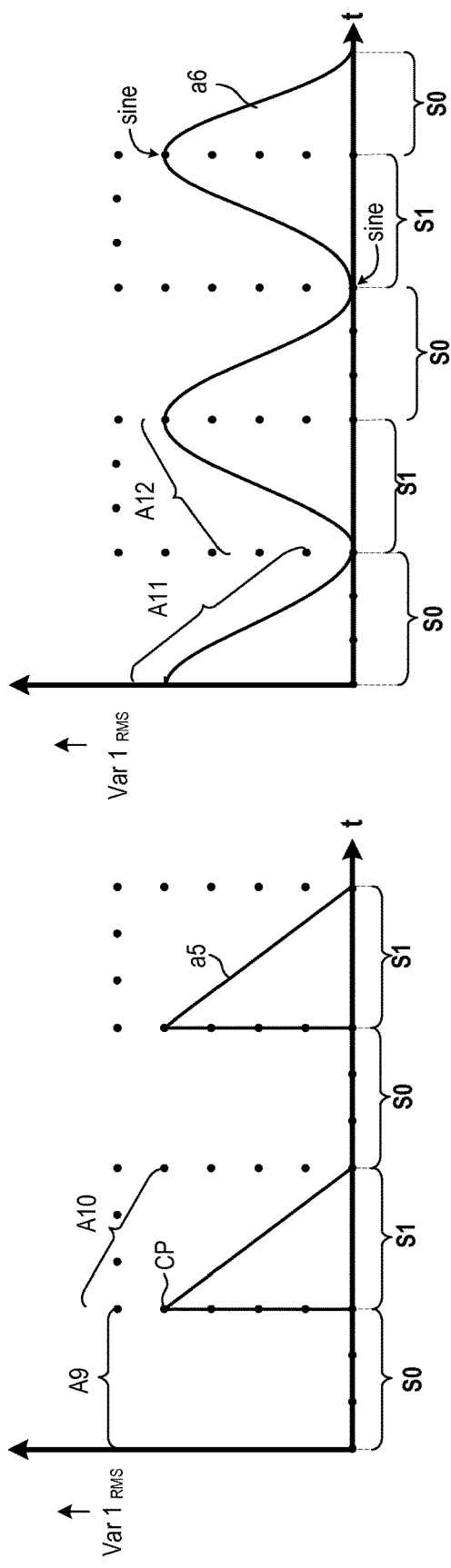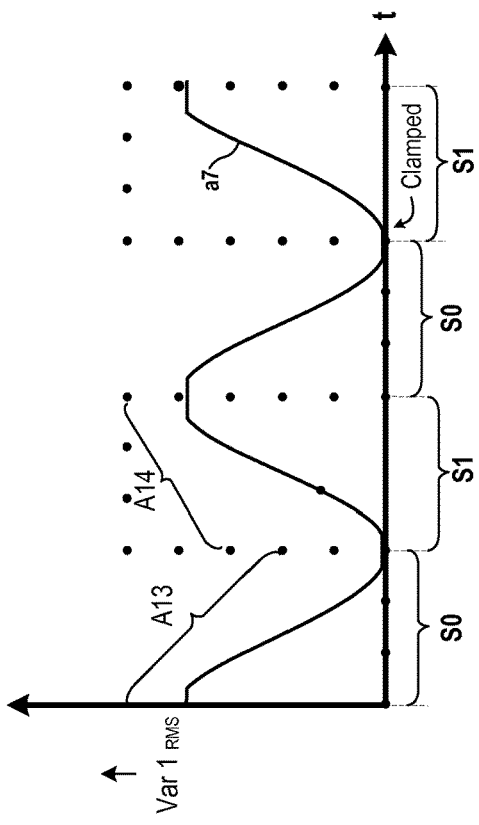
FIG. 1B

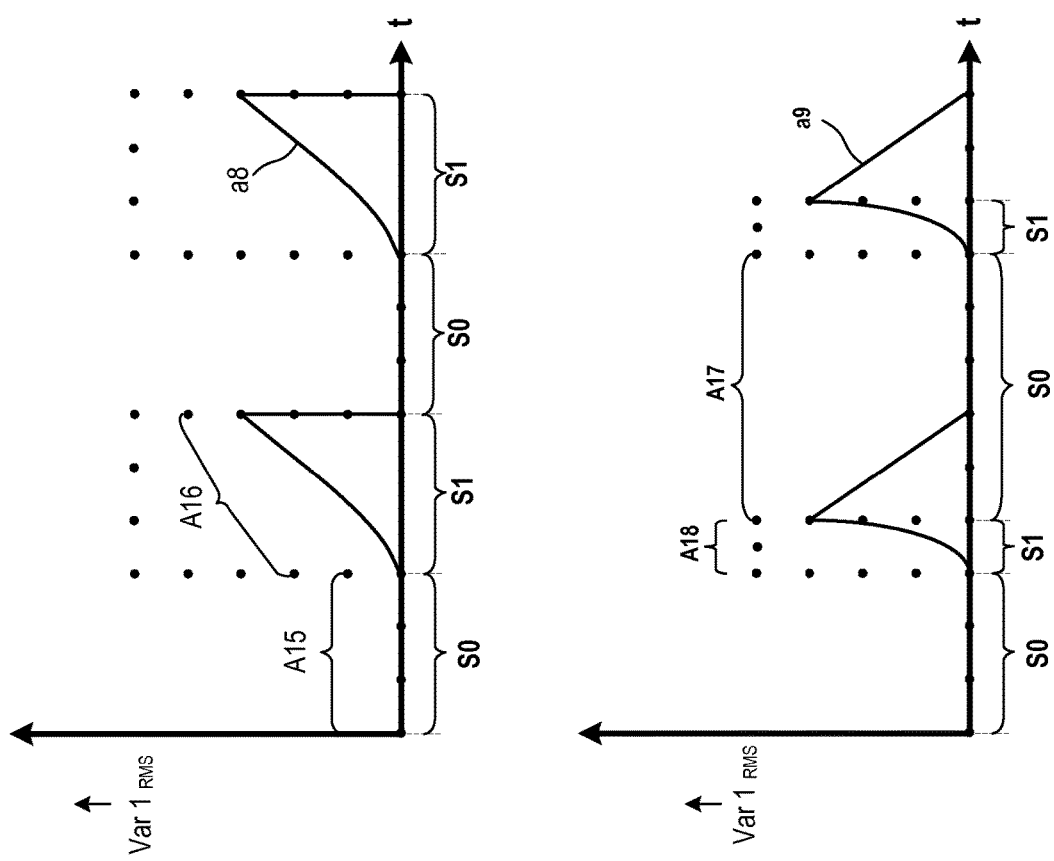

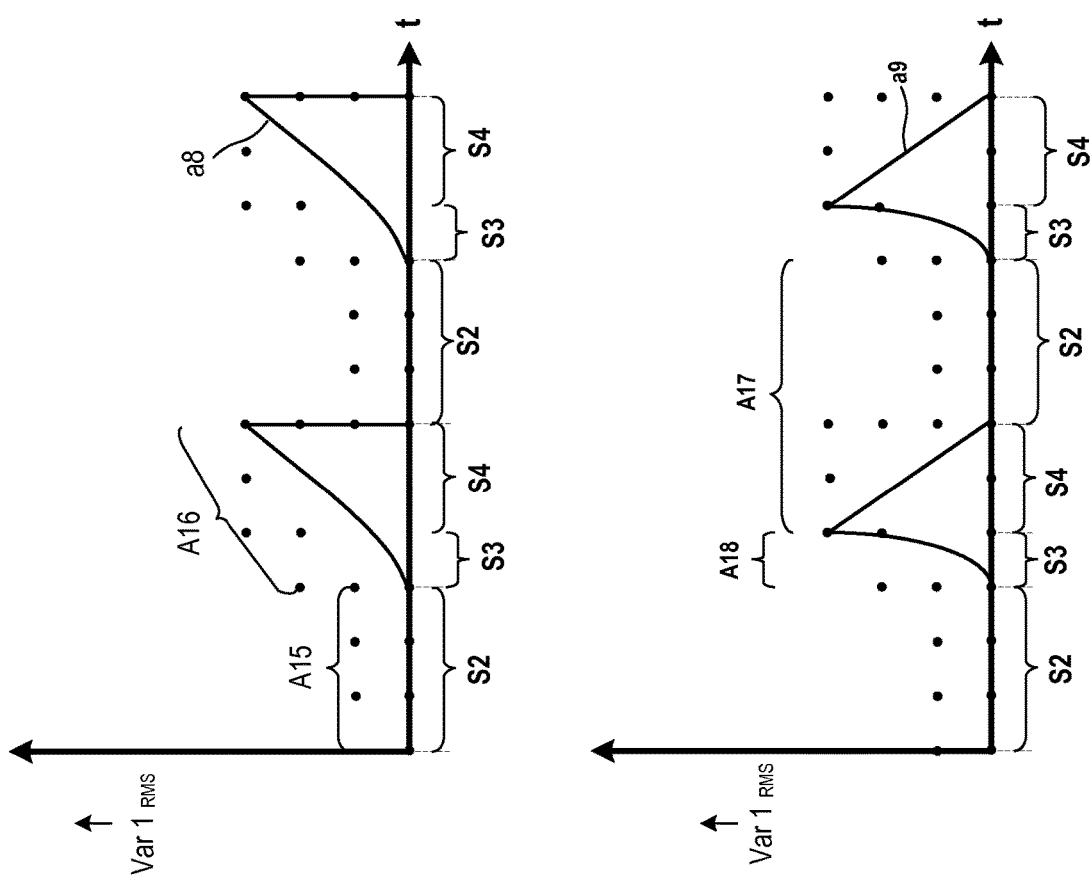

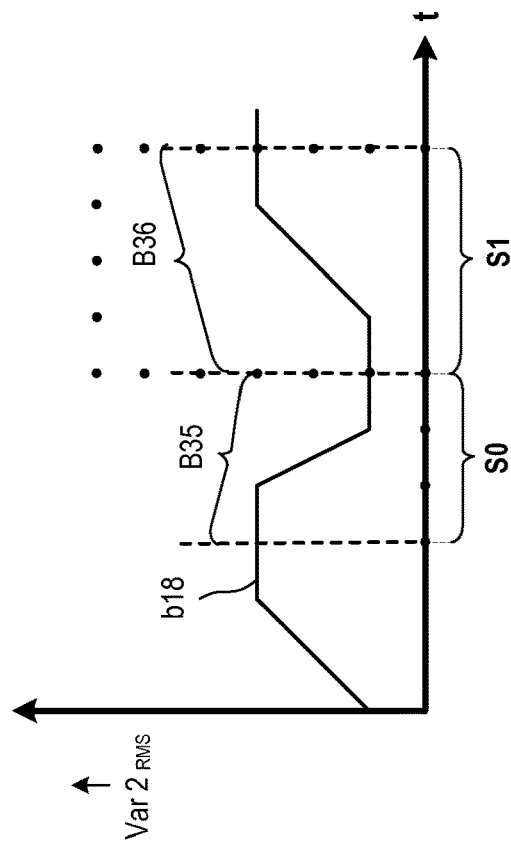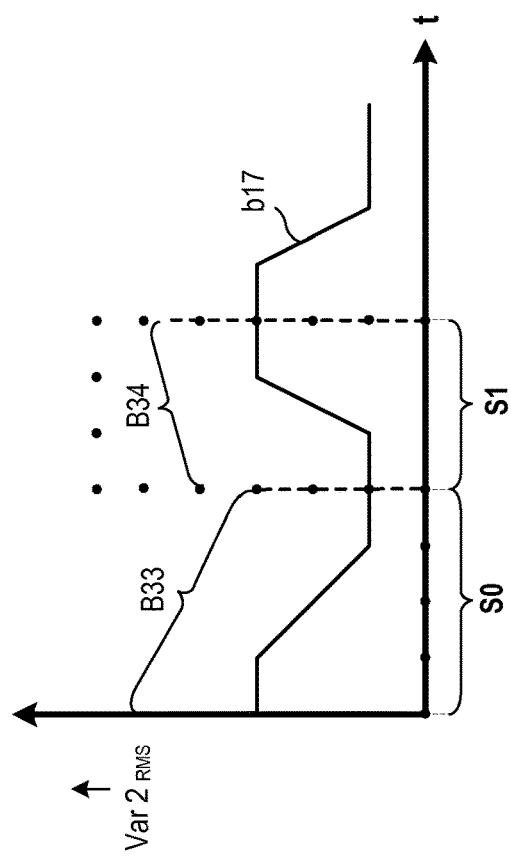
FIG. 2F

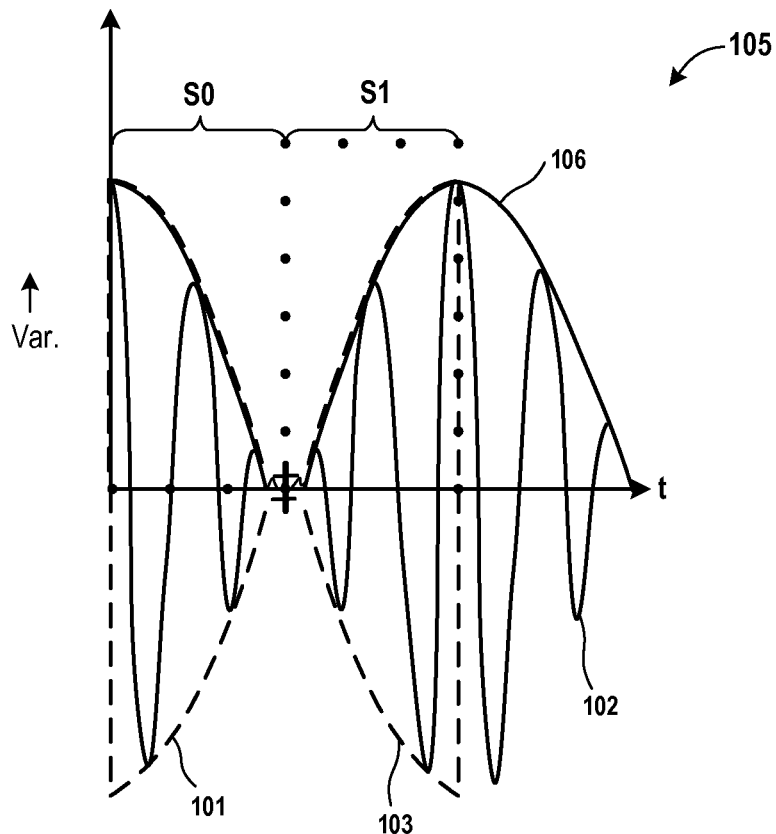
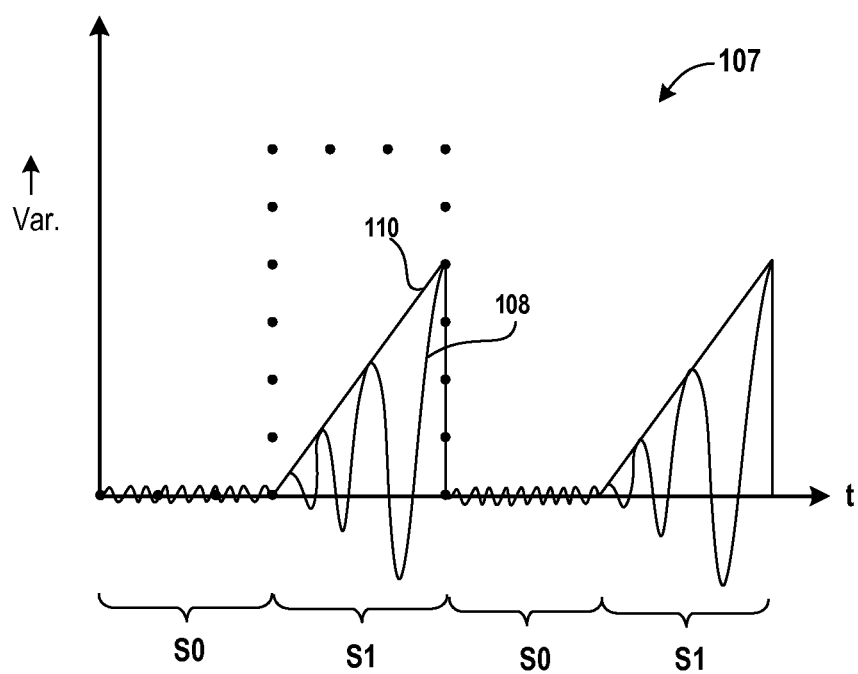
FIG. 3

SOFT PULSING

CLAIM OF PRIORITY

The present patent application is a continuation-in-part of and claims the benefit of and priority, under 35 U.S.C. § 120, to application Ser. No. 13/666,912, filed on Nov. 1, 2012, and titled "Impedance Based Adjustment of Power and Frequency", which claims the benefit of and priority, under 35 U.S.C. § 119(e), to U.S. Provisional Patent Application No. 61/701,560, filed on Sep. 14, 2012, and titled "Impedance-based Adjustment of Power and Frequency", both of which are incorporated by reference herein in their entirety for all purposes.

The application Ser. No. 13/666,912 is a continuation-in-part of and claims the benefit of and priority, under 35 U.S.C. § 120, to U.S. patent application Ser. No. 13/531,491, filed on Jun. 22, 2012, and titled "Methods and Apparatus For Controlling Plasma In A Plasma Processing System", which is incorporated by reference herein in its entirety for all purposes.

The U.S. patent application Ser. No. 13/531,491 claims the benefit of and priority, under 35 U.S.C. § 119(e), to U.S. Provisional Patent Application No. 61/602,040, filed on Feb. 22, 2012, and titled "Frequency Enhanced Impedance Dependent Power Control For Multi-frequency Pulsing", which is incorporated by reference herein in its entirety for all purposes.

The U.S. patent application Ser. No. 13/531,491 claims the benefit of and priority, under 35 U.S.C. § 119(e), to U.S. Provisional Patent Application No. 61/602,041, filed on Feb. 22, 2012, and titled "Methods and Apparatus for Synchronizing RF Pulses In a Plasma Processing System", which is incorporated by reference herein in its entirety for all purposes.

The application Ser. No. 13/666,912 is a continuation-in-part of and claims the benefit of and priority, under 35 U.S.C. § 120, to U.S. patent application Ser. No. 13/550,719, filed on Jul. 17, 2012, and titled "Methods and Apparatus For Synchronizing RF Pulses In A Plasma Processing System", which is incorporated by reference herein in its entirety for all purposes.

The U.S. patent application Ser. No. 13/550,719 claims the benefit of and priority, under 35 U.S.C. § 119(e), to U.S. Provisional Patent Application No. 61/602,041, filed on Feb. 22, 2012, and titled "Methods and Apparatus for Synchronizing RF Pulses In A Plasma Processing System", which is incorporated by reference herein in its entirety for all purposes.

The present patent application is a continuation-in-part of and claims the benefit of and priority, under 35 U.S.C. § 120, to application Ser. No. 13/620,386, filed on Sep. 14, 2012, and titled "State-Based Adjustment of Power and Frequency", which claims the benefit of and priority, under 35 U.S.C. § 119(e), to U.S. Provisional Patent Application No. 61/602,040, filed on Feb. 22, 2012, and titled "Frequency Enhanced Impedance Dependent Power Control For Multi-frequency Pulsing", which is incorporated by reference herein in its entirety for all purposes.

The application Ser. No. 13/620,386 is a continuation-in-part of and claims the benefit of and priority, under 35 U.S.C. § 120, to U.S. patent application Ser. No. 13/531,491, filed on Jun. 22, 2012, and titled "Methods and Apparatus For Controlling Plasma In A Plasma Processing System", which is incorporated by reference herein in its entirety.

BACKGROUND

A system for etching a material from a wafer or depositing a material onto the wafer includes a generator for generating a radio frequency (RF) signal and a plasma chamber. The wafer is located within the plasma chamber. The generator supplies the RF signal to the plasma chamber to etch the wafer or to deposit materials on the wafer.

A control of the etching or the depositing increases wafer yield, saves costs, and reduces time of etching or depositing materials on the wafer. However, it is difficult to control the etching or the depositing.

It is within this context that embodiments described in the present disclosure arise.

SUMMARY

The present disclosure relates to systems and methods for soft pulsing.

In various embodiments, one of the methods includes reducing a rate of change of impedance of plasma with respect to time, e.g., reducing $dZ/dt$, where $Z$ is plasma impedance and $t$ is time, etc. A sudden increase or decrease in the rate of the change of impedance causes an instability in plasma and the instability results in a lack of control over etching a work piece or depositing materials on the work piece. The rate of change of impedance is reduced by supplying a radio frequency (RF) signal having a statistical measure that further has a positive slope or a negative slope to a plasma chamber. For example, an RF signal having a root mean square (RMS) value that gradually increases or decreases over a period of time to the plasma chamber compared to providing an RF signal having an RMS value that suddenly increases or decreases. The provision of the positive slope or the negative slope provides a control over change in impedance of plasma. The control over the change in the impedance allows a control over the etching or the deposition process.

In some embodiments, a system for soft pulsing includes a master RF generator for generating a first portion of a master RF signal during a first state and a second portion of the master RF signal during a second state. The master RF signal is a sinusoidal signal. The system further includes an impedance matching circuit coupled to the master RF generator via an RF cable to modify the master RF signal to generate a modified RF signal and a plasma chamber coupled to the impedance matching circuit via an RF transmission line. The plasma chamber is used for generating plasma based on the modified RF signal. A statistical measure of the first portion has a positive or a negative slope.

In various embodiments, a method includes generating a first portion of a master RF signal during a first state and a second portion of the master RF signal during a second state. The method further includes matching an impedance of a load with a source based on the master RF signal to produce a modified RF signal. The source includes an RF generator and an RF cable. The load includes an RF transmission line and a plasma chamber. The method includes receiving the modified RF signal to generate plasma within the plasma chamber. A statistical measure of the first portion has a positive or a negative slope.

In several embodiments, a plasma system includes a first RF generator for generating a first portion of a first RF signal during a first state and a second portion of the first RF signal during a second state. The first RF signal is a sinusoidal signal. The first RF generator is coupled to an impedance matching circuit that is coupled to a plasma chamber. A statistical measure of the first portion of the first RF signal has a positive slope or a negative slope.

Some advantages of the above-described embodiments include controlling a rate of change of impedance of plasma within the plasma chamber. The rate of change is controlled by controlling a slope of a statistical measure during a transition from one state of a digital pulsed signal to another state of the digital pulsed signal. The slope is controlled to be positive or negative. In some embodiments, the slope is non-zero and finite for at least a period of time of a cycle of the digital pulsed signal. By controlling the slope, the change in the plasma impedance is controlled to control an etch rate or a deposition rate or a processing rate of processing a work piece.

Other advantages of some of the embodiments described herein include providing feedback of a parameter, e.g., a flow rate, a pressure, a gap, etc., associated with a plasma system to a processor. The processor determines based on the feedback whether a delay is to be added to a pulsed signal that is provided to an RF generator. The feedback is used to synchronize a response time of mechanical components of the plasma system with that of electrical components of the plasma system.

Other aspects will become apparent from the following detailed description, taken in conjunction with the accompanying drawings.

BRIEF DESCRIPTION OF THE DRAWINGS

Various embodiments of the present disclosure may best be understood by reference to the following description taken in conjunction with the accompanying drawings.

FIG. 1B shows additional graphs to illustrate soft pulsing of the first variable, in accordance with several embodiments of the present disclosure.

FIG. 1C-1 shows graphs to illustrate soft pulsing of the first variable, in accordance with several embodiments of the present disclosure.

FIG. 1C-2 shows graphs to illustrate soft pulsing of the first variable in synchronization with three states of a pulsed signal, in accordance with several embodiments of the present disclosure FIG. 1D-1 shows more graphs to illustrate soft pulsing of the first variable, in accordance with some embodiments of the present disclosure.

FIG. 1D-2 shows more graphs to illustrate soft pulsing of the first variable in synchronization with three states of a pulsed signal, in accordance with some embodiments of the present disclosure.

FIG. 2C-1 shows graphs to illustrate soft pulsing of the second variable, in accordance with several embodiments of the present disclosure.

FIG. 2C-2 shows graphs to illustrate soft pulsing of the second variable in synchronization with three states of a pulsed signal, in accordance with several embodiments of the present disclosure.

FIG. 2D-1 shows more graphs to illustrate soft pulsing of the second variable, in accordance with some embodiments of the present disclosure.

FIG. 2D-2 shows more graphs to illustrate soft pulsing of the second variable in synchronization with three states of a pulsed signal, in accordance with some embodiments of the present disclosure.

FIG. 2F shows graphs to illustrate soft pulsing of the second variable, in accordance with various embodiments of the present disclosure.

FIG. 3 is a diagram of graphs to illustrate that each graph of FIGS. 1A thru 1F and of FIGS. 2A thru 2F plots a statistical measure of a sinusoidal signal that is generated by a radio frequency (RF) generator, in accordance with various embodiments of the present disclosure.

DETAILED DESCRIPTION

The following embodiments describe systems and methods for performing soft pulsing.

Figure 1A:
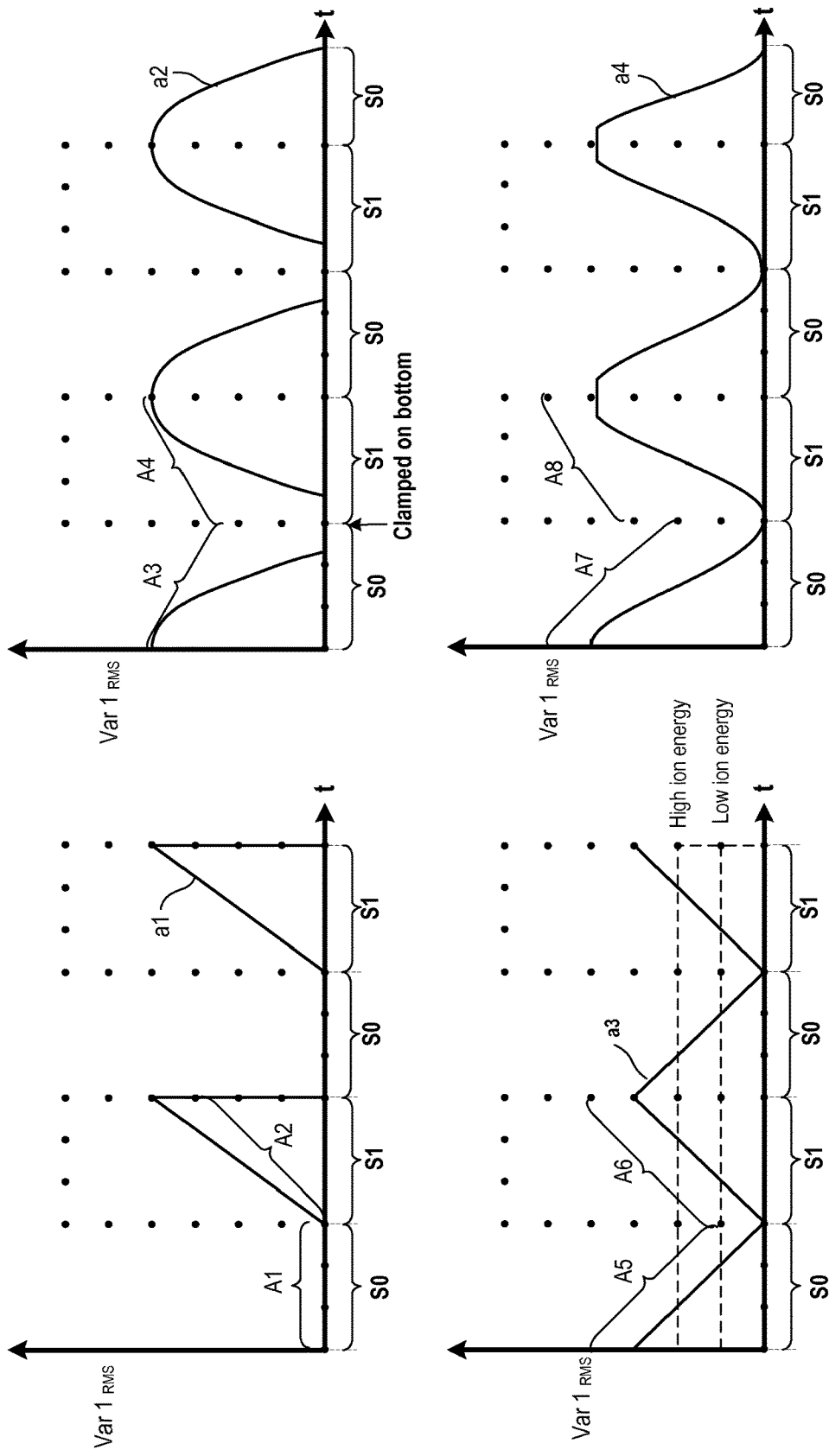
FIG. 1A shows graphs to illustrate soft pulsing of a first variable, in accordance with various embodiments of the present disclosure.

FIG. 1A shows embodiments of graphs a1, a2, a3, and a4 to illustrate soft pulsing of a first variable, e.g., variable 1, etc., or a first parameter, e.g., parameter 1, etc. Each graph a1 thru a4 plots root mean square (RMS) values, which are examples of the first variable, versus time t. Examples of the first variable include a power of a radio frequency (RF) generator, an inverse of the power, a voltage of the RF generator, a current of the RF generator, an inverse of the voltage, an inverse of the current, a frequency of the RF generator, and an inverse of the frequency. Examples of the first parameter include a gap between an upper electrode and a chuck of a plasma chamber, a pressure within the plasma chamber, and a rate of flow of one or more process gases into the plasma chamber. The upper electrode, the chuck, the plasma chamber, and the one or more process gases are further described below.

In some embodiments, a power of the RF generator is a power of an RF signal generated and supplied by the RF generator. In various embodiments, a power of the RF generator is a power of a signal reflected from the plasma chamber towards the RF generator.

In some embodiments, a power of the RF generator is RF power delivered by the RF generator. For example, the RF power delivered is a difference between RF power an RF signal supplied by the RF generator and RF power an RF signal that is reflected back towards the RF generator from the plasma chamber.

In various embodiments, a current of the RF generator is a current of an RF signal generated and supplied by the RF generator. In various embodiments, a current of the RF generator is a current of a signal reflected from the plasma chamber towards the RF generator.

In some embodiments, a current of the RF generator is current delivered by the RF generator. For example, the current delivered is a difference between current of an RF signal supplied by the RF generator and current an RF signal that is reflected back towards the RF generator from the plasma chamber.

In several embodiments, a voltage of the RF generator is a voltage of an RF signal generated and supplied by the RF generator. In various embodiments, a voltage of the RF generator is a voltage of a signal reflected from the plasma chamber towards the RF generator.

In some embodiments, a voltage of the RF generator is voltage delivered by the RF generator. For example, the voltage delivered is a difference between voltage of an RF signal supplied by the RF generator and voltage an RF signal that is reflected back towards the RF generator from the plasma chamber.

In various embodiments, a frequency of the RF generator is a frequency of an RF signal generated and supplied by the RF generator. In various embodiments, a frequency of the RF generator is a frequency of a signal reflected from the plasma chamber towards the RF generator.

In some embodiments, a frequency of the RF generator is frequency of an RF signal delivered by the RF generator. For example, the frequency of an RF signal delivered is a difference between frequency of an RF signal supplied by the RF generator and frequency an RF signal that is reflected back towards the RF generator from the plasma chamber.

The root mean square values have a state S0 and a state S1. The states S0 and S1 recur periodically. Each state is associated with a combination of a power of the RF generator, a frequency of the RF generator, a current of the RF generator, a voltage of the RF generator, a pressure within the plasma chamber, a gap between the upper electrode and the chuck, and a rate of flow of one or more process gases within the plasma chamber. For example, a first combination of frequency, power, pressure, gap, and a rate of flow of chemistry is used during the state S0 and a second combination of frequency, power, pressure, gap, and a rate of flow of chemistry is used during the state S1. In some embodiments, a chemistry includes one or more process gases. To further illustrate, in the first combination, a first frequency value, power, pressure, gap, and a rate of flow of chemistry are used and in the second combination, a second frequency value, and the same amount of power, the same amount of pressure, the same amount of gap, and the same rate of flow of the same chemistry as in the first combination are used. As another illustration, in the first combination, the first frequency value, a first power value, pressure, gap, and a rate of flow of chemistry are used and in the second combination, the second frequency value, a second power value, and the same amount of pressure, the same amount of gap, and the same rate of flow of the same chemistry as that in the first combination are used. In some embodiments, pressure within the plasma chamber is wafer area pressure (WAP).

In various embodiments, the state S0 is generated when a clock signal, e.g., a pulsed signal, etc., is pulsed to a low state from a high state and the state S1 is generated when the clock signal is pulsed to the high state from the low state. During the state S0, the clock signal is in the low state and during the state S1, the clock signal is in the high state. In some embodiments, the clock signal has a 50% duty cycle. In various embodiments, the clock signal has a duty cycle other than 50%, e.g., 10%, 20%, 60%, 80%, etc. For example, the state S0 occurs 10% of a clock cycle and the state S1 occurs for the remaining 90% of the clock cycle. In some embodiments, the clock signal is generated by a clock source, e.g., a crystal oscillator, a processor, etc.

In several embodiments, during the state S0, the clock signal is in the high state and during the state S1, the clock signal is in the low state.

In some embodiments, instead of RMS values, any other statistical measure, e.g., mean values, or peak-to-peak amplitude, or zero-to-peak amplitude, or median values, etc., is used as a variable in a graph and plotted versus the time t.

The graph a1 indicates a positive saw tooth waveform that has a constant value, e.g., a set of amplitudes A1, etc., during the state S0, ramps up during the state S1 within a positive linear slope to have a set of amplitudes A2, and drops back to the constant value at an end of the state S1. The drop back to the constant value is during a transition from the state S1 to the state S0.

In some embodiments, during the state S0, a different processing operation is performed on a work piece than that performed during the state S1. For example, during the state S1, the work piece is etched and during the state S0, materials are deposited on the work piece. The work piece is further described below.

In various embodiments, during the state S1, an ion energy of plasma within the plasma chamber is greater than an etch rate threshold to maximize etching of the work piece during the state S1 and to increase an etch rate to deposition rate ratio. Moreover, during the state S0, an ion energy of plasma within the plasma chamber is less than the etch rate threshold to minimize etching of the work piece during the state S0 and to decrease the etch rate to deposition rate ratio.

In some embodiments, a time period of occurrence of the state S1 or the state S0 is greater than 5% of a total time period of the states S1 and S0.

With reference to the graph a2, during the state S0, the graph a2 has a sinusoidal shape with a negative slope during a portion of the state S0 and drops down to a constant value during the remaining portion of the state S0. Moreover, during the state S1, the graph a2 has the constant value during a portion of the state S1 and then becomes sinusoidal having a positive slope during the remaining portion of the state S1. The graph a2 is sinusoidal except that the sinusoid is clamped at a bottom of the sinusoid. The graph a2 is clamped during a portion of a time period of occurrence of the sinusoid with the negative slope and a portion of a time period of occurrence of a consecutive sinusoid with the positive slope. Moreover, the graph a2 has a set of amplitudes A3 during the state S0 and has a set of amplitudes A4 during the state S1.

The graph a3 has a negative linear slope during the state S0 and has a positive linear slope during the state S1. Moreover, the graph a3 has a set of amplitudes A5 during the state S0 and has a set of amplitudes A6 during the state S1.

The graph a4 is clamped to have a zero slope during a portion of the state S0 and has a negative sinusoidal slope during the remaining portion of the state S0. Moreover, the graph a4 has a positive sinusoidal slope during a portion of the state S1 and is clamped to have a slope of zero during the remaining portion of the state S1. The graph a4 is sinusoidal except that the sinusoid is clamped at a top of the sinusoid. The graph a4 has a set of amplitudes A7 during the state S0 and has a set of amplitudes A8 during the state S1.

FIG. 1B shows embodiments of additional graphs a5, a6, and a7 to illustrate soft pulsing. Each graph a5 thru a7 plots RMS values, which are examples of the first variable, versus the time t. The graph a5 has a constant value, e.g., a set of amplitudes A9, during the state S0 and has a slope of zero during the state S0. Moreover, the graph a5 increases its RMS values from a low value at the state S0 to a high value at the state S1. The graph a5 has a set of amplitudes A10 during the state S1. The graph a5 has a negative linear slope during the state S1 and approaches the constant value of the state S0 at an end of the state S1. The graph a5 is referred to herein as a negative saw tooth waveform.

The graph a6 is sinusoidal. The graph a6 has a negative sinusoidal slope during the state S0 and has a positive sinusoidal slope during the state S1. The graph a6 has a set of amplitudes A11 during the state S0 and has a set of amplitudes A12 during the state S1.

The graph a7 is sinusoidal with clamping at a top and bottom of the sinusoid. The graph a7 has a slope of zero during a first portion of the state S0 and has a negative sinusoidal slope during a second portion of the state S0, and has a zero slope during a third remaining portion of the state S0. Moreover, the graph a7 has a slope of zero during a first portion of the state S1 and has a positive sinusoidal slope during a second portion of the state S1, and has a zero slope during a third remaining portion of the state S1. The graph a7 has a set of amplitudes A13 during the state S0 and has a set of amplitudes A14 during the state S1.

Figures 1, 1D:
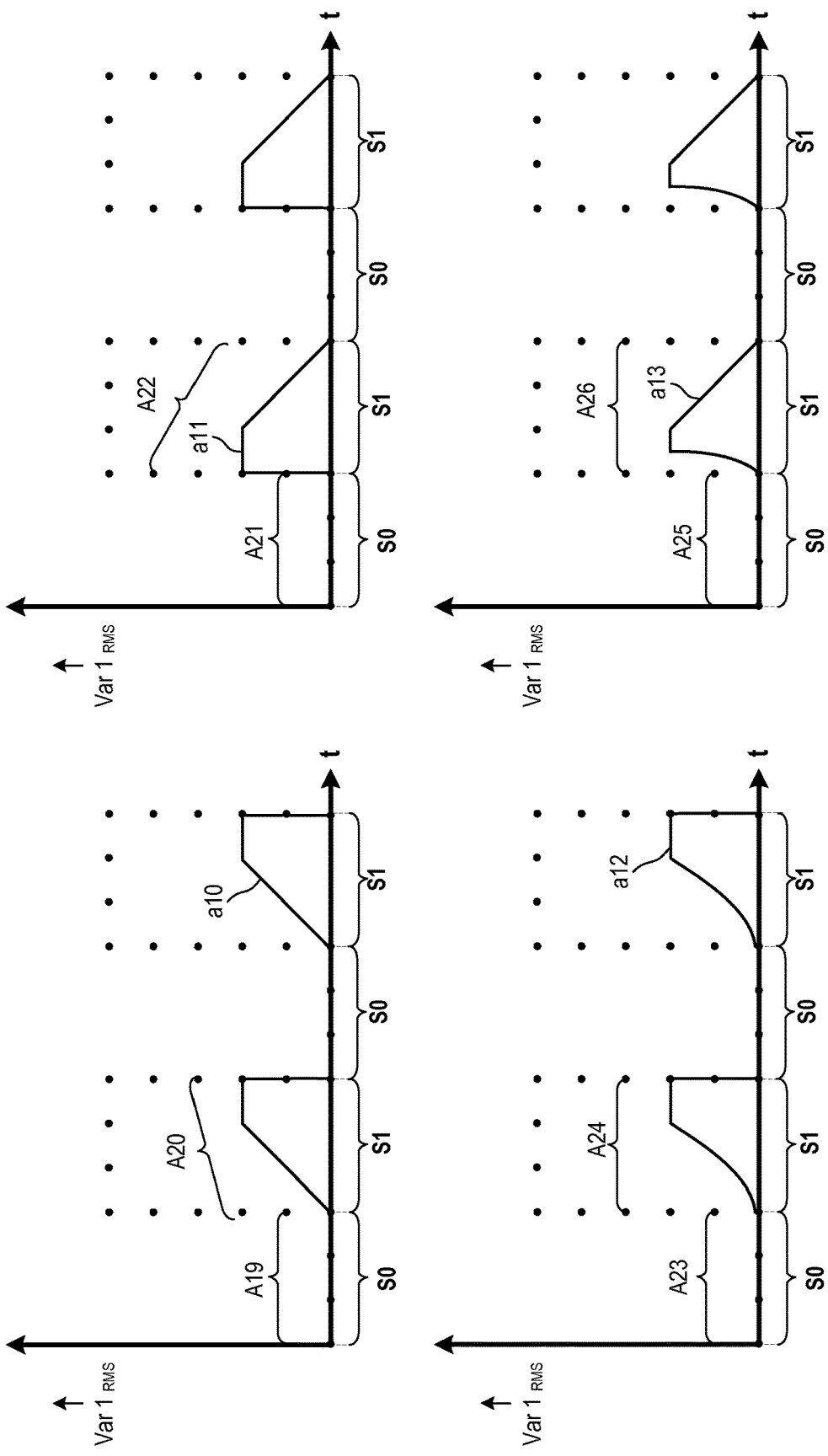

FIG. 1C-1 shows embodiments of graphs a8 and a9 to illustrate soft pulsing. Each graph a8 and a9 plots RMS values, which are examples of the first variable, versus time t. The graph a8 has constant value with a slope of zero during the state S0 and transitions, in a curved manner, to a positive linear slope during the state S1 after the state S0. Moreover, the graph a8 continues with the positive linear slope during the state S1 and falls back to the constant value of the state S0 during a transition from the state S1 to the state S0. The graph a8 has a set of amplitudes A15 during the state S0 and has a set of amplitudes A16 during the state S1. It should be noted that all amplitudes in the set A15 are the same, e.g., a constant amplitude.

The graph a9 has a negative linear slope during a portion of a time period of the state S0 and has a constant value with a slope of zero during the remaining of the time period of the state S0. During the state S1, the graph a9 increases its RMS value from a low value to a high value and has an exponentially increasing curved positive slope. The graph a9 has a set of amplitudes A17 during the state S0 and has a set of amplitudes A18 during the state S1.

Figures 1, 1D, 2:
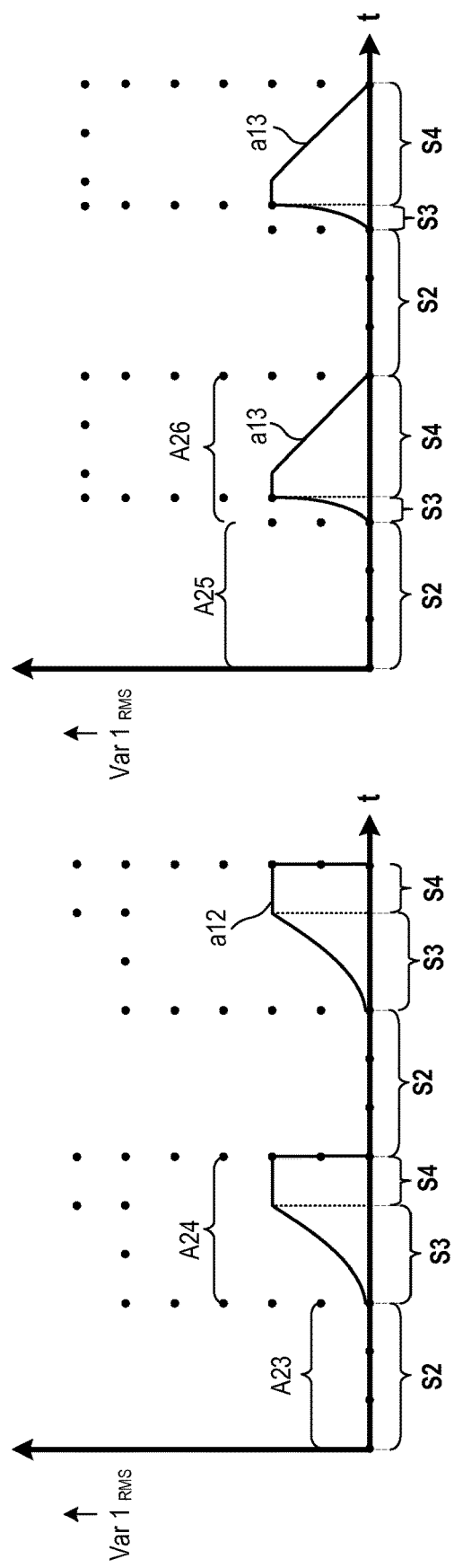

FIG. 1C-2 shows embodiments of graphs a8 and a9 to illustrate soft pulsing in synchronization with three states S2, S3, and S4. During the state S2, the graph a8 has the same amplitude. Moreover, during the state S3, the graph a8 transitions from the amplitude of the state S2 to amplitudes having a positive curved slope. Furthermore, during the state S4, the graph a8 transitions from the positive curved slope to a positive linear slope. For example, during a transition from the state S3 to the state S4, there is no change in a slope of the graph a8. As another example, during a transition from the state S3 to the state S4, there is a minimal change in slope, e.g., slope change within a pre-determined range, etc., of the graph a8. As yet another example, during a transition from the state S3 to the state S4, there is a continuity in slope of the graph a8. During a transition from the state S4 to the state S2, the graph a8 transitions back to the amplitude of the state S2

During the state S2, the graph a9 has the same amplitude. Moreover, during the state S3, the graph a9 has amplitudes having a positive curved slope. During the state S4, the graph a9 has a negative linear slope. During a transition between the states S4 and S2, the graph a9 transitions from amplitudes having the negative linear slope to the amplitude of the state S2.

FIG. 1D-1 shows embodiments of graphs a10, a11, a12, and a13 for illustrating soft pulsing. Each graph a10 thru a13 plots RMS values, which are examples of the first variable, versus the time t. The graph a10 has a constant value with a slope of zero during the state S0. Moreover, the graph a10 has a positive linear slope during a period of time during the state S1 and has a constant value with a slope of zero after the period of time during the state S1. During a transition from the state S1 to the state S0, the graph a10 transitions to the constant value of the state S0. The graph a10 is a positive clamped saw tooth waveform, which is similar to the positive saw tooth waveform of the graph a1 (FIG. 1A) except that the positive saw tooth waveform is clamped at its top. The graph a10 has a set of amplitudes A19 during the state S0 and has a set of amplitudes A20 during the state S1.

The graph a11 has a constant value and has slope of zero during the state S0. The graph a11 transitions from the constant value to a high value during a transition from the state S0 to the state S1 and then maintains a constant value for a period of time during the state S1. After the period of time, the graph a11 has a negative linear slope during the state S1 to achieve the constant value of the state S0. The graph a11 has a set of amplitudes A21 during the state S0 and has a set of amplitudes A22 during the state S1. The graph a11 is a mirror image of the graph a10.

In some embodiments, the period of time during which the graph a11 has the negative linear slope during state S1 is a portion of the state S0 instead of the state S1.

The graph a12 has a constant value during the state S0 and then during the state S1 increases with a curved positive slope to a high value. During the state S1, the graph a12 continues the curved positive slope for a period of time to reach a constant value after the period of time. The graph a12 has the constant value of the state S1 with a slope of zero during the state S1 and decreases to the constant value of the state S0 during a transition from the state S1 to the state S0. The graph a12 has a set of amplitudes A23 during the state S0 and has a set of amplitudes A24 during the state S1. It should be noted that each amplitude in the set of amplitudes A23 is the same.

The graph a13 has a constant value during the state S0 and then during the state S1 increases with a curved positive exponentially increasing slope to a high value. During the state S1, after a transition from the constant value of the state S0, the graph a13 has the high value with a slope of zero for a period of time and has a negative linear slope for the remaining time period during the state S1 to achieve the constant value of the state S0. The graph a13 has a set of amplitudes A25 during the state S0 and has a set of amplitudes A26 during the state S1. It should be noted that each amplitude in the set of amplitudes A25 is the same.

In some embodiments, the period of time during which the graph a13 has the negative linear slope during state S1 is a portion of the state S0 instead of the state S1.

FIG. 1D-2 shows the graphs a12 and a13 to illustrate soft pulsing of the first variable in synchronization with the three states S2, S3, and S4 of a pulsed signal. During the state S2, the graph a12 has the same amplitude. Moreover, during the state S3, the graph a12 has a positive curved slope and during the state S4, the graph a12 has a zero slope. During a transition from the state S4 to the state S2, the graph a12 achieves the amplitude of the state S2 from an amplitude with the zero slope.

In some embodiments, the state S4 has the positive curved slope of the graph a12 instead of the constant zero slope in the graph a12. For example, during a transition from the state S3 to the state S4, the graph a12 continues with the positive curved slope instead of transitioning to the constant zero slope.

During the state S2, the graph a13 has the same amplitude. Moreover, during the state S3, the graph a13 has a positive exponentially increasing curved slope. During the state S4, the graph a13 has a zero slope for a period of time and then transitions to a negative linear slope for the remaining period of time of the state S4.

In some embodiments, during the state S4, the graph a13 has the zero slope for a period of time and then transitions to a negative curved slope for the remaining period of time of the state S4.

Figure 1E:
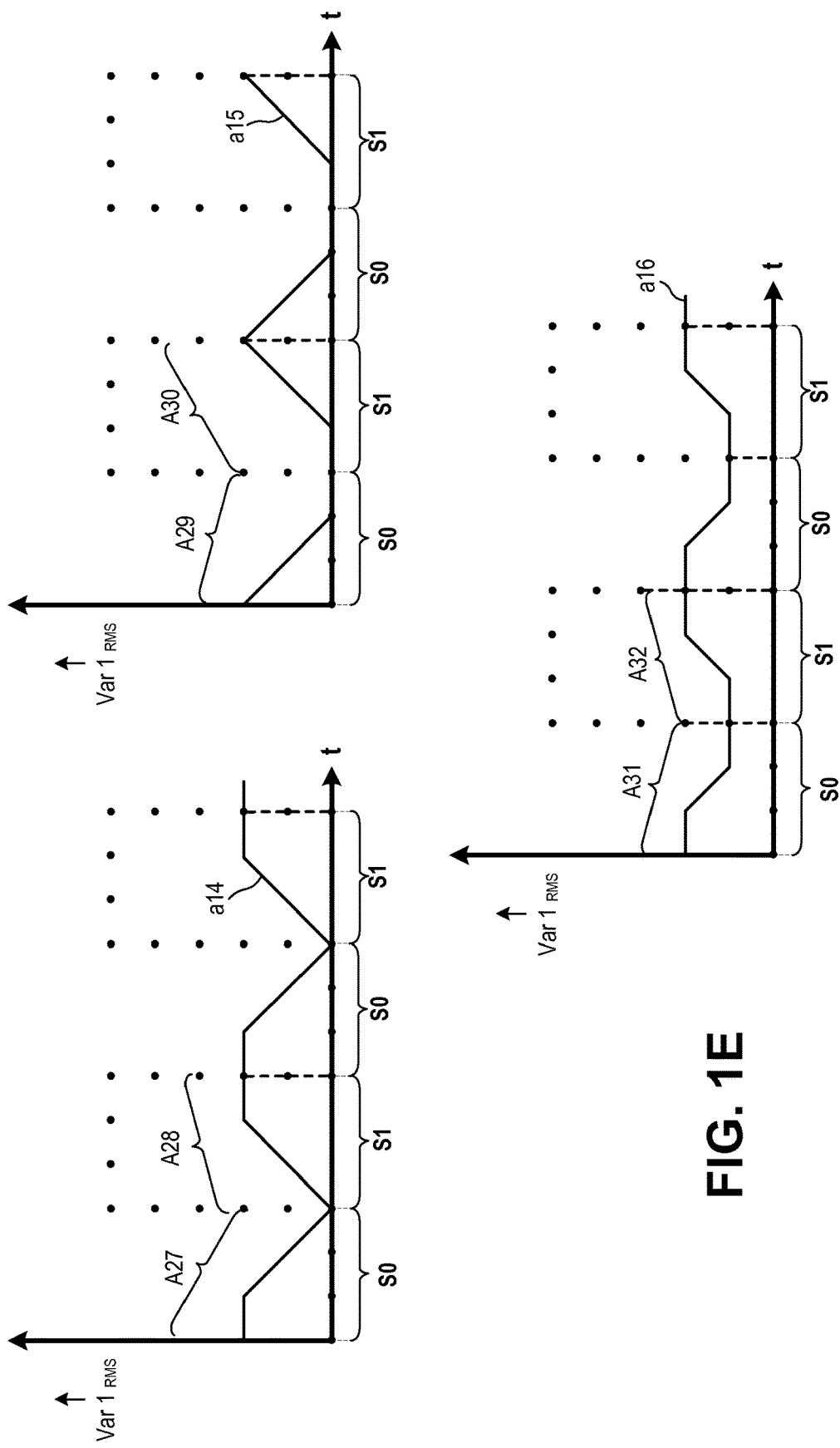
FIG. 1E shows additional graphs to illustrate soft pulsing of the first variable, in accordance with some embodiments of the present disclosure.

FIG. 1E shows embodiments of graphs a14, a15, and a16 to illustrate soft pulsing. Each graph a14 thru a16 plots RMS values, which are examples of the first variable, versus the time t. The graph a14 has a constant value with a slope of zero for a period of time during the state S0 and has a negative linear slope after the period of time during the state S0. The graph a14 has a positive linear slope for a period of time during the state S1 to achieve a constant value and has the constant value with a slope of zero after the period of time during the state S1. The graph a14 has a set of amplitudes A27 during the state S0 and has a set of amplitudes A28 during the state S1. The graph a14 is similar to the graph a3 of FIG. 1A except that the graph a14 is clamped at its top.

The graph a15 has a negative linear slope during a period of time during the state S0 to achieve a constant value and has the constant value with a slope of zero during the remaining period of time during the state S0. The graph a15 has the constant value during a period of time during the state S1 and transitions to having a positive linear slope after the period of time. The graph a15 has a set of amplitudes A29 during the state S0 and has a set of amplitudes A30 during the state S1. The graph a15 is similar to the graph a3 of FIG. 1A except that the graph a15 is clamped at its bottom.

The graph a16 has a constant value within a zero slope during a first period of time during the state S0 and has a negative linear slope during a second period of time during the state S0 and has a constant value with a slope of zero during the remaining period of time during the state S0. Moreover, during a first period of time of the state S1, the graph a16 has the constant value that the graph a16 has during the remaining period of time of the state S0. The graph a16 has a positive linear slope during a second period of time during the state S1 and has a constant value with a slope of zero during the remaining period of time during the state S1. The graph a16 has a set of amplitudes A31 during the state S0 and has a set of amplitudes A32 during the state S1. The graph a16 is similar to the graph a3 of FIG. 1A except that the graph a16 is clamped at its top and bottom.

In some embodiments, the graph a16 has a slope of zero during the remaining period of time of the state S0 followed by a positive linear slope of the state S1 instead of the having the constant value during the first period of time of the state S1.

Figure 1F:
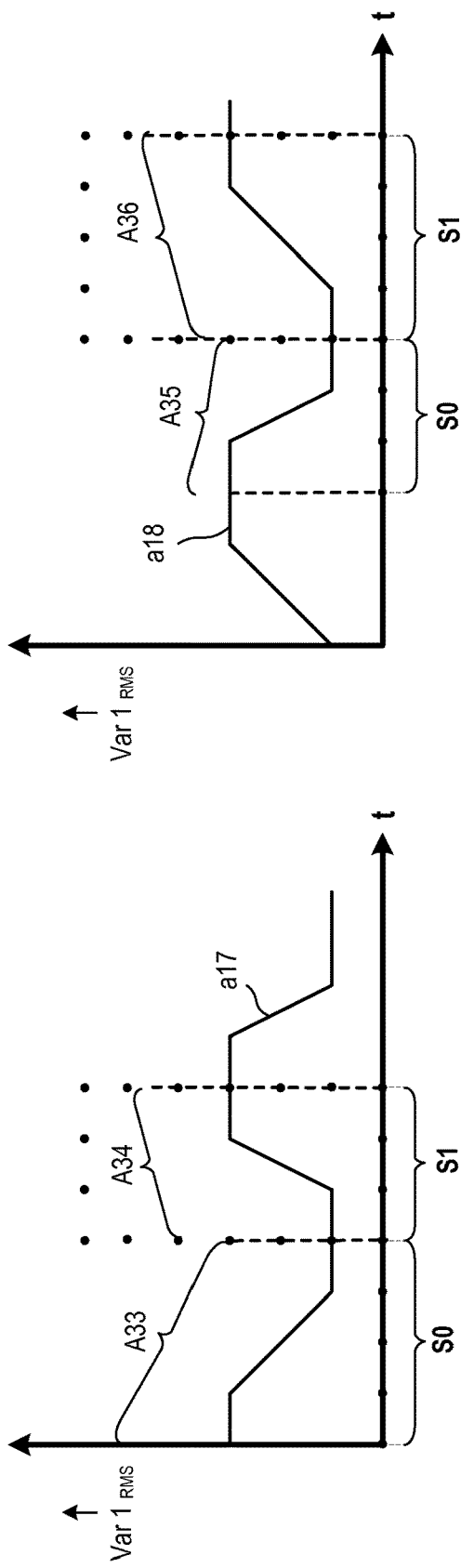
FIG. 1F shows graphs to illustrate soft pulsing of the first variable, in accordance with various embodiments of the present disclosure.

FIG. 1F shows embodiments of graphs a17 and a18 to illustrate soft pulsing. Each graph a17 thru a18 plots RMS values, which are examples of the first variable, versus the time t. The graph a17 is similar to the graph a16 of FIG. 1E except that a time period of the state S0 is greater than a time period of the state S1. The graph a17 has a set of amplitudes A33 during the state S0 and has a set of amplitudes A34 during the state S1. Moreover, the graph a18 is similar to the graph a16 except that a time period of the state S1 is greater than a time period of the state S0. The graph a18 has a set of amplitudes A35 during the state S0 and has a set of amplitudes A36 during the state S1.

In some embodiments, any of the graphs described herein are shifted to the right or left by half a state.

In various embodiments, any of the linear slopes described herein are curved slopes, e.g., exponential slopes, sinusoidal slopes, etc.

In several embodiments, any of the curved slopes described herein are linear slopes.

Figure 2A:
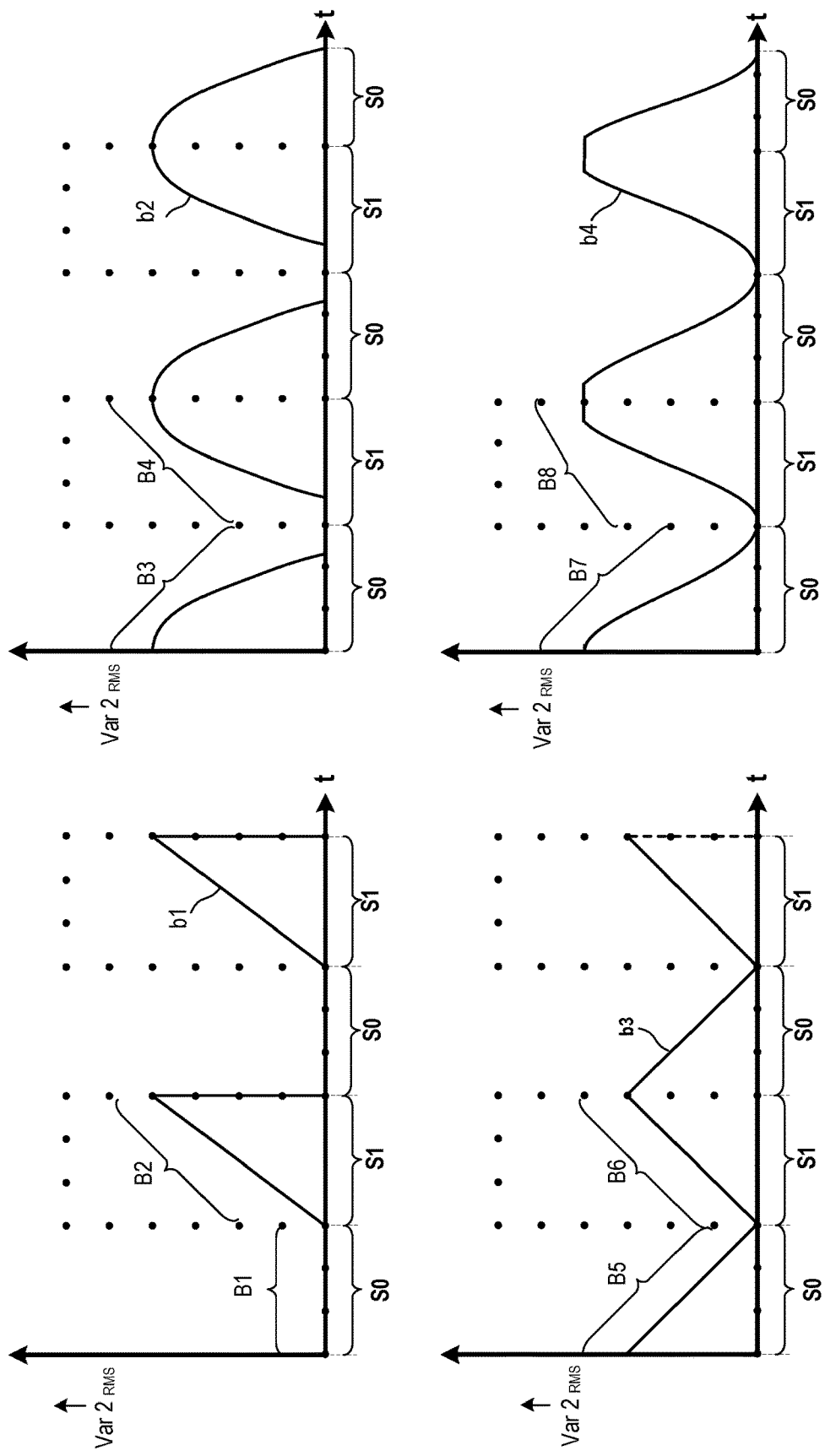
FIG. 2A shows graphs to illustrate soft pulsing of a second variable, in accordance with various embodiments of the present disclosure.

FIG. 2A shows embodiments of graphs b1, b2, b3, and b4 to illustrate soft pulsing of a second variable, e.g., variable 2, etc., or of a second parameter, e.g., a parameter 2, etc. Examples of the second variable are the same as that of the first variable except that the second variable is a different type of variable than the first variable. For example, when the first variable is power, the second variable is frequency. As another example, when the first variable is frequency, the second variable is power. As yet another example, when the first variable is voltage, the second variable is current. Examples of the second parameter are the same as that of the first parameter except that the second parameter is a different type than the first parameter. For example, when the first parameter is gap, the second parameter is pressure. As another example, when the first parameter is pressure, the second parameter is a flow rate.

The graph b1 is similar to the graph a1 (FIG. 1A) except that the graph b1 is for the second variable. During the state S0, the graph b1 has a set of amplitudes B1 and during the state S1, the graph b1 has a set of amplitudes B2. Moreover, the graph b2 is similar to the graph a2 (FIG. 1A) except that the graph b2 is for the second variable. During the state S0, the graph b2 has a set of amplitudes B3 and during the state S1, the graph b2 has a set of amplitudes B4. Also, the graph b3 is similar to the graph a3 (FIG. 1A) except that the graph b3 is for the second variable. During the state S0, the graph b3 has a set of amplitudes B5 and during the state S1, the graph b3 has a set of amplitudes B6. Furthermore, the graph b4 is similar to the graph a4 (FIG. 1A) except that the graph b4 is for the second variable. During the state S0, the graph b4 has a set of amplitudes B7 and during the state S1, the graph b4 has a set of amplitudes B8.

Figure 2B:
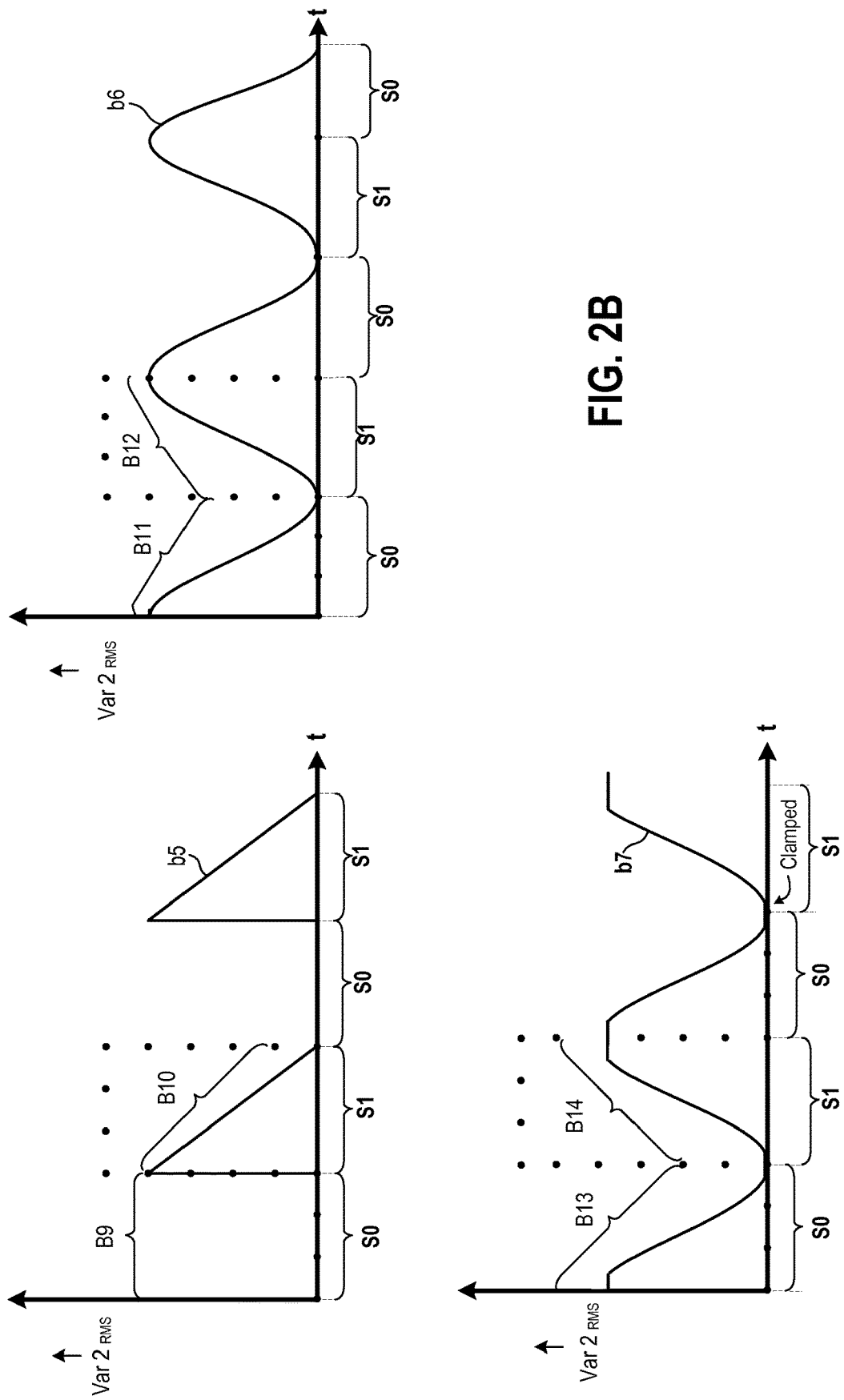
FIG. 2B shows additional graphs to illustrate soft pulsing of the second variable, in accordance with several embodiments of the present disclosure.

FIG. 2B shows embodiments of graphs b5, b6, and b7 to illustrate soft pulsing of the second variable. The graph b5 is similar to the graph a5 (FIG. 1B) except that the graph b5 is for the second variable. During the state S0, the graph b5 has a set of amplitudes B9 and during the state S1, the graph b5 has a set of amplitudes B10. Moreover, the graph b6 is similar to the graph a6 (FIG. 1B) except that the graph b6 is for the second variable. During the state S0, the graph b6 has a set of amplitudes B11 and during the state S1, the graph b6 has a set of amplitudes B12. Also, the graph b7 is similar to the graph a7 (FIG. 1B) except that the graph b7 is for the second variable. During the state S0, the graph b7 has a set of amplitudes B13 and during the state S1, the graph b7 has a set of amplitudes B14.

Figure 2C:
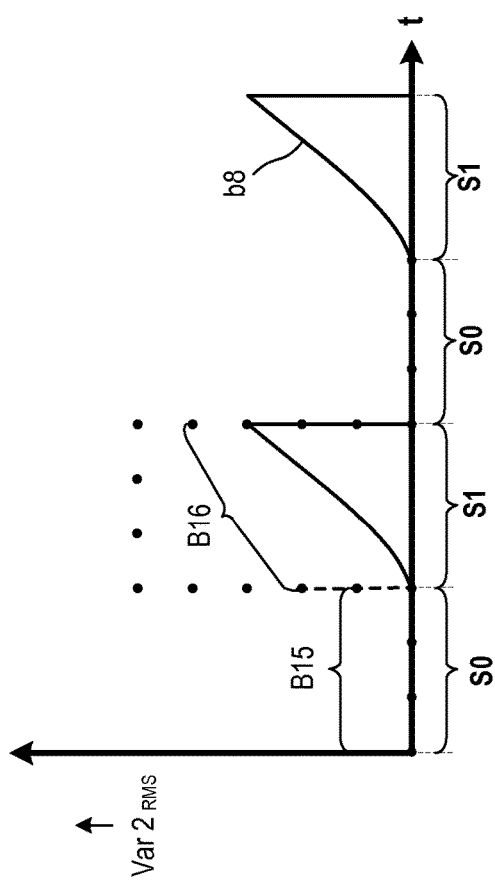
Figure 1:
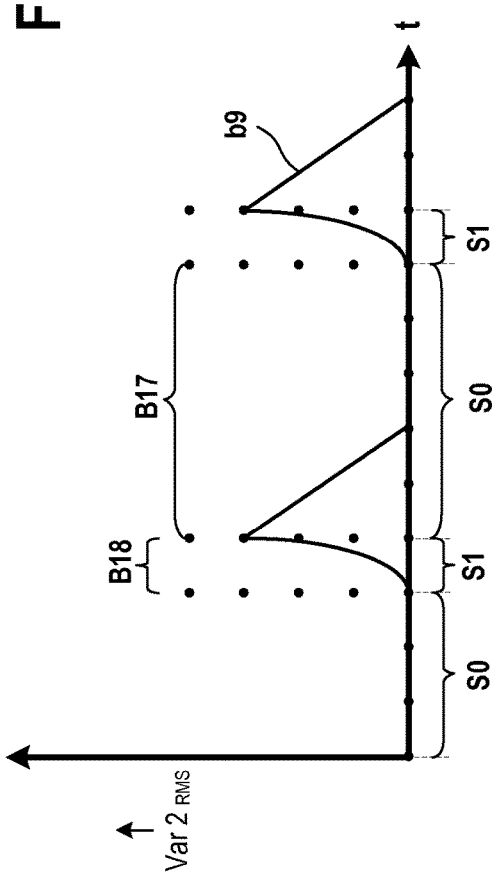
Figure 2C:
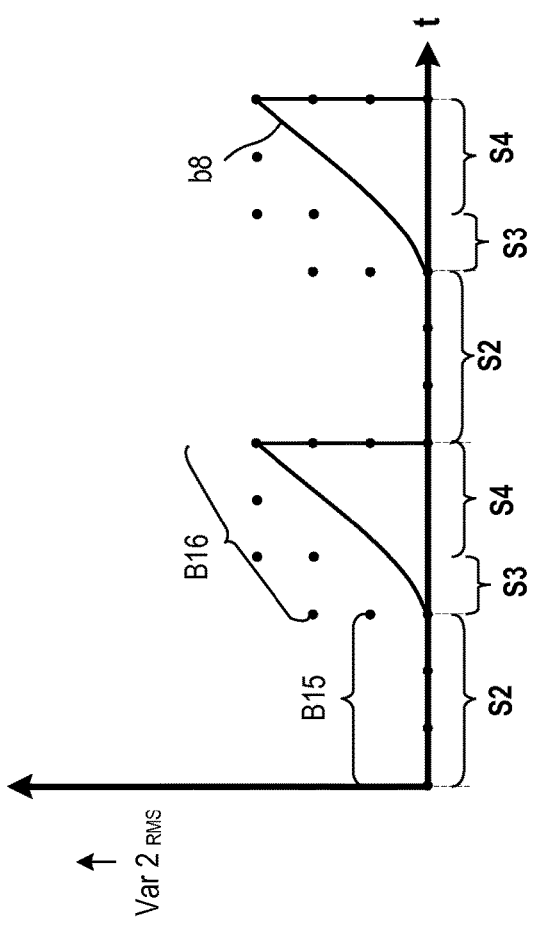
Figure 2:
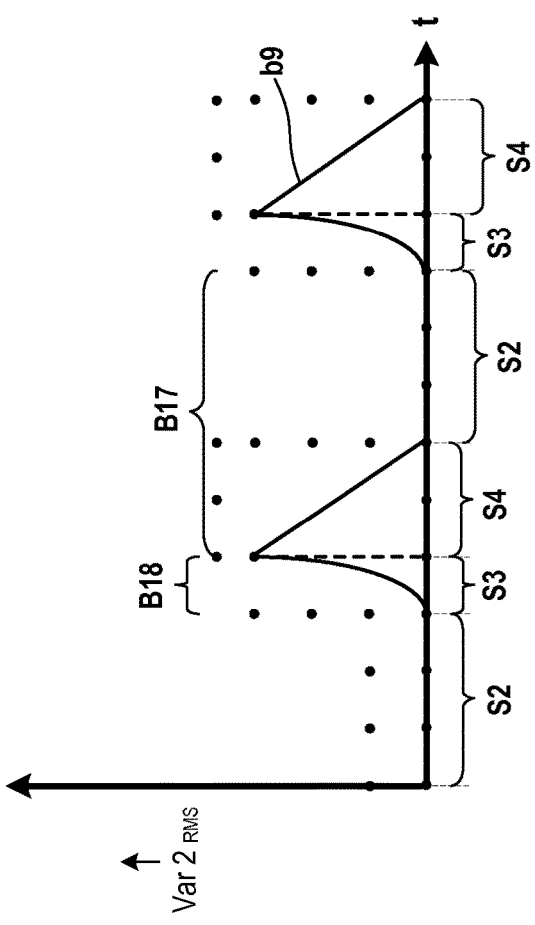

FIG. 2C-1 shows embodiments of graphs b8 and b9 to illustrate soft pulsing of the second variable. The graph b8 is similar to the graph a8 (FIG. 1C-1) except that the graph b8 is for the second variable. During the state S0, the graph b8 has a set of amplitudes B15 and during the state S1, the graph b8 has a set of amplitudes B16. Each amplitude in the set B15 is the same. Moreover, the graph b9 is similar to the graph a9 (FIG. 1C-1) except that the graph b9 is for the second variable. During the state S0, the graph b9 has a set of amplitudes B17 and during the state S1, the graph b9 has a set of amplitudes B18.

FIG. 2C-2 shows embodiments of graphs b8 and b9 to illustrate soft pulsing of the second variable in synchronization with the three states S2, S3, and S4. It should be noted the graph b8 is similar to the graph a8 of FIG. 1C-2 except that the graph b8 illustrates soft pulsing of the second variable. Moreover, the graph b9 is similar to the graph a9 of FIG. 1C-2 except that the graph b9 illustrates soft pulsing of the second variable.

Figures 1, 2D:
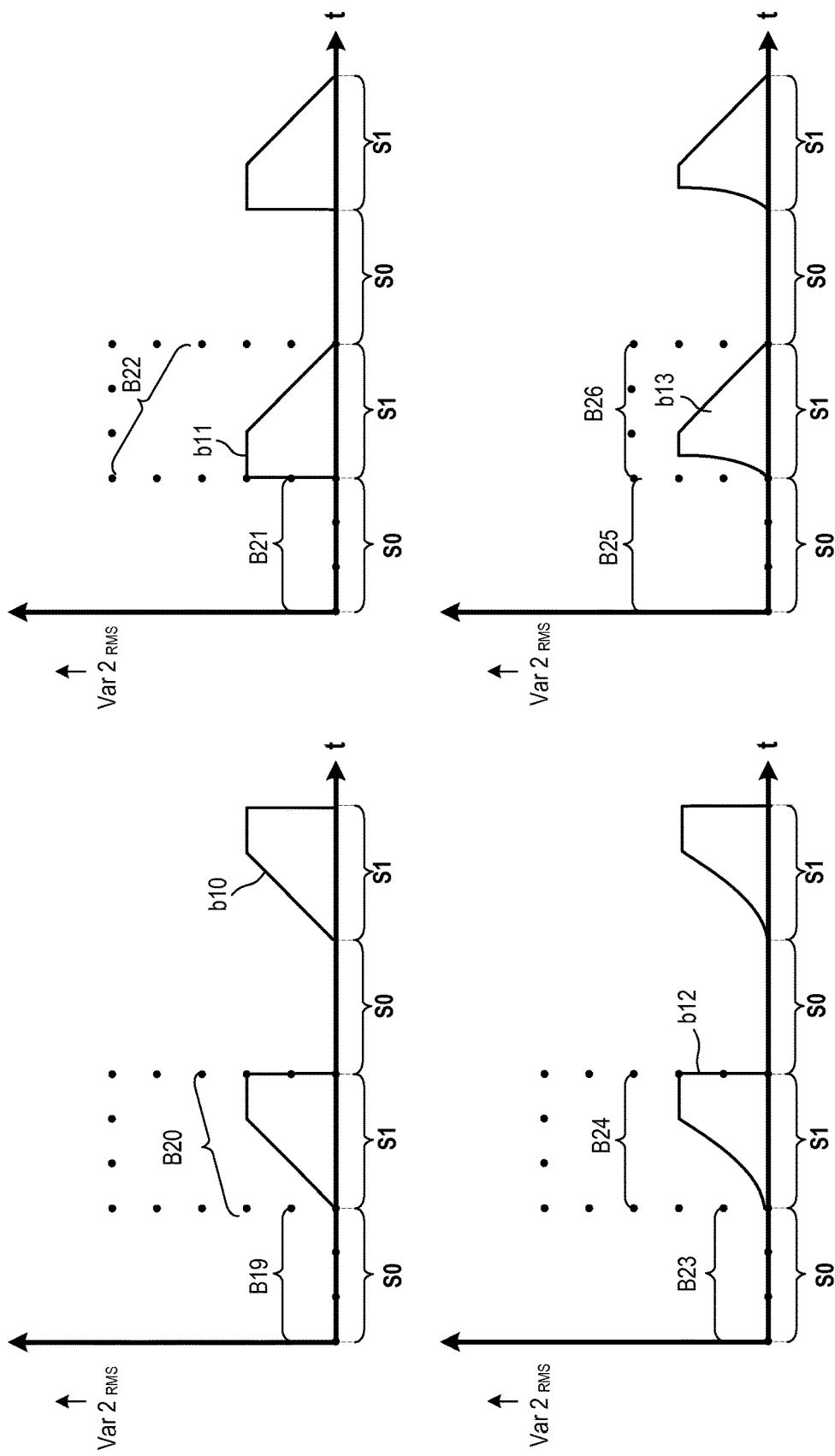
Figures 2, 2D:
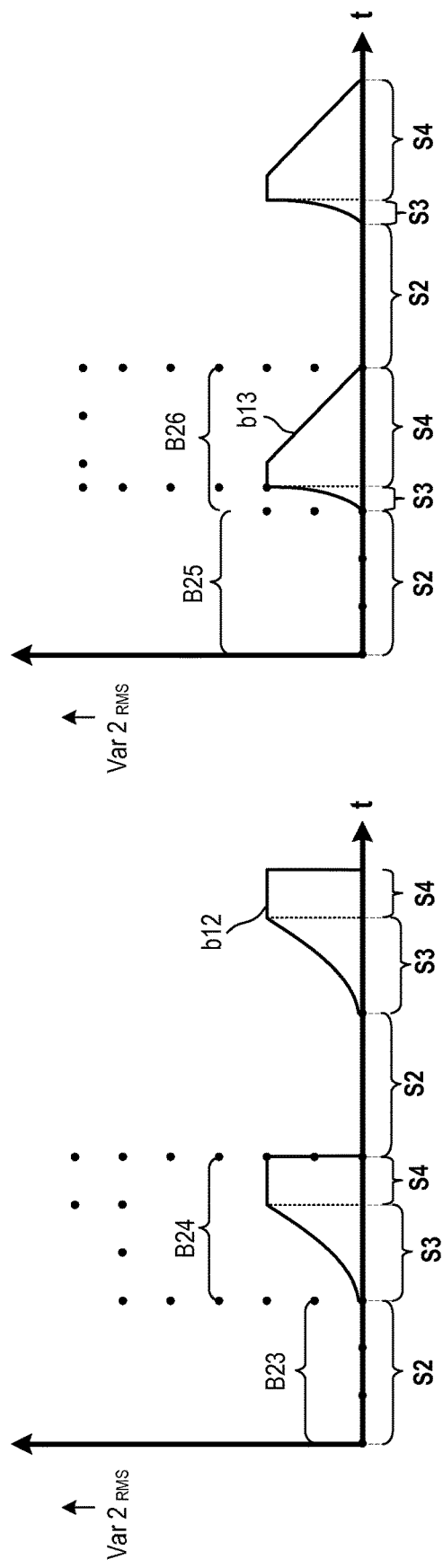

FIG. 2D-1 shows embodiments of graphs b10, b11, b12, and b13 to illustrate soft pulsing of the second variable. The graph b10 is similar to the graph a10 (FIG. 1D-1) except that the graph b10 is for the second variable. During the state S0, the graph b10 has a set of amplitudes B19 and during the state S1, the graph b10 has a set of amplitudes B20. Moreover, the graph b11 is similar to the graph a11 (FIG. 1D-1) except that the graph b11 is for the second variable. During the state S0, the graph b11 has a set of amplitudes B21 and during the state S1, the graph b11 has a set of amplitudes B22. Also, the graph b12 is similar to the graph a12 (FIG. 1D-1) except that the graph b12 is for the second variable. During the state S0, the graph b12 has a set of amplitudes B23 and during the state S1, the graph b12 has a set of amplitudes B24. Furthermore, the graph b13 is similar to the graph a13 (FIG. 1D-1) except that the graph b13 is for the second variable. During the state S0, the graph b13 has a set of amplitudes B25 and during the state S1, the graph b13 has a set of amplitudes B26.

FIG. 2D-2 shows embodiments of graphs b12 and b13 to illustrate soft pulsing of the second variable in synchronization with the three states S2, S3, and S4. The graph b12 is similar to the graph a12 of FIG. 1D-2 except that the graph b12 plots the second variable with respect to time. Moreover, the graph b13 is similar to the graph a13 of FIG. 1D-2 except that the graph b13 plots the second variable with respect to time.

Figure 2E:
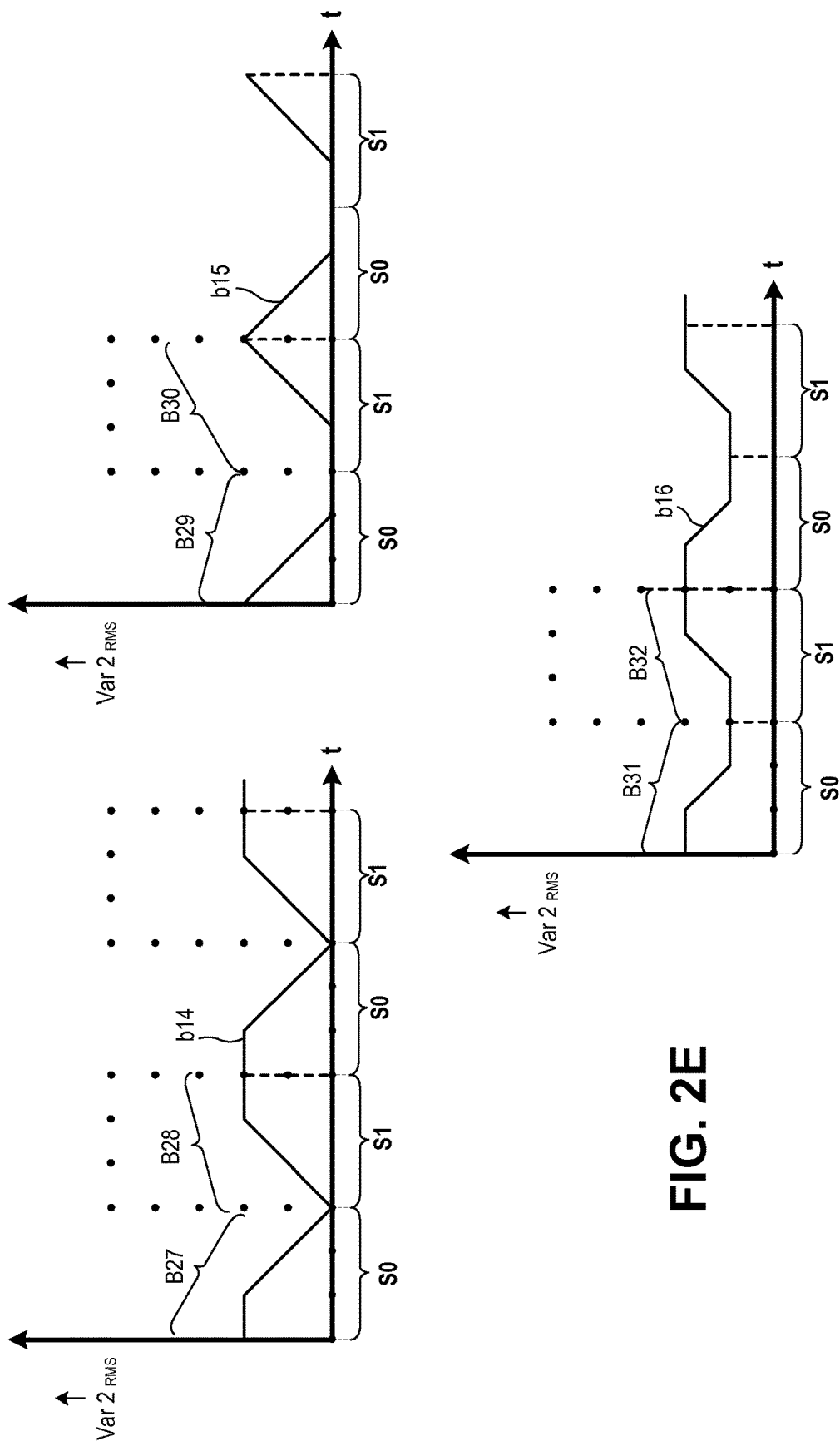
FIG. 2E shows additional graphs to illustrate soft pulsing of the second variable, in accordance with some embodiments of the present disclosure.

FIG. 2E shows embodiments of graphs b14, b15, and b16 to illustrate soft pulsing of the second variable. The graph b14 is similar to the graph a14 (FIG. 1E) except that the graph b14 is for the second variable. During the state S0, the graph b14 has a set of amplitudes B27 and during the state S1, the graph b14 has a set of amplitudes B28. Moreover, the graph b15 is similar to the graph a15 (FIG. 1E) except that the graph b15 is for the second variable. During the state S0, the graph b15 has a set of amplitudes B29 and during the state S1, the graph b15 has a set of amplitudes B30. Also, the graph b16 is similar to the graph a16 (FIG. 1E) except that the graph b16 is for the second variable. During the state S0, the graph b16 has a set of amplitudes B31 and during the state S1, the graph b16 has a set of amplitudes B32.

FIG. 2F shows embodiments of graphs b17 and b18 to illustrate soft pulsing of the second variable. The graph b17 is similar to the graph a17 (FIG. 1F) except that the graph b17 is for the second variable. During the state S0, the graph b17 has a set of amplitudes B33 and during the state S1, the graph b17 has a set of amplitudes B34. Moreover, the graph b18 is similar to the graph a18 (FIG. 1F) except that the graph b18 is for the second variable. During the state S0, the graph b18 has a set of amplitudes B35 and during the state S1, the graph b18 has a set of amplitudes B36.

In various embodiments, two graphs are similar when the graphs have the same shape, e.g., form, etc., and have different or same statistical measure values. For example, two graphs that have sinusoidal shapes are similar in shape except that peak-to-peak amplitude of a first one of the graphs is greater than a peak-to-peak amplitude of a second one of the graphs.

In some embodiments, a cycle that includes the state S1 and the state S0 has a time period of a number of milliseconds, e.g., two milliseconds, three milliseconds, etc. In various embodiments, the states S1 and S0 have the same duty cycle. The state S1 is consecutive to the state S0. In several embodiments, the state S1 has a different duty cycle, e.g., greater, lesser, etc., than a duty cycle of the state S0. The state S1 is consecutive to the state S0.

In several embodiments, a positive or a negative slope occurs during a cycle of a statistical measure signal, e.g. an RMS waveform, a peak-to-peak amplitude waveform, etc., for at least a percentage, e.g., five percent, six percent, ten percent, etc., of a duty cycle.

It should be noted that in each FIGS. 1A thru 1F and 2A thru 2F, a graph as used herein is a statistical measure of an RF signal shown in the Figure. For example, the graph a1 of FIG. 1A is a signal that has RMS values of an RF signal. The signal having the RMS values is shown in FIG. 1A.

It should be noted that although the graphs of FIGS. 1A thru 1F and 2A thru 2F plot RMS values, in some embodiments, the graphs plots any other statistical measure of sinusoidal RF signals that are generated by RF generators.

FIG. 3 is a diagram of embodiments of graphs 105 and 107 to illustrate that the graphs a1 thru a18 and the graphs b1 thru b18 plot RMS values of sinusoidal signals that are generated by the RF generator. The graph 105 includes a plot, e.g., a waveform, etc., of a sinusoidal RF signal 102 that is generated by the RF generator versus the time t. The sinusoidal RF signal 102 includes a first portion 101 that is generated during the state S0 and a second portion 103 that is generated during the state S1. A plot 106 of the graph 105 is the statistical measure, e.g., envelope, peak-to-peak amplitude, etc., of the sinusoidal RF signal 102 versus the time t.

Similarly, the graph 107 includes a plot of a sinusoidal RF signal 108 that is generated by the RF generator versus the time t. The graph 107 includes a statistical measure 110 of the sinusoidal RF signal 108 versus the time t.

Figure 4:
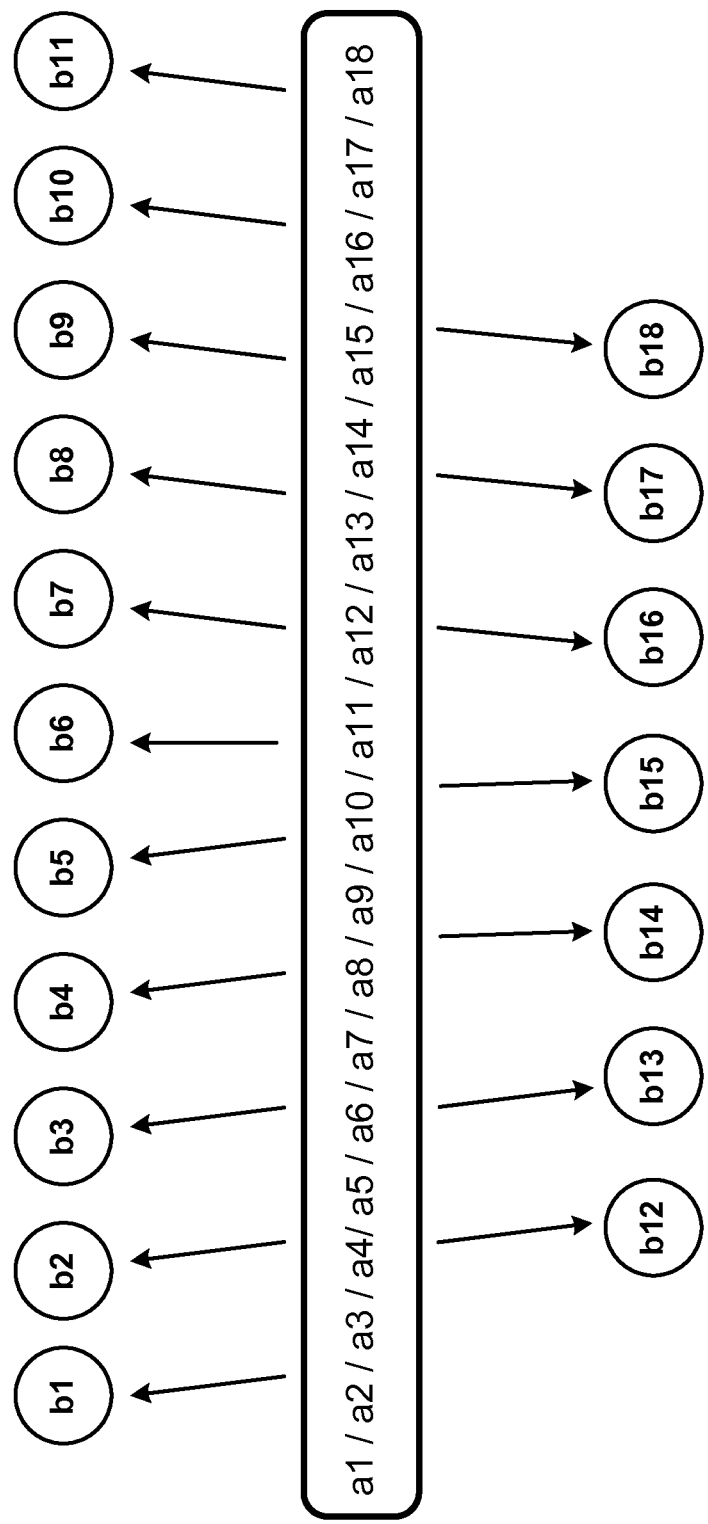
FIG. 4 is a diagram used to illustrate that an RF signal is generated by the RF generator to achieve the first variable as shown in any of the graphs of FIGS. 1A thru 1F and to simultaneously achieve the second variable as shown in any of the graphs of FIGS. 2A thru 2F, in accordance with several embodiments of the present disclosure.

FIG. 4 is a diagram used to illustrate that an RF signal is generated by an RF generator to achieve the first variable as shown in any of the graphs a1 thru a18 and an RF signal is generated by another RF generator to simultaneously achieve the second variable as shown in any of the graphs b1 thru b18. For example, an RF generator is controlled by a digital signal processor (DSP) of the RF generator to generate an RF signal to achieve the first variable of the graph a1 and at the same time another RF generator is controlled by a DSP of the other RF generator to generate an RF signal to achieve the second variable of the graph b2. As another example, an RF generator is controlled by the DSP of the RF generator to generate an RF signal to achieve the first variable of the graph a16 and at the same time another RF generator is controlled by a DSP of the other RF generator to generate an RF signal to achieve the second variable of the graph b10. As yet another example, an RF generator is controlled by the DSP of the RF generator to generate an RF signal to further achieve the first variable of any of the graphs a1 thru a18 and at the same time another RF generator is controlled by a DSP of the other RF generator to generate an RF signal to achieve the second variable of any of the graphs b1 thru b18. As another example, a DSP of an RF generator provides the first variable as illustrated in any of the graphs a1 thru a18 to generate an RF signal having the first variable and a DSP of another RF generator provides the second variable as illustrated in any of the graphs b1 thru b18 to generate an RF signal having the second variable. As yet another example, a DSP of an RF generator provides the first variable having a function as illustrated in the graph a3 to generate an RF signal having the first variable as illustrated in the graph a3 and a DSP of an RF generator further provides the second variable having a function as illustrated in the graph b5 to generate an RF signal having the second variable as illustrated in the graph b5.

As used herein, a processor includes an application specific integrated circuit (ASIC), or a programmable logic device (PLD), or a central processing unit (CPU), or a controller, a microprocessor, or a combination thereof.

Figure 5:
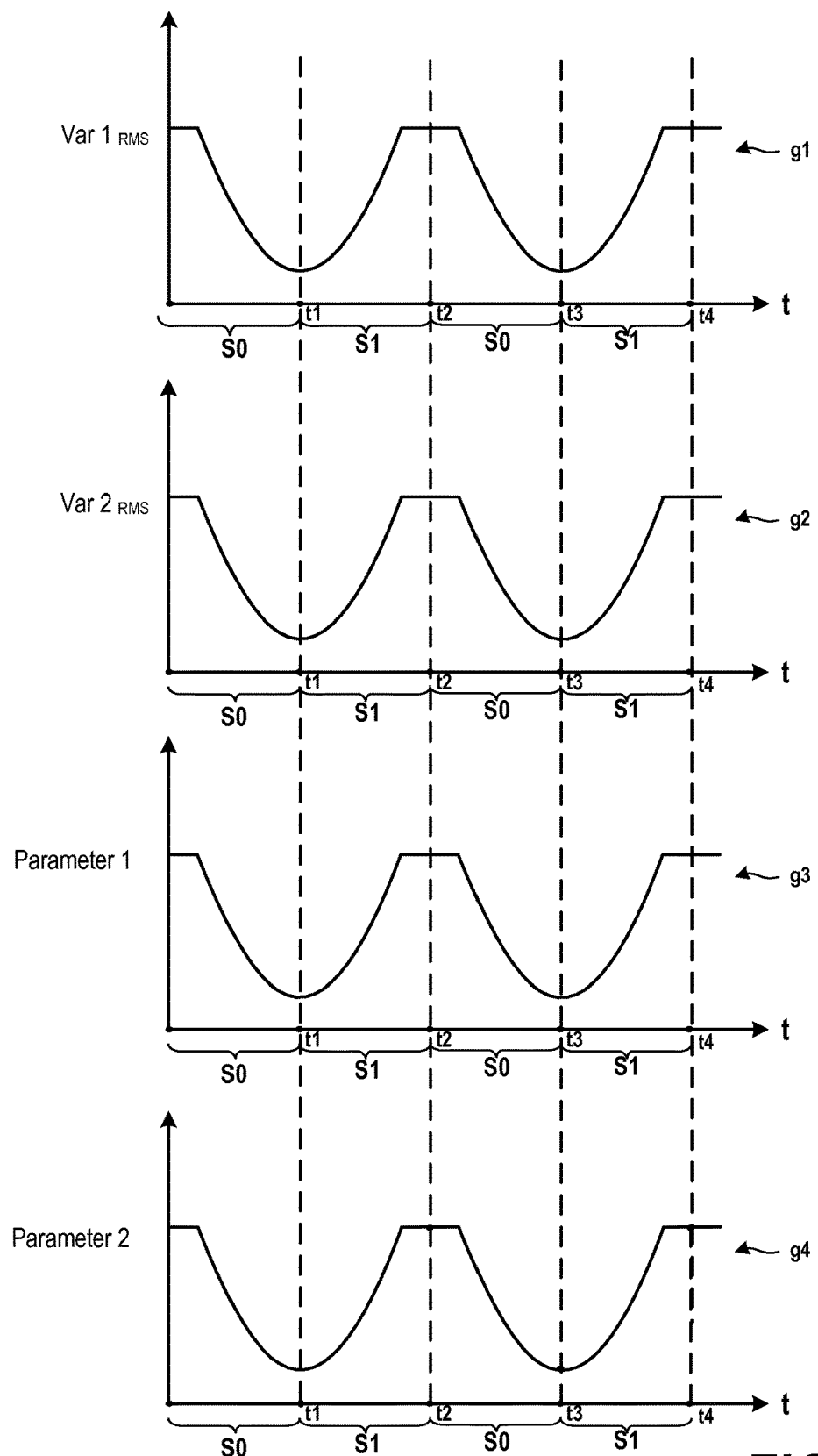
FIG. 5 shows multiple graphs to illustrate a similarity between the graphs, in accordance with several embodiments of the present disclosure.

FIG. 5 shows embodiments of multiple graphs g1, g2, g3, and g4 to illustrate a similarity between the graphs g1 thru g4. The graph g1 represents RMS values, which are examples of the first variable, the graph g2 represents RMS values, which are examples of the second variable, the graph g3 represents an example of the first parameter, the graph g4 represents an example of the second parameter.

Each graph g1 thru g4 is plotted on a time axis with the time t. For example, the states S1 and S0 of the graph g1 are represented as a function of times t1, t2, t3, and t4. Similarly, the states S1 and S0 of each of the graphs g2 thru g4 are represented as a function of the times t1 thru t4.

In various embodiments, each of the first variable, the second variable, the first parameter, and the second parameter has the same type of slope during a state. For example, each of the first variable, the second variable, the first parameter, and the second parameter, as shown in the graphs g1 thru g4, have a constant value in the state S0, have a negative slope during the state S0, have a positive slope during the state S1, or have a constant value during the state S1. Examples of a type of slope include a zero slope, a positive slope, and a negative slope.

In some embodiments, any of the first variable, the second variable, the first parameter, and the second parameter has a different type of slope during a state than a slope of any of the remaining of the first variable, the second variable, the first parameter, and the second parameter during the state. For example, the first variable has a positive slope during the state S1 and the second variable has a negative slope during the state S1. Further, in this example, the first variable has a negative slope during the state S0 and the second variable has a positive slope during the state S0. As another example, the first variable has a constant value during the state S1 and the second parameter has a negative slope during the state S1. Further, in this example, the first variable has a positive slope during the state S0 and the second parameter has a constant slope during the state S0.

In some embodiments, any number of variables, e.g., one, two, three, four, six, etc., and any number of parameters are used to control the plasma chamber.

In various embodiments, the graph g1 is a statistical measure of an RF signal that is generated by the x MHz RF generator and the graph g2 is a statistical measure of an RF signal that is generated by the y or z MHz RF generator.

It should be noted that although a waveform of a shape is illustrated in the graphs g1 thru g4, in several embodiments, waveforms of other shapes, e.g., the shapes shown in the graphs a1 thru a3 and a5 thru a18, etc., are applicable.

It should be noted that in each of FIGS. 1A thru 1F, 2A thru 2F, 3, and 5, a digital pulsed signal, e.g., a transistor-transistor logic (TTL) signal, a digital clock signal, a signal having an active portion and an inactive portion, a signal having a high level and a low level, a signal having three levels, etc., is shown by a dotted line.

Figure 6A:
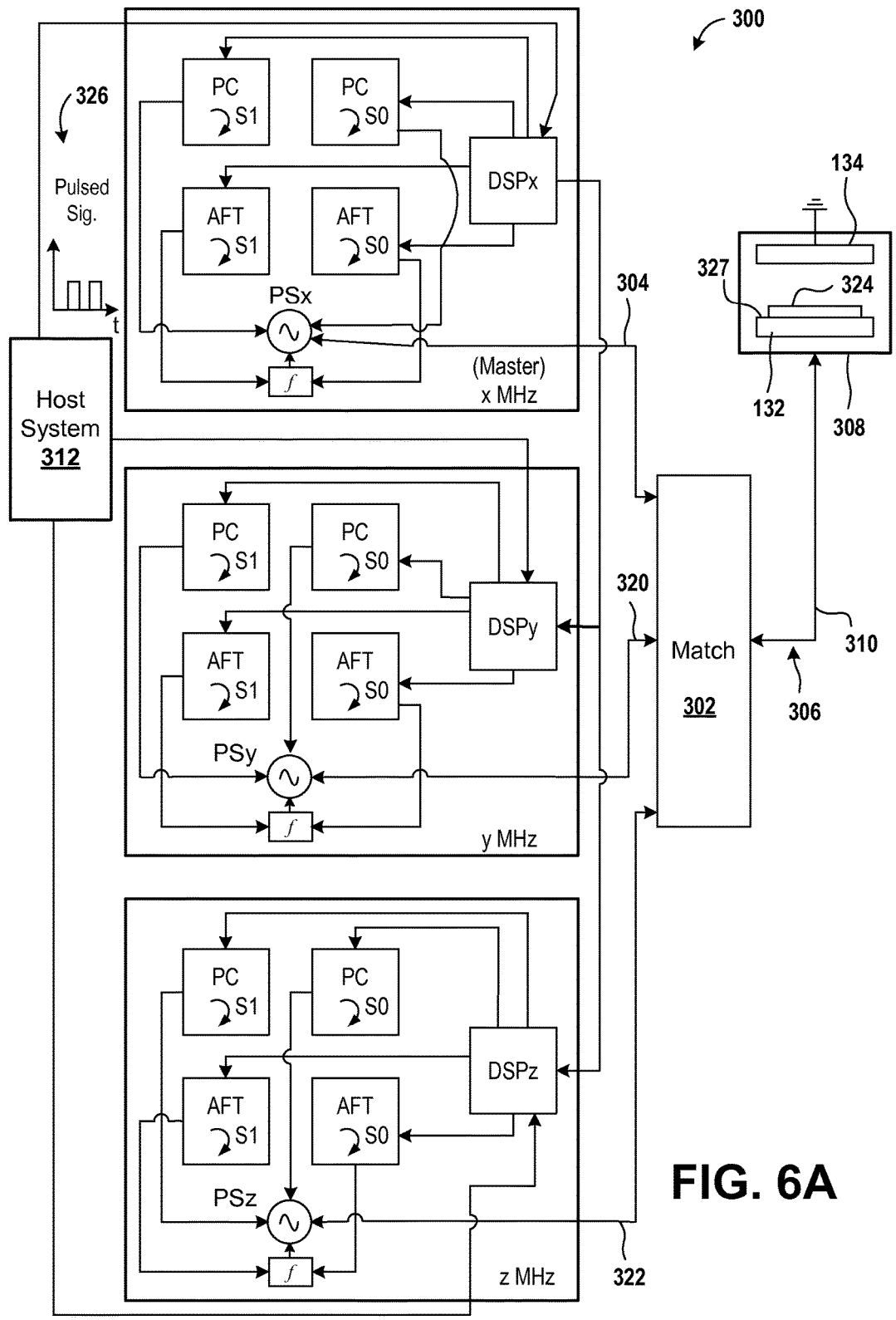
FIG. 6A is a diagram of a plasma system for performing soft pulsing using a digital pulsed signal from a host system, in accordance with some embodiments of the present disclosure.

FIG. 6A is a diagram of an embodiment of a plasma system 300 for performing soft pulsing using a digital pulsed signal from a host system 312. Examples of the host system 312 include a computer, e.g., a desktop, a laptop, a tablet, etc. As an illustration, the host system 312 includes a processor and a memory device. Examples of a memory device include a read-only memory (ROM), a random access memory (RAM), or a combination thereof. Other examples of a memory device include a flash memory, a redundant array of storage disks (RAID), a hard disk, etc.

The host system 312 is coupled to an x megahertz (MHz) RF generator, a y MHz RF generator, and a z MHz RF generator. Examples of x MHz include 2 MHz, 27 MHz, and 60 MHz. Examples of y MHz include 2 MHz, 27 MHz, and 60 MHz. Examples of z MHz include 2 MHz, 27 MHz, and 60 MHz.

The x MHz is different than y MHz and z MHz. For example, when x MHz is 2 MHz, y MHz is 27 MHz and z MHz is 60 MHz.

Each RF generator includes a DSP, a set of power controllers, a set of auto frequency tuners (AFTs), and an RF power supply. For example, the x MHz RF generator includes a digital signal processor DSPx, a power controller PCS1x, a power controller PCS0x, an auto frequency tuner AFTS1x, an auto frequency tuner AFTS0x, and an RF power supply PSx. As another example, the y MHz RF generator includes a digital signal processor DSPy, a power controller PCS1y, a power controller PCS0y, an auto frequency tuner AFTS1y, an auto frequency tuner AFTS0y, and an RF power supply PSy. As yet another example, the z MHz RF generator includes a digital signal processor DSPz, a power controller PCS1z, a power controller PCS0z, an auto frequency tuner AFTS1z, an auto frequency tuner AFTS0z, and an RF power supply PSz.

The x, y, and z MHz RF generators are connected via RF cables to an impedance matching circuit (IMC) 302. For example, the x MHz RF generator is connected via an RF cable 304 to the IMC 302, the y MHz RF generator is coupled via an RF cable 320 to the IMC 302, and the z MHz RF generator is coupled via an RF cable 322 to the IMC 302.

In various embodiments, an RF cable includes an inner conductor that is surrounded by an insulation material, which is surrounded by an outer conductor, which is further surrounded by a jacket. In several embodiments, the outer conductor is made of braided wire and the jacket is made of an insulator material.

The IMC 302 is coupled via an RF transmission line 310 to a plasma chamber 308. In various embodiments, the RF transmission line 310 includes a cylinder, e.g., a tunnel, etc., that is connected to the IMC 302. Within a hollow of the cylinder lies an insulator and an RF rod. The RF transmission line 310 further includes an RF spoon, e.g., an RF strap, etc., that is coupled at one end to the RF rod of the cylinder. The RF spoon is coupled at another end to an RF rod of a vertically placed cylinder and the RF rod is coupled to a chuck 132 of the plasma chamber 308.

The plasma chamber 308 includes the chuck 132 and an upper electrode 134. Examples of the chuck 132 include an electrostatic chuck (ESC) and a magnetic chuck. The plasma chamber 308 further includes one or more other parts (not shown), e.g., an upper dielectric ring surrounding the upper electrode 134, an upper electrode extension surrounding the upper dielectric ring, a lower dielectric ring surrounding a lower electrode of chuck 132, a lower electrode extension surrounding the lower dielectric ring, an upper plasma exclusion zone (PEZ) ring, a lower PEZ ring, etc. The upper electrode 134 is located opposite to and facing the chuck 132. A work piece 324, e.g., a semiconductor substrate, a semiconductor substrate with integrated circuits, a wafer, etc., is supported on an upper surface 327 of the chuck 132. A lower surface of the upper electrode 134 faces the upper surface 327 of the chuck 132.

Various processes, e.g., chemical vapor deposition, cleaning, deposition, sputtering, etching, ion implantation, resist stripping, etc., are performed on the work piece 324 during production. Integrated circuits, e.g., ASICs, PLDs, etc. are developed on the work piece 324 and the integrated circuits are used in a variety of electronic items, e.g., cell phones, tablets, smart phones, computers, laptops, networking equipment, etc. Each of the lower electrode and the upper electrode 134 is made of a metal, e.g., aluminum, alloy of aluminum, copper, etc. The upper electrode 132 is coupled to a reference voltage, e.g., a ground voltage, a constant voltage, etc.

The processor of the host system 312 generates a digital pulsed signal 326, which is a digital signal having two states. For example, the digital pulsed signal either has a zero slope or an infinite slope. In some embodiments, instead of the host system 326, a clock oscillator, e.g., a crystal oscillator, etc., is used to generate an analog clock signal, which is converted by an analog-to-digital converter into the digital pulsed signal 326.

The digital pulsed signal 326 has two states, the state S1 and the state S0. In various embodiments, the digital pulsed signal 326 is a TTL signal. Examples of the states S1 and S0 include an on state and an off state, a state having a digital value of 1 and a state having a digital value of 0, and a high state and a low state, etc. For example, the state S1 is a high state and the state S0 is a low state. As another example, the state S1 has a digital value of 1 and the state S0 has a digital value of 0. As yet another example, the state S1 is the on state and the state S0 is the off state.

The DSPx receives the digital pulsed signal 326 and identifies the states of the digital pulsed signal 326. For example, the DSPx determines that the digital pulsed signal 326 has a first magnitude, e.g., the digital value of 1, the high state, etc., during a first time period of a duty cycle and has a second magnitude, e.g., the digital value of 0, the low state, etc., during a second time period of the duty cycle. The DSPx determines that the digital pulsed signal 326 has the state S1 during the first time period and has the state S0 during the second time period. Examples of the state S0 include the low state, the state having the value of 0, and the off state. Examples of the state S1 include the high state, the state having the value of 1, and the on state. As yet another example, the DSPx compares a magnitude of the digital pulsed signal 326 with a pre-stored value to determine that the magnitude of the digital pulsed signal 326 is greater than the pre-stored value during the first time period and that the magnitude during the state S0 of the digital pulsed signal 326 is not greater than the pre-stored value during the second time period. In the embodiment in which the clock oscillator is used, the DSPx receives an analog clock signal from the clock oscillator, converts the analog signal into a digital form, and then identifies the two states S0 and S1.

When a state of the digital pulsed signal 326 is identified as S1, the DSPx provides a power value Px1 to the power controller PCS1$x$ and provides a frequency value Fx1 to the AFTS1$x$. Examples of the power value Px1 include an RMS value of the state S1 of any of the signals illustrated in the graphs a1 thru a18. To illustrate, the power value Px1 is any of the amplitudes A2, A4, A6, A8, A10, A12, A14, A16, A18, A20, A22, A24, A26, A28, A30, A32, A34, and A36 (FIGS. 1A, 1B, 1C-1, 1D-1, and 1E thru 1F). Examples of the frequency value Fx1 include an RMS value of the state S1 of any of the signals illustrated in the graphs b1 thru b18. To illustrate, the frequency value Fx1 is any of the amplitudes B2, B4, B6, B8, B10, B12, B14, B16, B18, B20, B22, B24, B26, B28, B30, B32, B34, and B36 (FIGS. 2A, 2B, 2C-1, 2D-1, and 2E thru 2F).

Moreover, when the state is identified as S0, the DSPx provides a power value Px0 to the power controller PCS0$x$ and provides a frequency value Fx0 to the AFTS0$x$. Examples of the power value Px0 include an RMS value of the state S0 of any of the signals illustrated in the graphs a1 thru a18. To illustrate, the power value Px0 is any of the amplitudes A1, A3, A5, A7, A9, A11, A13, A15, A17, A19, A21, A23, A25, A27, A29, A31, A33, and A35 (FIGS. 1A, 1B, 1C-1, 1D-1, and 1E thru 1F). Examples of the frequency value Fx0 include an RMS value of the state S0 of any of the signals illustrated in the graphs b1 thru b18. To illustrate, the frequency value Fx0 is any of the amplitudes B1, B3, B5, B7, B9, B11, B13, B15, B17, B19, B21, B23, B25, B27, B29, B31, B33, and B35 (FIGS. 2A, 2B, 2C-1, 2D-1, and 2E thru 2F).

It should be noted that in some embodiments, AFTs of an RF generator and power controllers of the RF generator are one or more logic blocks. For example, the power controllers PCS1$x$ and the PCS0$x$ and the auto frequency tuners AFTS1$x$ and AFTS0$x$ are logic blocks, e.g., tuning loops, etc., which are portions of a computer program that is executed by the DSPx. In some embodiments, the computer program is embodied within a non-transitory computer-readable medium, e.g., a memory device.

In an embodiment, a hardware device, e.g., a hardware controller, ASIC, PLD, etc., is used instead of a logic block of an RF generator. For example, a hardware controller is used instead of the power controller PCS1$x$, another hardware controller is used instead of the power controller PCS0$x$, yet another hardware controller is used instead of the AFTS1$x$, and another hardware controller is used instead of the AFTS0$x$.

Upon receiving the power value Px1, during the state S1, the power controller PCS1$x$ determines values of power that are used to generate a portion of a sinusoidal signal during the state S1 and have the RMS value of Px1. Similarly, upon receiving the power value Px0, during the state S0, the power controller PCS0$x$ determines values of power that are used to generate a portion of a sinusoidal signal during the state S0 and have the RMS value of Px0.

Moreover, upon receiving the frequency value Fx1, during the state S1, the auto frequency tuner AFTS1$x$ determines values of frequency that are used to generate a portion of a sinusoidal signal during the state S1 and have the RMS value of Fx1. Similarly, upon receiving the frequency value Fx0, during the state S0, the auto frequency tuner AFTS0x determines values of frequency that are used to generate a portion of a sinusoidal signal during the state S0 and have the RMS value of Fx0.

During the state S1, the power controller PCS1x provides the power values generated from the RMS power value Px1 to the RF power supply PSx. Moreover, during the state S1, the AFTS1x provides the frequency values that are generated from the RMS frequency value Fx1 to the RF power supply PSx. During the state S1, the RF power supply PSx generates a portion of an RF signal, e.g., the RF signal 102 (FIG. 3), the RF signal 108 (FIG. 3), etc., having the power values that are generated from the RMS power value Px1 and having the frequency values that are generated from the RMS frequency value Fx1.

Similarly, during the state S0, the power controller PCS0x provides the power values generated from the RMS power value Px0 to the RF power supply PSx. Moreover, during the state S0, the AFTS0x provides the frequency values that are generated from the RMS frequency value Fx0 to the RF power supply PSx. During the state S0, the RF power supply PSx generates the remaining portion of the RF signal, e.g., the RF signal 102 (FIG. 3), the RF signal 108 (FIG. 3), etc., having the power values that are generated from the RMS power value Px0 and having the frequency values that are generated from the RMS frequency value Fx0. An RF signal that is generated by an RF generator based on power values and/or frequency values is a sinusoidal signal, e.g., is not constant, is not exponential, etc. The RF signal that is generated by the x MHz RF generator is supplied via the RF cable 304 to the IMC 302.

The DSPx provides the digital pulsed signal 326 to the DSPy of the y MHz RF generator and to the DSPz of the z MHz RF generator. When the x MHz RF generator provides the digital pulsed signal 326 to the y and z MHz RF generators, the x MHz RF generator acts as a master RF generator and the DSPx acts as a master controller. Upon receiving the digital pulsed signal 326, in a manner similar to the generation of an RF signal based on the digital pulsed signal 326 by the x MHz RF generator, the y and z MHz RF generators generate sinusoidal RF signals. The RF signal that is generated by the y MHz RF generator is supplied via the RF cable 320 to the IMC 302 and the RF signal that is generated by the z MHz RF generator is supplied via the RF cable 322 to the IMC 302. Examples of an RF signal that is generated by the y MHz RF generator or the z MHz RF generator include an RF signal having the amplitudes A1 and A2 (FIG. 1A), or the amplitudes A3 and A4 (FIG. 1A), or the amplitudes A5 and A6 (FIG. 1A), or the amplitudes A7 and A8 (FIG. 1A), or the amplitudes A9 and A10 (FIG. 1B), or the amplitudes A11 and A12 (FIG. 1B), or the amplitudes A13 and A14 (FIG. 1B), or the amplitudes A15 and A16 (FIG. 1C-1), or the amplitudes A17 and A18 (FIG. 1C-1), or the amplitudes A19 and A20 (FIG. 1D-1), or the amplitudes A21 and A22 (FIG. 1D-1), or the amplitudes A23 and A24 (FIG. 1D-1), or the amplitudes A25 and A26 (FIG. 1D-1), or the amplitudes A27 and A28 (FIG. 1E), or the amplitudes A29 and A30 (FIG. 1E), or the amplitudes A31 and A32 (FIG. 1E), or the amplitudes A33 and A34 (FIG. 1F), or the amplitudes A35 and A36 (FIG. 1F).

The IMC 302 receives the RF signals from the x, y, and z MHz RF generators, and matches an impedance of a load coupled to the IMC 302 with an impedance of a source coupled to the IMC 302 to generate a modified RF signal 306. For example, the IMC 302 matches an impedance of the RF transmission line 310 and the plasma chamber 308 with an impedance of the x MHz RF generator, the y MHz RF generator, the z MHz RF generator, the RF cable 304, the RF cable 320, and the RF cable 322 to generate the modified RF signal 306. As another example, the IMC 302 matches an impedance of any components of the plasma system 300 coupled to the IMC 302 as a load with an impedance of any components of the plasma system 300 coupled to the IMC 302 as a source to generate the modified RF signal 306. Examples of components coupled to the IMC 302 as a load include the RF transmission line 310, the plasma chamber 308, and any other components, such as, for example, a filter, etc., coupled to the IMC 302 on a side of the IMC 302 on which the plasma chamber 308 is located. Example of components coupled to the IMC 302 as a source include the x, y, and z RF generators, the RF cables 304, 320, and 322, and other components, e.g., a filter, etc., coupled to a side of the IMC 302 on which the x, y, and z MHz RF generators are located.

The modified signal 306 is sent by the IMC 302 via the RF transmission line 310 to the chuck 132. When one or more process gases are supplied between the upper electrode 134 and the chuck 132 and when the modified RF signal 306 is supplied to the chuck 132, the one or more process gases are ignited to generate plasma within the plasma chamber 308.

In various embodiments, the upper electrode 132 includes one or more gas inlets, e.g., holes, etc., that are coupled to a central gas feed (not shown). The central gas feed receives the one or more process gases from a gas supply, e.g., a gas reservoir, etc. An example of a process gas includes an oxygen-containing gas, such as $O_2$. Other examples of a process gas include a fluorine-containing gas, e.g., tetrafluoromethane ($CF_4$), sulfur hexafluoride ($SF_6$), hexafluoroethane ($C_2F_6$), etc.

Figure 6B:
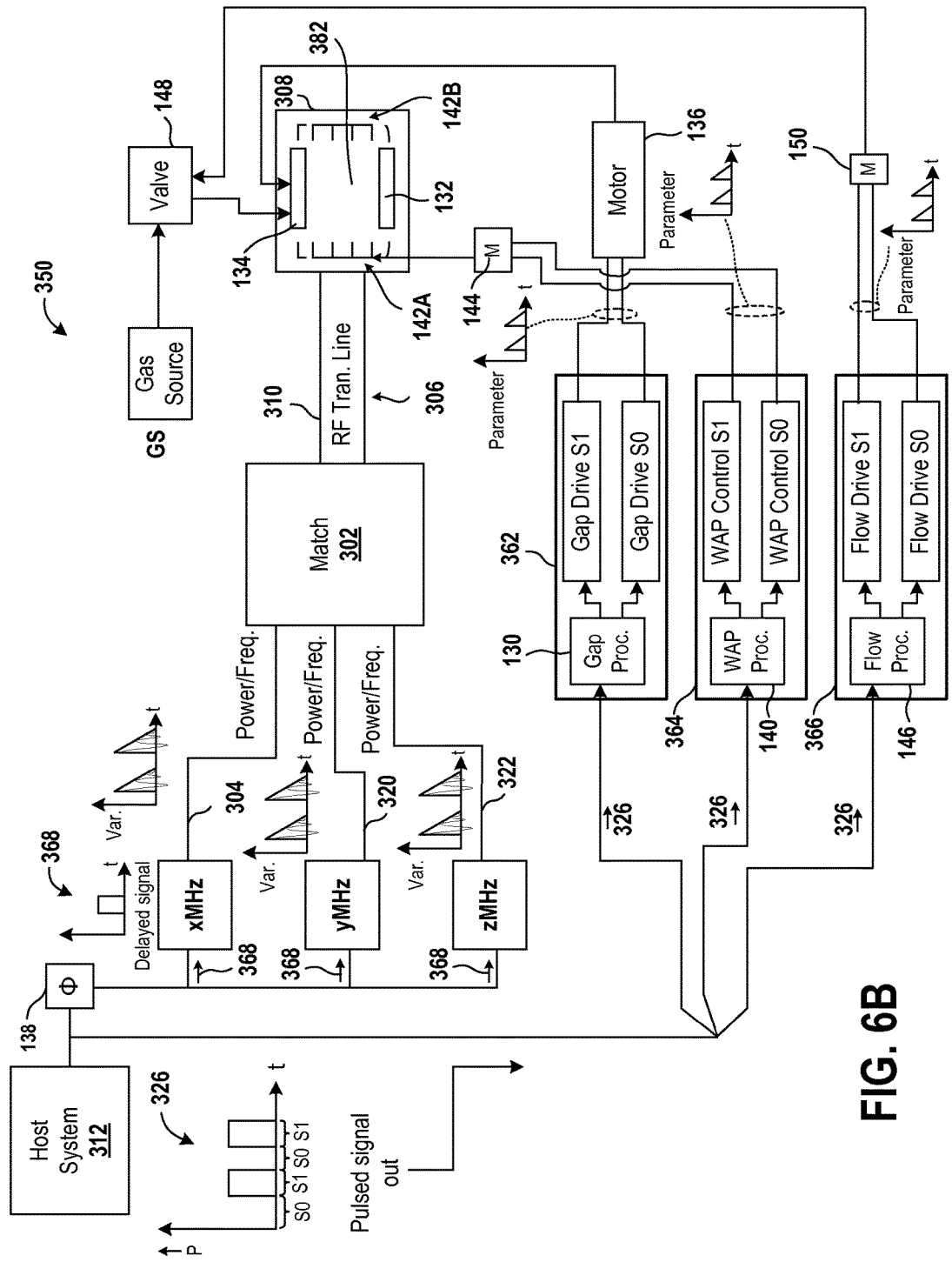
FIG. 6B is a diagram of a plasma system for illustrating an application of soft pulsing to multiple variables by using a phase delay circuit and by receiving the digital pulsed signal from the host system, in accordance with some embodiments of the present disclosure.

FIG. 6B is a diagram of an embodiment of a plasma system 350 for illustrating an application of soft pulsing to multiple variables. The system 350 includes the x, y, and z MHz RF generators, the IMC 302, and the plasma chamber 308. The plasma system 350 further includes a phase delay circuit 138, a gap control system 362, a pressure control system 364, and a flow control system 366.

In some embodiments, instead of the phase delay circuit 138, a processor, e.g., a processor of the host system 312, etc., generates a phase delay of the digital pulsed signal 326.

The gap control system 362 includes a gap processor 130, a gap driver GDS1 for the state S1, and a gap driver GDS0 for the state S0. Moreover, the pressure control system 364 includes a pressure processor 140, a pressure control PCS1 for the state S1, and a pressure control PCS0 for the state S0. Also, the flow control system 366 includes a flow processor 146, a flow driver FDS1 for the state S1, and a flow driver FDS0 for the state S0.

In some embodiments, a driver or a control includes one or more transistors to generate a current signal.

The plasma system 350 also includes a motor 136 that is connected to the gap control system 362 and to the upper electrode 134, a motor 144 that is connected to confinement ring portions 142A and 142B of the plasma chamber 308 and to the pressure control system 364, and a motor 150 that is connected to a valve 148 and the flow control system 366. It should be noted that the confinement ring portion 142A and the confinement ring portion 142B form one or more confinement rings 142.

The motor 136, the upper electrode 134, and/or the chuck 132 are sometimes referred to herein as gap control mechanical components. Moreover, the motor 144 and/or the confinement rings 142 are sometimes referred to herein as pressure control mechanical components. Also, the motor 150, a gas source GS, and/or the valve 148 are sometimes referred to herein as flow control mechanical components.

In some embodiments, the motor 136 is connected to the chuck 132 instead of the upper electrode 134 to move the chuck 132 instead of the upper electrode 134. In various embodiments, a motor is connected to the chuck 132 and another motor is connected to the upper electrode 132 and both motors are connected to the gap control system 362.

In various embodiments, the confinement rings 142 are made of a conductive material, such as, for example, silicon, polysilicon, silicon carbide, boron carbide, ceramic, aluminum, and the like. Usually, the confinement rings 142 surround a periphery of a volume 382 of the plasma chamber 308 in which a plasma is to form. In various embodiments, in addition to the confinement rings 142, the periphery of the volume 382 is defined by the upper electrode 134, the chuck 132, one or more insulator rings, e.g., dielectric rings, etc., that lie between an electrode and an electrode extension, and the upper and lower electrode extensions.

Examples of a motor include an electric machine that converts electrical energy into mechanical energy. Other examples of a motor include an alternating current (AC) motor. Yet other examples of a motor include a machine that includes a moving part, such as, a rotor, and a stationary part, such as a stator. There is an air gap between the stator and the rotor.

Examples of a valve include a device that regulates, directs or controls a flow of a gas or a liquid by opening, closing, or partially obstructing a passage way, e.g., a passage of a casing. Other examples of a valve include a hydraulic valve, a manual value, a solenoid valve, a motor valve, and a pneumatic valve.

The digital pulsed signal 326 is generated by the processor of the host system 312 and provided to the phase delay circuit 138. The phase delay circuit 138 receives the digital pulsed signal 326 and delays the digital pulsed signal 326 by a pre-determined phase to generate a modified pulsed signal 368. The phase delay is provided to the digital pulsed signal 326 to allow time for mechanical components, e.g., the upper electrode 134, the chuck 132, the valve 148, the motor 136, the motor 144, the motor 150, the confinement rings 142, etc., of the plasma system 350 to respond to the digital pulsed signal 326. The phase delay circuit 138 is connected between the host system 312 and the DSPs of the x, y, and z MHz RF generators. The phase delay circuit 138 delays a phase of the digital pulsed signal 326 to generate the modified pulsed signal 368 to further allow the mechanical components of the plasma system 350 more time compared to the electrical components, e.g., the DSPs, RF power supplies, power controllers, AFTs, etc., to respond to the digital pulsed signal 326. The modified pulsed signal 368 is provided to the DSPs of the x, y, and z MHz RF generators.

In some embodiments, an electrical component responds to a pulsed signal when the electrical component generates an output signal based on the pulsed signal input to the electrical component. In various embodiments, a mechanical component responds to a pulsed signal when the mechanical component performs mechanical movement, e.g., rotates, moves, slides, shifts, closes, opens, etc., in response to the pulsed signal.

When the modified pulsed signal 368 is received by the DSPx, the x MHz RF generator generates an RF signal in synchronization with the modified pulsed signal 368. For example, an envelope of a portion of an RF signal changes from a negative slope to a positive slope or to a zero slope at a time a state of the modified pulsed signal 368 transitions from the state S0 the state S1. As another example, a statistical measure of a portion of an RF signal changes from a positive slope to a negative slope or to a zero slope at a time a state of the modified pulsed signal 368 transitions from the state S1 the state S0. Similarly, when the modified pulsed signal 368 is received by the DSPy, the y MHz RF generator generates an RF signal in synchronization with the modified pulsed signal 368 and when the modified pulsed signal 368 is received by the DSPz, the z MHz RF generator generates an RF signal in synchronization with the modified pulsed signal 368.

It should be noted that in the plasma system 350, the x MHz RF generator is not a master generator. The x MHz RF generator of the plasma system 350 does not generate or does not provide the digital pulsed signal 326 to the y and z MHz RF generators. For example, the DSPx does not provide the digital pulsed signal 326 to the DSPy or to the DSPz.

In various embodiments, a phase delay is added by the phase delay circuit 138 to shift the digital pulsed signal 326 to the right on the time t axis to generate the modified pulsed signal 368 to further allow the mechanical components more time to control a flow of a process gas into the plasma chamber 308, to control a gap between the upper electrode 134 and the chuck 132, and/or to control pressure within the plasma chamber 308.

In several embodiments, the digital pulsed signal 326 is lagging in time compared the modified pulsed signal 368 to allow more time to the mechanical components than that allowed to electrical components of the x MHz RF generator, the y MHz RF generator, the z MHz RF generator, the RF cables 304, 320, and 322, the IMC 302, and the RF transmission line 310 to respond to the digital pulsed signal 326. Examples of the electrical components include a DSP of an RF generator, an RF power supply of the RF generator, transistors, resistors, capacitors, inductors, cables, wires, straps, spoons, rods, etc.

The gap processor 130 receives the digital pulsed signal 326 to identify the states S1 and S0 from the digital pulsed signal 326. For example, the gap processor 130 identifies the states S1 and S0 from the digital pulsed signal 326 in a manner similar to that described above in which the DSPs identify the states S1 and S0 from the digital pulsed signal 326. As another example, the gap processor 130 identifies that the digital pulsed signal 326 has the first magnitude, e.g., the digital value of 1, the high state, etc., during the first time period and has the second magnitude, e.g., the digital value of 0, the low state, etc., during the second time period.

Upon determining that the state is S1, the gap processor 130 identifies from a memory device (not shown) coupled to the gap processor 130, values of a portion of a parametric signal, e.g., a signal of the first variable from one of the graphs a1 thru a18 (FIGS. 1A, 1B, 1C-1, 1D-1, 1E thru 1F), a signal of the second variable from one of the graphs b1 thru b18 (FIGS. 2A, 2B, 2C-1, 2D-1, 2E thru 2F), etc., for the state S1 to apply to a gap between the upper electrode 134 and the chuck 132. On the other hand, upon determining that the state is S0, the gap processor 130 identifies from a memory device (not shown) coupled to the gap processor 130, values of a portion of a parametric signal, e.g., a signal of the first variable from one of the graphs a1 thru a18 (FIGS. 1A, 1B, 1C-1, 1D-1, 1E thru 1F), a signal of the second variable from one of the graphs b1 thru b18 (FIGS. 2A, 2B, 2C-1, 2D-1, 2E thru 2F), etc., for the state S0 to apply to a gap between the upper electrode 134 and the chuck 132. The gap processor 130 provides the values of a parametric signal to be generated during the state S1 to the gap driver GDS1 and provides the values of the parametric signal to be generated during the state S0 to the gap driver GDS0.

The gap driver GDS1 generates a portion of a parametric signal having the values received from the gap processor 130 during the state S1 and provides the portion to the motor 136. Moreover, the gap driver GDS0 generates the remaining portion of the parametric signal having the values received from the gap processor 130 during the state S0 and provides the portion to the motor 136. The motor 136 operates, e.g., the rotor rotates, etc., according to frequency and power of a portion of the parametric signal received from the gap driver GDS1 during the state S1 and further operates according to frequency and power of the remaining portion of the parametric signal received from the gap driver GDS0. When the motor 136 operates during the state S1 based on a frequency and power of a portion of a parametric signal, a gap, e.g., a distance, etc., between the upper electrode 134 and the chuck 132 changes according to the frequency and power. Moreover, when the motor 136 operates during the state S0 based on a frequency and power of the remaining portion of a parametric signal, a distance between the upper electrode 134 and the chuck 132 changes according to the frequency and power.

In a manner similar to that described above with respect to the gap processor 130, the pressure processor 140 receives the digital pulsed signal 326 to identify the states S1 and S0 from the digital pulsed signal 326. Upon determining that the state of the digital pulsed signal 326 is S1, the pressure processor 140 identifies from a memory device coupled to the pressure processor 140, values of a portion of a parametric signal, e.g., a signal of the first variable in one of the graphs a1 thru a18 (FIGS. 1A, 1B, 1C-1, 1D-1, 1E thru 1F), a signal of the second variable in one of the graphs b1 thru b18 (FIGS. 2A, 2B, 2C-1, 2D-1, 2E thru 2F), etc., for the state S1 to apply to the confinement rings 142. On the other hand, upon determining that the state is S0, the pressure processor 140 identifies from a memory device coupled to the pressure processor 140, a portion of a parametric signal, e.g., a signal of the first variable in one of the graphs a1 thru a18 (FIGS. 1A, 1B, 1C-1, 1D-1, 1E thru 1F), a signal of the second variable in one of the graphs b1 thru b18 (FIGS. 2A, 2B, 2C-1, 2D-1, 2E thru 2F), etc., for the state S0 to apply to the confinement rings 142. During the state S1, the pressure processor 140 provides values of a parametric signal for the state S1 to the pressure control PCS1. Moreover, during the state S0, the pressure processor 140 provides values of a parametric signal for the state S0 to the pressure control PCS0.

During the state S1, the pressure control PCS1 generates a current signal having the values of a parametric signal and provides the current signal to the motor 144. Furthermore, during the state S0, the pressure control PCS0 generates a current signal having the values of a parametric signal and provides the current signal to the motor 144. The motor 144 operates with a frequency and power of the values of a portion of a parametric signal received during the state S1. The operation of the motor 144 changes a vertical position of the confinement rings 142 with respect to the volume 382 of the plasma chamber 308 in accordance with the frequency and power of a portion of a parametric signal during the state S1 to change pressure within the volume 382. Similarly, the motor 144 operates with a frequency and power of the values of a portion of a parametric signal received during the state S0. The operation of the motor 144 changes a vertical position of the confinement rings 142 with respect to the volume 382 of the plasma chamber 308 in accordance with the frequency and power of a portion of a parametric signal during the state S0 to change pressure within the volume 382.

In various embodiments in which the motor 144 is connected to the confinement rings 142 from a bottom side of the confinement rings 142, the vertical position of the confinement rings 142 is changed to move the confinement rings 142 up or down in the volume 382. The confinement rings 142 move up to cover a greater amount of the volume 382 and move down to cover a less amount of the volume 382.

In several embodiments, the motor 144 is connected to the confinement rings 142 from a top side of the confinement rings 142. The confinement rings 142 move down to cover a greater amount of the volume 382 and move up to cover a less amount of the volume 382.

In some embodiments, the motor 144 is connected to the confinement rings 142 via a rod and the confinement rings 142 are spaced into and connected to grooves of the rod. As the rotor of the motor 144 rotates, the rod protrudes or recesses from the motor to change a vertical position of the confinement rings 142. The rod is connected to the motor.

Moreover, the flow processor 146 receives the digital pulsed signal 326 and identifies the states S1 and S0 of the digital pulsed signal 326 in a manner similar to that of a DSP identifying the states S1 and S0 of the digital pulsed signal 326. Upon determining that the state is S1, the flow processor 146 identifies from a memory device coupled to the flow processor 146, values of a portion of a parametric signal, e.g., a signal of the first variable in one of the graphs a1 thru a18 (FIGS. 1A, 1B, 1C-1, 1D-1, 1E thru 1F), a signal of the second variable in one of the graphs b1 thru b18 (FIGS. 2A, 2B, 2C-1, 2D-1, 2E thru 2F), etc., for the state S1 to apply to the valve 148. On the other hand, upon determining that the state is S0, the flow processor 146 identifies from a memory device coupled to the flow processor 146, a portion of a parametric signal, e.g., a signal of the first variable in one of the graphs a1 thru a18 (FIGS. 1A, 1B, 1C-1, 1D-1, 1E thru 1F), a signal of the second variable in one of the graphs b1 thru b18 (FIGS. 2A, 2B, 2C-1, 2D-1, 2E thru 2F), etc., for the state S0 to apply to the valve 148. During the state S1, the flow processor 146 provides values of a parametric signal for the state S1 to the flow driver FDS1. Moreover, during the state S0, the flow processor 146 provides values of a parametric signal for the state S0 to the flow driver FDS0.

During the state S1, the flow driver FDS1 generates a current signal to drive the motor 150 according to frequency values and power values of a portion of a parametric signal for the state S1. Moreover, during the state S0, the flow driver FDS1 generates a current signal to drive the motor 150 according to frequency values and power values of the remaining portion of a parametric signal for the state S0. The motor 150 operates to change a position of the valve 148 within the casing, e.g., enclosure, tube, pipe, etc., in which the valve 148 is situated to open or close. The position of the valve 148 changes according to frequency and power of a portion of a parametric signal generated during the state S1 and according to frequency and power of the remaining portion of the parametric signal generated during the state S0. The change in the position of the valve 148 during the state S1 or the state S0 changes, e.g., increases, decreases, etc., a flow rate of one or more process gases into the volume 382. A process gas or a mixture of process gases is stored in the gas source GS and supplied via the passage of the casing to the plasma chamber 308. The gas source GS is coupled to the plasma chamber 308 via the casing. When one or more process gases are supplied to the volume 382 and the modified RF signal 306 is received by the chuck 132 via the RF transmission line 310, plasma is generated in the plasma chamber 308. The plasma is used to perform one or more processing operations described above.

In some embodiments, the motor 150 is connected to the valve 148 via a rod to change a position of the valve with a rotation of a rotor of the motor 150.

In various embodiments, instead of the motor 150, other mechanical components, e.g., current drivers, etc., are used to control the valve 148. For example, the valve 148 is a solenoid valve and the flow drivers FDS1 and FDS0 are current drivers for the states S1 and S0. In these embodiments, when a portion of the digital pulsed signal 326 is received by the flow processor 146 during the state S1, the flow processor 146 identifies values of a parametric signal, e.g., values of any of the signals of the first variable illustrated in the graphs a1 thru a18 (FIGS. 1A, 1B, 1C-1, 1D-1, 1E thru 1F), values of a signal of the second variable from one of the graphs b1 thru b18 (FIGS. 2A, 2B, 2C-1, 2C-2, and 2E thru 2F), etc., from a memory device of the flow control system 366. Upon identifying the values of the parametric signal during the state S1, the flow processor 146 generates a command signal to indicate to the flow driver FDS1 to generate a portion of the parametric signal during the state S1. Similarly, when a portion of the digital pulsed signal 326 is received by the flow processor 146 during the state S0, the flow processor 146 identifies values of a parametric signal, e.g., any of the signals of the first variable illustrated in the graphs a1 thru a18 (FIGS. 1A, 1B, 1C-1, 1D-1, 1E thru 1F), a signal of the second variable from one of the graphs b1 thru b18 (FIGS. 2A, 2B, 2C-1, 2C-2, and 2E thru 2F), etc., from a memory device of the flow control system 366. Upon identifying the values of a parametric signal for the state S0, the flow processor 146 generates a command signal to indicate to the flow driver FDS0 to generate a portion of the parametric signal having the values during the state S0. The flow driver FDS1 sends a portion of a parametric signal having current values generated during the state S1 to the valve 148 and the flow driver FDS0 sends a portion of a parametric signal having the current values generated during the state S0 to the valve 148. Upon receiving the current values during the state S1, the valve 148 opens or closes according to the current values to control a flow of one or more process gases from the gas source GS to the volume 382 of the plasma chamber 308. Similarly, upon receiving the current values during the state S0, the valve 148 opens or closes according to the current values to control a flow of one or more process gases from the gas source GS to the volume 382 of the plasma chamber 308.

In some embodiments, any number of gas sources is used in the plasma system 350. Each gas source stores a different process gas. For example, one gas source stores a fluorine-containing gas and another gas source stores an oxygen-containing gas. Each gas source is connected via a casing to the plasma chamber 308 to supply a gas, e.g., a process gas, an inert gas, etc., to the plasma chamber 308. A casing includes a valve that is connected to and controlled by a motor, which is further connected to and controlled by the flow drivers FDS1 and FDS0.

Figure 7:
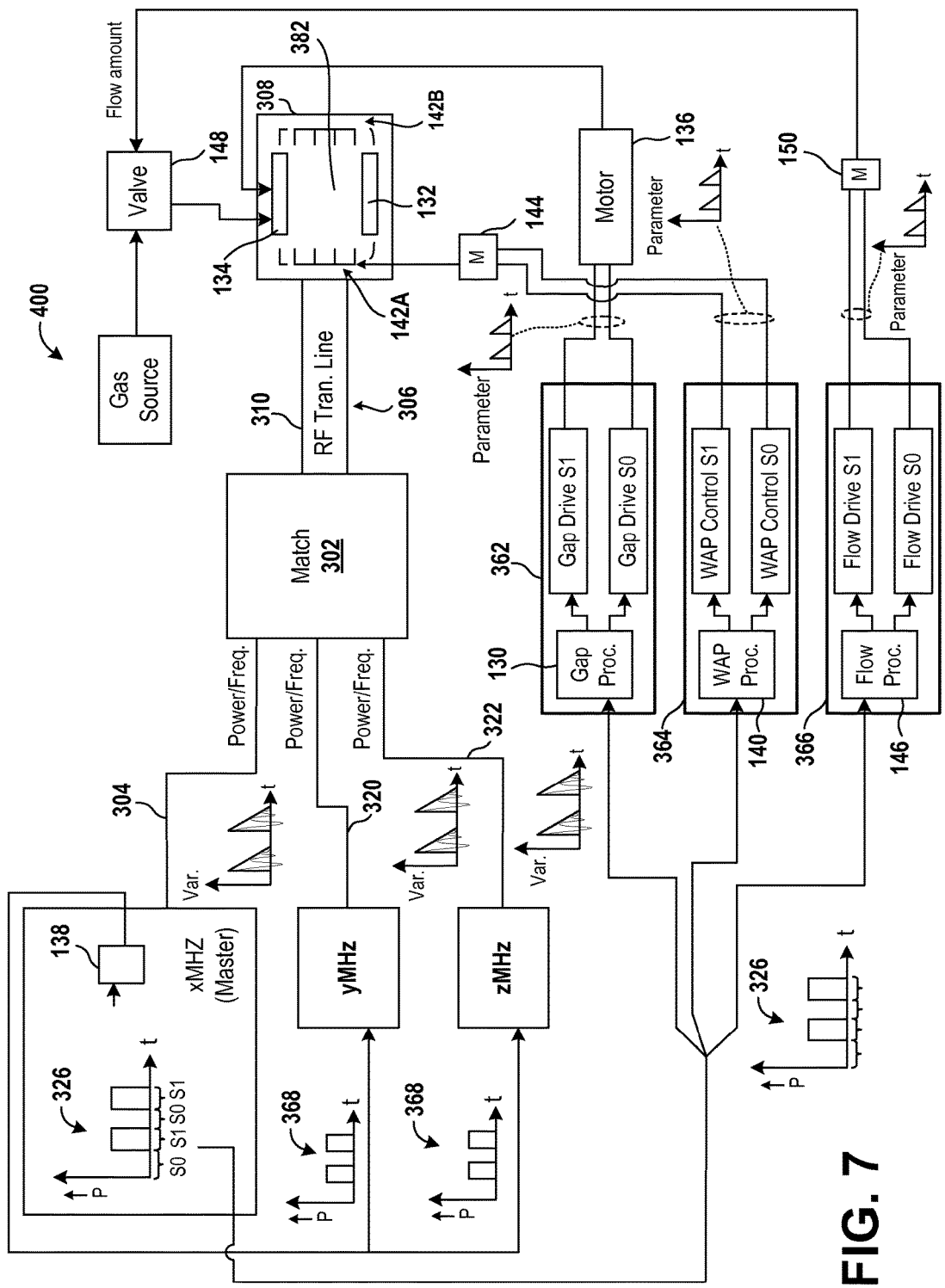
FIG. 7 is a diagram of a plasma system to illustrate use of a master RF generator to generate the digital pulsed signal and to illustrate use of the phase delay circuit for performing soft pulsing, in accordance with various embodiments of the present disclosure.

FIG. 7 is a diagram of an embodiment of a plasma system 400 to illustrate use of the master RF generator to generate the digital pulsed signal 326 and the modified pulsed signal 368. The plasma system 400 operates in a manner similar to the plasma system 350 (FIG. 6B) except that in the plasma system 400 instead of the host system 312, the x MHz RF generator generates the pulsed signal 326 and the modified pulsed signal 368, which is received by the y MHz RF generator and the z MHz RF generator. For example, the DSPx or a clock source of the x MHz RF generator generates the digital pulsed signal 326, which is transferred to the phase delay circuit 138. The phase delay circuit 138 generates the modified pulsed signal 368 from the digital pulsed signal 326. As another example, a clock oscillator of the x MHz RF generator generates an analog signal that is converted by an analog-to-digital converter of the x MHz RF generator into the digital pulsed signal 326, which is transferred to the phase delay circuit 138 for generation of the modified pulsed signal 368.

The modified pulsed signal 368 is provided by the x MHz RF generator to the y MHz RF generator and to the z MHz RF generator, and the digital pulsed signal 326 is provided by the x MHz RF generator to the gap control system 362, the pressure control system 364, and the flow control system 366. For example, the phase delay circuit 138 provides the modified pulsed signal 368 to the DSPy and the DSPz, and the DSPx provides the digital pulsed signal 326 to the gap processor 130, the WAP processor 140, and the flow processor 146. The remaining operations of the plasma system 400 are similar to that described above with respect to the plasma system 350.

In some embodiments, the digital pulsed signal 326 is received by the x MHz RF generator from the host system 312 that is coupled to the x MHz RF generator. The x MHz RF generator generates the modified pulsed signal 368 from the digital pulsed signal 326 and provides the modified pulsed signal 368 to the DSPy and the DSPz.

In various embodiments, the digital pulsed signal 326 is received by the phase delay circuit 138 from the host system 312 to generate the modified pulsed signal 368. The modified pulsed signal 368 is provided by the phase delay circuit 138 to the x MHz RF generator. The x MHz RF generator provides the modified pulsed signal 368 to the DSPy and the DSPz.

Figure 8:
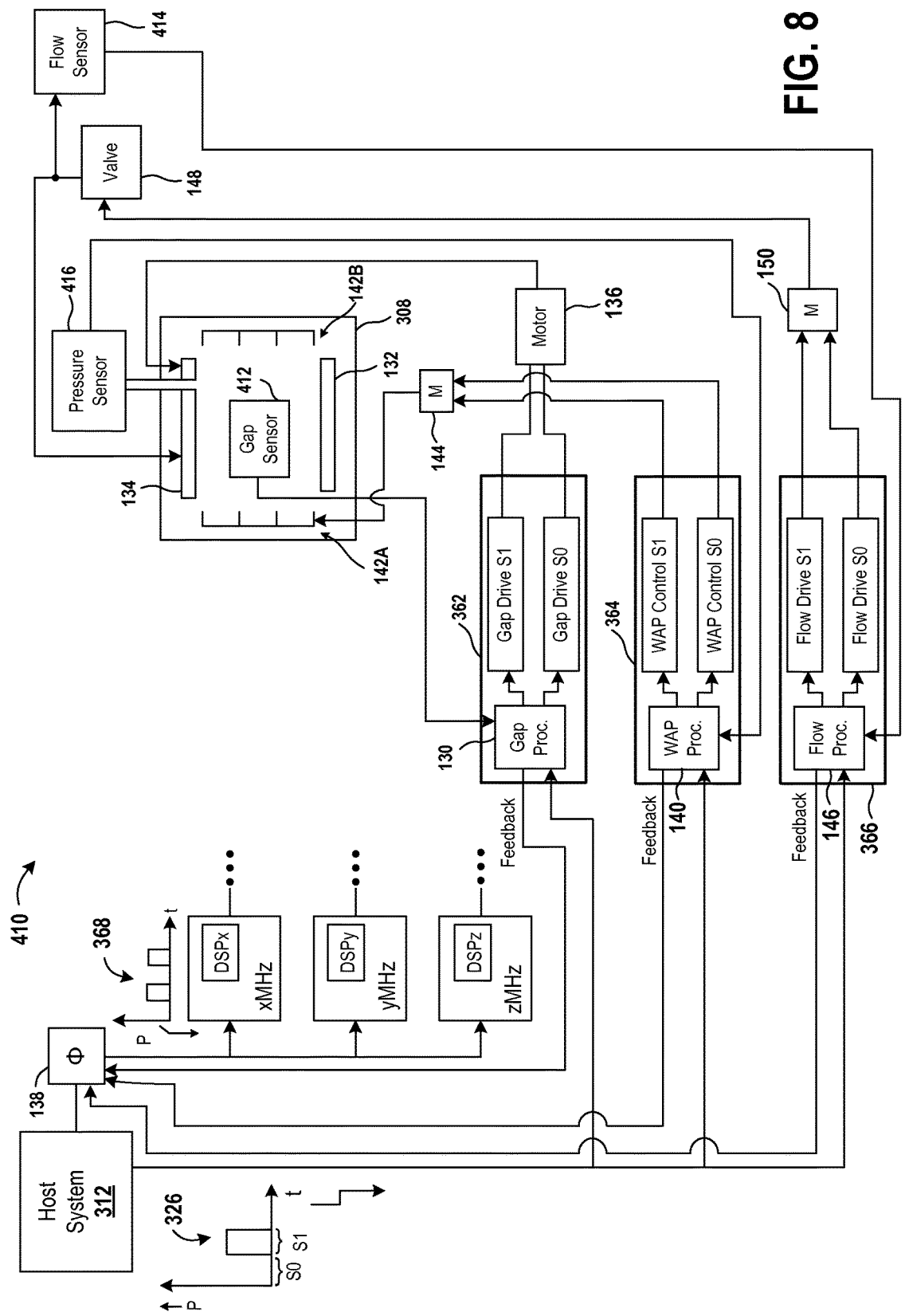
FIG. 8 is a diagram of a plasma system for illustrating use of a feedback system to determine a time for providing a next state of the digital pulsed signal, in accordance with various embodiments of the present disclosure.

FIG. 8 is a diagram of an embodiment of a plasma system 410 for illustrating use of a feedback system to determine a time of provision of a next state of the modified pulsed signal 368. The plasma system 410 is similar to the plasma system 350 (FIG. 6B) except that the plasma system 410 includes the feedback system.

The feedback system includes a gap sensor 412, a flow sensor 414, and a pressure sensor 416. Examples of the gap sensor 412 include a laser detector, an optical sensor, an inductive detector, a capacitive detector, a linear variable differential transformer (LVDT) sensor, etc. In some embodiments, the gap sensor 412 is located outside the plasma chamber 308 and is optically coupled to the volume 382 to determine a gap, e.g., a vertical distance, etc., between the upper electrode 134 and the chuck 132. An example of the flow sensor 414 includes a flow rate sensor that measures a rate of flow of a process gas in standard cubic centimeter per minute (sccm), an optical flow meter, a coriolis flow meter, a mass flow sensor, a thermal mass flow sensor, a volumetric sensor, a pressure-based meter, etc. The flow sensor 414 is coupled via an orifice in the casing, e.g., a gas line, etc., in which the valve 148 is located to an inside volume of the casing. The pressure sensor 416 measures a pressure of one or more gases and/or plasma within the plasma chamber 308. Examples of the pressure sensor 416 include an absolute pressure sensor, a vacuum pressure sensor, a differential pressure sensor, a resonant pressure sensor, a thermal pressure sensor, an optical pressure sensor, etc. In some embodiments, the pressure sensor 416 is located outside the volume 382 to measure pressure of one or more gases and/or plasma within the volume 382.

In the embodiments in which multiple gas sources are used, a flow sensor is coupled to a casing of a gas source to measure a flow rate of a gas flowing from the gas source to the plasma chamber 308. The flow sensor is connected to the flow processor 146 to provide the measured flow rate to the flow processor 146.

The plasma system 410 operates in a manner similar to the plasma system 350 (FIG. 6B) except that the plasma system 410 uses the feedback system. For example, after a gap between the upper electrode 134 and the chuck 132 is changed, the gap sensor 412 measures the gap. The amount of gap measured is provided by the gap sensor 412 to the gap processor 130. The gap processor 130 determines whether the amount of gap matches a pre-determined amount of gap for a state. The pre-determined amount of gap for a state is stored in a memory device of the gap control system 362 (FIG. 7). In the memory device, the pre-determined of gap for a state is linked with an amount of impedance of plasma within the plasma chamber 308 for the state. For example, the pre-determined amount of gap for the state S1 is linked with an amount of impedance Z1 and the pre-determined of gap for the state S0 is linked with an amount of impedance Z2. The impedance of plasma within the plasma chamber 308 is a function of one or more of power of one or more RF signals that are provided to the plasma chamber 308, pressure within the plasma chamber 308, gap between the upper electrode 134 and the chuck 132 within the plasma chamber 308, and flow rate of one or more gases that flow into the plasma chamber 308.

An impedance of plasma within the plasma chamber 308 is achieved for a state to further achieve an etch rate or a deposition rate for the state. For example, the pre-determined amount of gap for the state S0 helps achieve an impedance to further achieve a lower etch rate for the state S0 and the pre-determined amount of gap for the state S1 helps achieve an impedance to further achieve an etch rate for the state S1 higher than the lower etch rate. As another example, the pre-determined amount of gap for the state S0 helps achieve an impedance to further achieve a higher deposition rate for the state S0 and the pre-determined amount of gap for the state S1 helps achieve an impedance to further achieve a deposition rate for the state S1 lower than the higher deposition rate. As another example, the pre-determined amount of gap for the state S0 helps achieve an impedance to further achieve a deposition rate for the state S0 and the pre-determined amount of gap for the state S1 helps achieve an impedance to further achieve an etch rate for the state S1. A deposition rate is a rate of depositing a material, e.g., mask, oxides, polymers, etc., on the work piece 324 and an etch rate is a rate of etching off the material on the work piece 324.

An amount of gap for the state S1 is associated with a portion of a parametric signal during the state S1 that is sent by the gap driver GDS1 (FIG. 7) to operate the motor 136 or and an amount of gap for the state S0 is associated with the remaining portion of the parametric signal during the state S0 that is sent by the gap driver GDS0 (FIG. 7) to the motor 136.

Upon determining that the amount of gap measured does not match the pre-determined amount of gap for a state, the gap processor 130 sends a feedback signal indicating the same to the phase delay circuit 138. During a current state, e.g., the state S0, the state S1, etc., upon receiving the signal indicating that the amount of gap measured does not match the pre-determined amount of gap for the current state, the phase delay circuit 138 increases a phase delay for a next state, e.g., the state S1, the state S0, etc., which is consecutive to the current state. The phase delay is increased for the next state compared to a phase delay for the current state and is added to the digital pulsed signal 326 to generate the modified pulsed signal 368. For example, when the phase delay circuit 138 has sent a portion of the modified pulsed signal 368 for the state S1 for a cycle to the x MHz RF generator, the y MHz RF generator, and the z MHz RF generator, the phase delay circuit 138 delays in sending the remaining portion of the modified pulsed signal 368 for the state S0 for the cycle to the x MHz RF generator, the y MHz RF generator, and the z MHz RF generator upon receiving the signal indicating that the measured gap does not match the pre-determined amount of gap for the state S1. As another example, when the phase delay circuit 138 has sent a portion of the modified pulsed signal 368 for the state S0 for a cycle to the x MHz RF generator, the y MHz RF generator, and the z MHz RF generator, the phase delay circuit 138 delays in sending the remaining portion of the modified pulsed signal 368 for the state S1 for the cycle to the x MHz RF generator, the y MHz RF generator, and the z MHz RF generator upon receiving the signal indicating that the measured gap does not match the pre-determined amount of gap for the state S0.

On the other hand, upon determining that the amount of gap measured matches the pre-determined amount of gap for a state, the gap processor 130 sends a feedback signal indicating the same to the phase delay circuit 138. During the current state, upon receiving the signal indicating that the amount of gap measured matches the pre-determined amount of gap for the current state, the phase delay circuit 138 sends a portion of the modified pulsed signal 368 for the next state to the x MHz RF generator, the y MHz RF generator, and the z MHz RF generator without adding any further delay compared to that in the current state. For example, when the phase delay circuit 138 has sent a portion of the modified pulsed signal 368 for the state S1 for a cycle to the x MHz RF generator, the y MHz RF generator, and the z MHz RF generator, the phase delay circuit 138 sends the remaining portion of the modified pulsed signal 368 for the state S0 for the cycle to the x MHz RF generator, the y MHz RF generator, and the z MHz RF generator upon receiving the signal indicating that the measured gap matches the pre-determined amount of gap for the state S1.

As another example, after a pressure within the volume 382 of the plasma chamber 308 is changed, the pressure sensor 416 measures pressure of one or more process gases and/or plasma within the volume 382. The amount of pressure measured is provided by the pressure sensor 416 to the pressure processor 140. The pressure processor 140 determines whether the amount of pressure matches a pre-determined amount of pressure for a state. The pre-determined amount of pressure for a state is stored in a memory device of the pressure control system 364 (FIG. 7). In the memory device, the pre-determined of pressure for a state is linked with an amount of impedance of plasma within the plasma chamber 308. For example, the pre-determined amount of pressure for the state S1 is linked with the amount of impedance Z1 and the pre-determined of pressure for the state S0 is linked with the amount of impedance Z2. An amount of pressure for the state S1 is associated with a portion of a parametric signal during the state S1 that is sent by the pressure control PCS1 (FIG. 7) to operate the motor 144 and an amount of pressure for the state S0 is associated with the remaining portion of the parametric signal during the state S0 that is sent by the pressure control PCS0 (FIG. 7) to the motor 144.

An impedance of plasma within the plasma chamber 308 is achieved for a state to further achieve an etch rate or a deposition rate for the state. For example, the pre-determined amount of pressure for the state S0 helps achieve an impedance to further achieve a lower etch rate for the state S0 and the pre-determined amount of pressure for the state S1 helps achieve an impedance to further achieve an etch rate for the state S1 higher than the lower etch rate. As another example, the pre-determined amount of pressure for the state S0 helps achieve an impedance to further achieve a higher deposition rate for the state S0 and the pre-determined amount of pressure for the state S1 helps achieve an impedance to further achieve a deposition rate for the state S1 lower than the higher deposition rate. As another example, the pre-determined amount of pressure for the state S0 helps achieve an impedance to further achieve a deposition rate for the state S0 and the pre-determined amount of pressure for the state S1 helps achieve an impedance to further achieve an etch rate for the state S1.

Upon determining that the amount of pressure measured does not match the pre-determined amount of pressure for a state, the pressure processor 140 sends a feedback signal indicating the same to the phase delay circuit 138. During the current state, upon receiving the signal indicating that the amount of pressure measured does not match the pre-determined amount of pressure for the current state, the phase delay circuit 138 increases a phase delay of a portion of the pulsed digital signal 326 for the next state to generate the modified pulsed signal 368 to send to the x MHz RF generator, the y MHz RF generator, and the z MHz RF generator. On the other hand, upon determining that the amount of pressure measured matches the pre-determined amount of pressure for a state, the pressure processor 140 sends a feedback signal indicating the same to the phase delay circuit 138. During the current state, upon receiving the signal indicating that the amount of pressure measured matches the pre-determined amount of pressure for the current state, the phase delay circuit 138 sends a portion of the pulsed digital signal 326 for the next state to the x MHz RF generator, the y MHz RF generator, and the z MHz RF generator without adding any delay to the pulsed digital signal 326.

As yet another example, after a flow rate within the casing that surrounds the valve 148 is changed, the flow sensor 414 measures a flow rate of one or more process gases flowing from the gas source GS to the plasma chamber 308. The amount of flow rate measured is provided by the flow sensor 414 to the flow processor 146. The flow processor 146 determines whether the amount of flow rate matches a pre-determined amount of flow rate for a state. The pre-determined amount of flow rate for a state is stored in a memory device of the flow control system 366 (FIG. 7). In the memory device, the pre-determined of flow rate for a state is linked with an amount of impedance of plasma within the plasma chamber 308. For example, the pre-determined amount of flow rate for the state S1 is linked with the amount of impedance Z1 and the pre-determined of flow rate for the state S0 is linked with the amount of impedance Z2. An amount of flow rate for the state S1 is associated with a portion of a parametric signal during the state S1 that is sent by the flow driver FDS1 (FIG. 7) to operate the motor 150 and an amount of flow rate for the state S0 is associated with the remaining portion of the parametric signal during the state S0 that is sent by the flow driver FDS0 (FIG. 7) to the motor 150.

An impedance of plasma within the plasma chamber 308 is achieved for a state to further achieve an etch rate or a deposition rate for the state. For example, the pre-determined amount of flow rate for the state S0 helps achieve an impedance to further achieve a lower etch rate for the state S0 and the pre-determined amount of flow rate for the state S1 helps achieve an impedance to further achieve an etch rate for the state S1 higher than the lower etch rate. As another example, the pre-determined amount of flow rate for the state S0 helps achieve an impedance to further achieve a higher deposition rate for the state S0 and the pre-determined amount of flow rate for the state S1 helps achieve an impedance to further achieve a deposition rate for the state S1 lower than the higher deposition rate. As another example, the pre-determined amount of flow rate for the state S0 helps achieve an impedance to further achieve a deposition rate for the state S0 and the pre-determined amount of flow rate for the state S1 helps achieve an impedance to further achieve an etch rate for the state S1.

Upon determining that the amount of flow rate measured does not match the pre-determined amount of flow rate for a state, the flow processor 146 sends a feedback signal indicating the same to the phase delay circuit 138. During the current state, upon receiving the signal indicating that the amount of flow rate measured does not match the pre-determined amount of flow rate for the current state, the phase delay circuit 138 determines to add a phase delay to a portion of the pulsed digital signal 326 for the next state to generate the modified pulsed signal 368 to send to the x MHz RF generator, the y MHz RF generator, and the z MHz RF generator. On the other hand, upon determining that the amount of flow rate measured matches the pre-determined amount of flow rate for a state, the flow processor 146 sends a feedback signal indicating the same to the phase delay circuit 138. During the current state, upon receiving the signal indicating that the amount of flow rate measured matches the pre-determined amount of flow rate for the current state, the phase delay circuit 138 sends a portion of the pulsed digital signal 326 for the next state to the x MHz RF generator, the y MHz RF generator, and the z MHz RF generator without adding any delay to the pulsed digital signal 326.

In various embodiments, the feedback signals that are generated by the gap processor 130, the WAP processor 140, and the flow processor 146 are generated in response to the digital pulsed signal 326 and the modified pulsed signal 368 that are generated by the x MHz RF generator.

In various embodiments, the phase delay circuit 138 adds a phase delay to the digital pulsed signal 326 and the phase delay is determined to compensate for the slowest response time among a response time of the gap control mechanical components, a response time of the pressure control mechanical components, and a response time of the flow control mechanical components. For example, the phase delay that is added by the phase delay circuit 138 matches or exceeds a highest response time among a response time of the gap control mechanical components, the pressure control mechanical components, and the flow control mechanical components. As another example, upon receiving a signal indicating that a gap measured by the gap sensor 412 does not match the pre-determined gap for a state, a signal indicating that a pressure measured by the pressure sensor 416 does not match the pre-determined amount of pressure for the state, and a signal indicating that a flow rate measured by the flow sensor 414 does not match the pre-determined amount of flow rate for the state, the phase delay circuit 138 determines a longest amount of time among a time to achieve the pre-determined amount of gap, a time to achieve the pre-determined amount of pressure, and a time to achieve the pre-determined amount of flow rate for a state. The phase delay circuit 138 accesses the time to achieve the pre-determined amount of gap for a state, a time to achieve the pre-determined amount of pressure for the state, and a time to achieve the pre-determined amount of flow rate for the state from a memory device of the phase delay circuit 138. Upon determining that the time to achieve the pre-determined amount of flow for a state is the longest, the phase delay circuit 138 delays a remaining portion of the pulsed digital signal 326 by the time to achieve the pre-determined amount of flow for the state. Similarly, upon determining that the time to achieve the pre-determined amount of pressure is the longest for a state, the phase delay circuit 138 delays a remaining portion of the pulsed digital signal 326 by the time to achieve the pre-determined amount of pressure for the state. Moreover, similarly, upon determining that the time to achieve the pre-determined amount of gap is the longest for a state, the phase delay circuit 138 delays a remaining portion of the pulsed digital signal 326 by the time to achieve the pre-determined amount of gap for the state.

In various embodiments, the phase delay circuit 138 includes a processor.

It should be noted that in some embodiments, a response time of mechanical components, e.g., the gap control mechanical components, or the pressure control mechanical components, or the flow control mechanical components, etc., includes a sum of a response time of one of the mechanical components and one or more response times of corresponding one or more of the remaining of the mechanical components. For example, in a group of two mechanical components, e.g., two gap control mechanical components, or two pressure control mechanical components, or two flow control mechanical components, etc., a response time of the two mechanical components is a sum of a response time of a first one of the two mechanical components and a response time of a second one of the two mechanical components.

In various embodiments, a response time of mechanical components that include the gap control mechanical components, the pressure control mechanical components, and the flow control mechanical components is a highest response time between a first one of the mechanical components and one or more response times of corresponding one or more of the remaining of the mechanical components. For example, in a group of two mechanical components, e.g., two gap control mechanical components, or two pressure control mechanical components, or two flow control mechanical components, etc., a response time of the two mechanical components is the largest between a response time of a first one of the two mechanical components and a response time of a second one of the two mechanical components.

In some embodiments, the phase delay circuit 138 is implemented within the host system 312 (FIG. 6B).

In various embodiments in which three states are used, the gap control system 362 includes three gap drivers instead of two, one for each of the states S2, S3, and S4. Moreover, in these embodiments, the WAP control system 364 includes three pressure controls instead of two, one for each of the states S2, S3, and S4. Also, in these embodiments, the flow control system 366 includes three flow drivers, one for each of the states S2, S3, and S4. During the state S2, the gap processor 130 sends a signal to the gap driver designated for the state S2 to control the motor 136 to further control a position of the upper electrode 134. Moreover, during the state S3, the gap processor 130 sends a signal to the gap driver designated for the state S3 to control the motor 136 to further control a position of the upper electrode 134. During the state S4, the gap processor 130 sends a signal to the gap driver designated for the state S4 to control the motor 136 to further control a position of the upper electrode 134. During the state S2, the WAP processor 140 sends a signal to the pressure control designated for the state S2 to control the motor 144 to further control vertical positions of the confinement rings 142. Also, during the state S3, the WAP processor 140 sends a signal to the pressure control designated for the state S3 to control the motor 144 to further control vertical positions of the confinement rings 142. During the state S4, the WAP processor 140 sends a signal to the pressure control designated for the state S4 to control the motor 144 to further control vertical positions of the confinement rings 142. Similarly, during the state S2, the flow processor 146 sends a signal to the flow driver designated for the state S2 to control the motor 150 to further control opening and closing of the valve 148. Moreover, during the state S3, the flow processor 146 sends a signal to the flow driver designated for the state S3 to control the motor 150 to further control opening and closing of the valve 148. During the state S4, the flow processor 146 sends a signal to the flow driver designated for the state S4 to control the motor 150 to further control opening and closing of the valve 148.

It should be noted that in some embodiments, instead of controlling a vertical up and down position of the confinement rings 142, a motor is controlled by the WAP controls and the WAP processor 140 to control opening and closing of the confinement rings. The opening and closing is done to control pressure within the plasma chamber 308.

In some embodiments, a different phase delay is applied to different RF generators. For example, a first phase delay is applied to the x MHz RF generator and a second phase delay is applied to the y MHz RF generator. A first phase delay circuit for applying the first phase delay is coupled between the host system 312 and the x MHz RF generator and a second phase delay circuit for applying the second phase delay is coupled between the host system 312 and the y MHz RF generator. The first phase delay circuit receives the digital pulsed signal 326 from the host system 312 and delays a phase of the digital pulsed signal 326 by the first phase delay to generate the modified pulsed signal 368 to provide to the x MHz RF generator. The x MHz RF generator receives the modified pulsed signal 368 and generates an RF signal in synchronization with the modified pulsed signal 368. Moreover, the second phase delay circuit receives the digital pulsed signal 326 from the host system 312 and delays a phase of the digital pulsed signal 326 by the second phase delay to generate another modified pulsed signal to provide to the y MHz RF generator. The y MHz RF generator receives the other modified pulsed signal and generates an RF signal in synchronization with the other modified pulsed signal.

Figure 9:
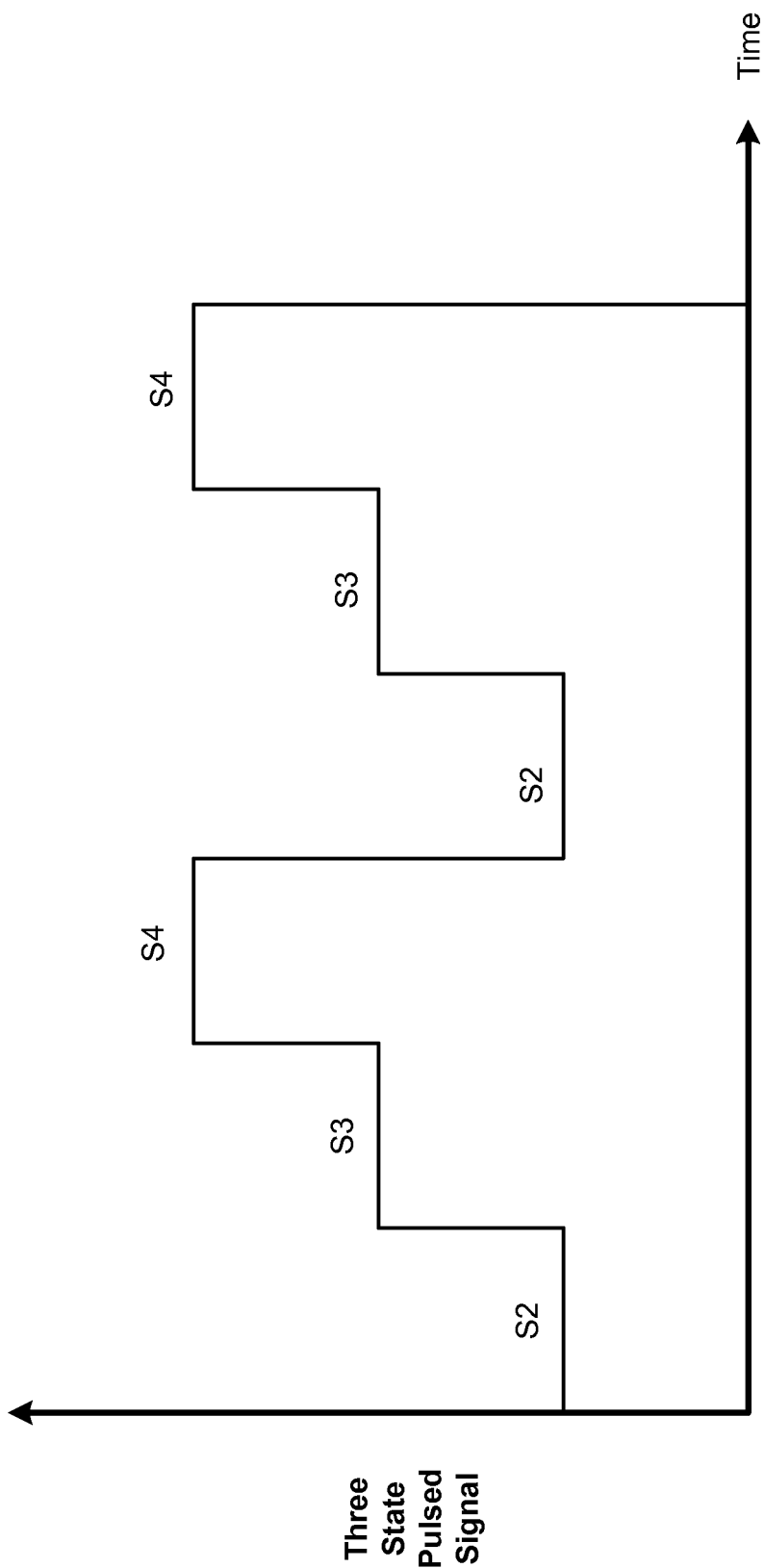
FIG. 9 is a diagram of a three state pulsed signal that is used to generate three states, in accordance with various embodiments of the present disclosure.

FIG. 9 is a diagram of an embodiment of a three state pulsed signal that is used to generate the three states S2, S3, and S4. The three states S2, S3, and S4 repeat every clock cycle. Each state S2, S3, and S4 is shown to occupy 33% of a duty cycle. In some embodiments, each of the states S2, S3, and S4 occupy a portion of a duty cycle that is different than 33%. For example, the state S2 occupies 20% of a duty cycle, the state S3 occupies 50% of the duty cycle, and the state S4 occupies 30% of the duty cycle. As another example, the state S2 occupies 40% of a duty cycle, the state S3 occupies 10% of the duty cycle, and the state S4 occupies 50% of the duty cycle.

The three state pulsed signal is generated by a clock source, e.g., a crystal oscillator, etc., or by a computer and provided to one or more the x, y, and z MHz RF generators instead of providing the two state pulsed signal 326 (FIGS. 6A, 6B, 7, and 8) to the x MHz RF generator, the y MHz RF generator, the z MHz RF generator, the gap control system 362, the pressure control system 364, and/or the flow control system 366. Upon receiving the three state pulsed signal, any one of the x MHz RF generator, the y MHz RF generator, and the z MHz RF generator generates an RF signal having a statistical measure illustrated in the graph a8 (FIG. 1C-2), or in the graph a9 (FIG. 1C-2), or in the graph a12 (FIG. 1D-2), or in the graph a13 (FIG. 1D-2). Similarly, upon receiving the three state pulsed signal, any one of the x MHz RF generator, the y MHz RF generator, and the z MHz RF generator generates an RF signal having a statistical measure illustrated in the graph b8 (FIG. 2C-2), or in the graph b9 (FIG. 2C-2), or in the graph b12 (FIG. 2D-2), or in the graph b13 (FIG. 2D-2). Moreover, upon receiving the three state pulsed signal, any one of the gap control system 362, the pressure control system 364, and the flow control system 366 generates a signal as illustrated in the graph a8 (FIG. 1C-2), or in the graph a9 (FIG. 1C-2), or in the graph a12 (FIG. 1D-2), or in the graph a13 (FIG. 1D-2). Similarly, upon receiving the three state pulsed signal, any one of the gap control system 362, the pressure control system 364, and the flow control system 366 generates a signal illustrated in the graph b8 (FIG. 2C-2), or in the graph b9 (FIG. 2C-2), or in the graph b12 (FIG. 2D-2), or in the graph b13 (FIG. 2D-2).

In various embodiments, upon receiving the three state pulsed signal, a combination of the x, y, and z MHz RF generators generates RF signals having statistical measures illustrated in a combination of the graph a8 (FIG. 1C-2), the graph a9 (FIG. 1C-2), the graph a12 (FIG. 1D-2), the graph a13 (FIG. 1D-2), the graph b8 (FIG. 2C-2), the graph b9 (FIG. 2C-2), the graph b12 (FIG. 2D-2), and the graph b13 (FIG. 2D-2). Similarly, in some embodiments, upon receiving the three state pulsed signal, a combination of the gap control system 362, the pressure control system 364, and the flow control system 366 generates signals illustrated in a combination of the graph a8 (FIG. 1C-2), the graph a9 (FIG. 1C-2), the graph a12 (FIG. 1D-2), the graph a13 (FIG. 1D-2), the graph b8 (FIG. 2C-2), the graph b9 (FIG. 2C-2), the graph b12 (FIG. 2D-2), and the graph b13 (FIG. 2D-2).

In several embodiments, the three state pulsed signal is generated by a clock source or by a computer and provided to the phase delay circuit 138 (FIGS. 6B, 7, 8) to generate a delayed three state pulsed signal. The delayed three state pulsed signal is provided to the x MHz RF generator, the y MHz RF generator, the z MHz RF generator. Upon receiving the delayed three state pulsed signal, the x MHz RF generator, the y MHz RF generator, and the z MHz RF generator generate RF signals in synchronization with the three state pulsed signal.

In various embodiments, the three state pulsed signal is generated by a clock source or by a computer and provided to the gap processor 130 (FIGS. 6B, 7, 8), the WAP processor 140 (FIGS. 6B, 7, 8), and the flow processor 146 (FIGS. 6B, 7, 8). Upon receiving the three state pulsed signal, the gap processor 130 and the flow processor 146 control their corresponding motors 136 and 150 via a corresponding driver for each state S2, S3, and S4. Moreover, upon receiving the three state pulsed signal, the WAP processor 140 controls the motor 144 via a corresponding control for each state S2, S3, and S4.

In some embodiments, two digital clock sources, e.g., processors, computers, crystal oscillators and analog-to-digital converters, etc., are used to generate a three state pulsed signal. A first clock signal of a first one of the digital clock sources has a state 1 and 0 and a second clock signal of a second one of the digital clock sources has a state 1 and 0. An adder, e.g., an addition circuit, etc., is coupled with the two digital clock sources to sum the first and second digital signals to generate the pulsed signal having the three states. The adder is coupled to the x MHz RF generator, and/or the y MHz RF generator, and/or the z MHz RF generator, and/or the phase delay circuit 138, and/or the gap control system 362, and/or the pressure control system 364, and/or the flow control system 366 to provide the three state pulsed signal to the x MHz RF generator, and/or the y MHz RF generator, and/or the z MHz RF generator, and/or the phase delay circuit 138, and/or the gap control system 362, and/or the pressure control system 364, and/or the flow control system 366.

Figure 10:
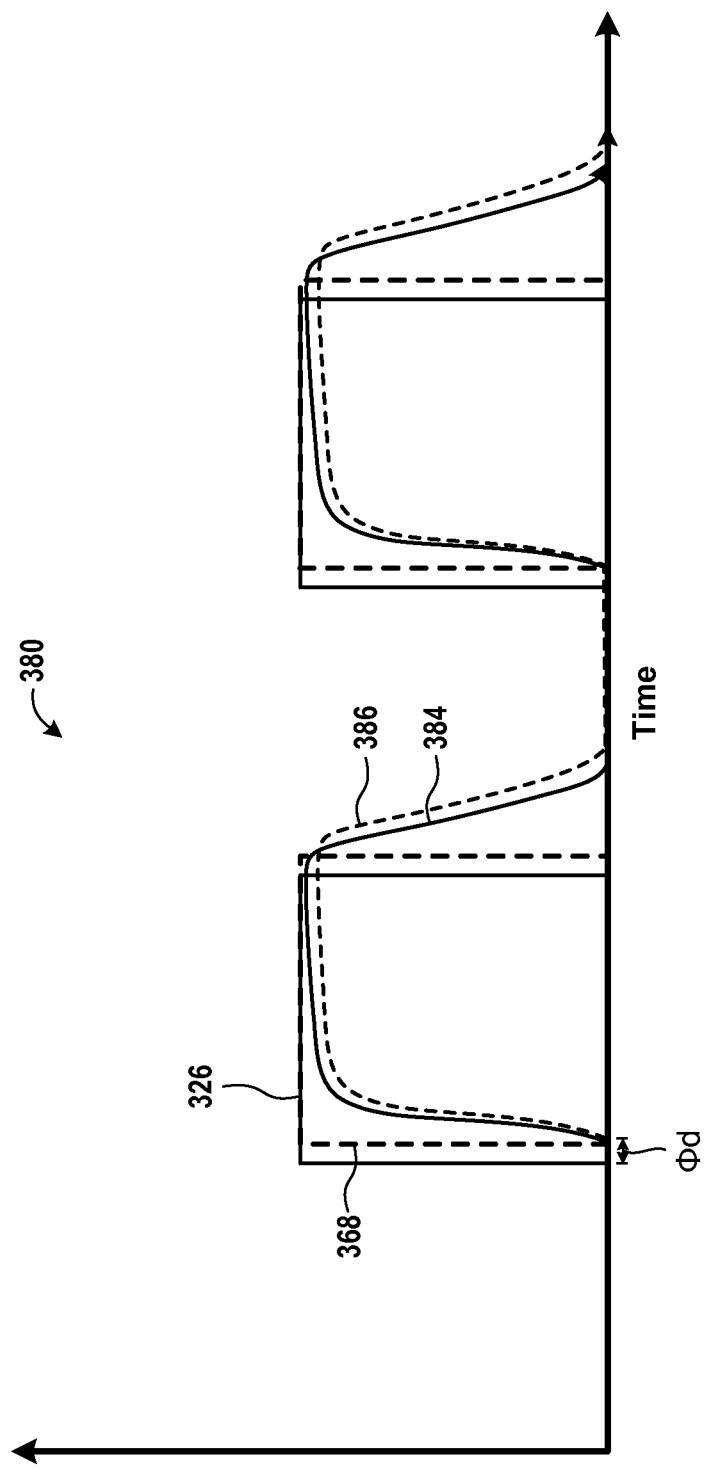
FIG. 10 is a graph illustrating the first variable and the second variable in synchronization with a pulsed signal, in accordance with various embodiments of the present disclosure.

FIG. 10 is a graph 380 to illustrate a group phase delay of the first variable and the second variable compared to a phase of the pulsed signal 326. The graph 380 plots a magnitude of a signal on a y-axis versus the time t on an x-axis. The graph 380 plots the first variable on the y-axis versus time. The first variable is shown as a signal 384. Also, the graph 380 plots the second variable on the y-axis versus the time t. The second variable is shown as a signal 386.

It should be noted that the graph 380 is not to scale. For example, although the signals 326, 368, 384, and 386 are shown to have about the same magnitude at some time, magnitude of any of the signals 326, 368, 384, and 386 is different than one or more of the remaining of the signals 326, 368, 384, and 386.

After a group phase delay, e.g., a phase delay $\phi d$, etc., is applied by the phase delay circuit 138 (FIGS. 6B, 7, and 8) to the pulsed signal 326 to generate the modified pulsed signal 368, which is applied to the x MHz RF generator, the y MHz RF generator, the z MHz RF generator. Any two of the x, y, and z MHz RF generators generate two RF signals that have the signals 384 and 386 as statistical measures of the RF signals. The two RF signals provided by two of the x MHz RF generator, the y MHz RF generator, and the z MHz RF generator are generated after or at the group phase delay.

Although the graph 380 shows the signals 384 and 386 for any two of the x MHz RF generator, the y MHz RF generator, and the z MHz RF generator, in some embodiments, the graph 380 includes statistical measures of RF signals that are generated by one or more of the x MHz RF generator, the y MHz RF generator, and the z MHz RF generator.

In some embodiments, the signal 384 illustrates the first parameter instead of the first variable and the signal 386 illustrates the second parameter instead of the second variable.

Although the embodiments above are described using the x, y, and z MHz RF generators, in some embodiments, any other number of RF generators, e.g., two RF generators, one RF generator, four RF generators, etc., are used.

It is noted that although the above-described embodiments are described with reference to the parallel plate plasma chamber 308, in one embodiment, the above-described embodiments apply to other types of plasma chambers, e.g., a plasma chamber including an inductively coupled plasma (ICP) reactor, a plasma chamber including an electron-cyclotron resonance (ECR) reactor, etc. For example, the x, y, and z MHz RF generators are coupled to an inductor within the ICP plasma chamber.

It should be noted that although the above-described embodiments relate to providing an RF signal to the lower electrode of the chuck 132 and grounding the upper electrode 134, in several embodiments, the RF signal is provided to the upper electrode 134 while the lower electrode of the chuck 132 is grounded.

Embodiments described herein may be practiced with various computer system configurations including hand-held hardware units, microprocessor systems, microprocessor-based or programmable consumer electronics, minicomputers, mainframe computers and the like. The embodiments can also be practiced in distributed computing environments where tasks are performed by remote processing hardware units that are linked through a network.

With the above embodiments in mind, it should be understood that the embodiments can employ various computer-implemented operations involving data stored in computer systems. These operations are those using physical manipulation of physical quantities. Any of the operations described herein that form part of the embodiments are useful machine operations. The embodiments also relates to a hardware unit or an apparatus for performing these operations. The apparatus may be specially constructed for a special purpose computer. When defined as a special purpose computer, the computer can also perform other processing, program execution or routines that are not part of the special purpose, while still being capable of operating for the special purpose. In some embodiments, the operations may be processed by a general purpose computer selectively activated or configured by one or more computer programs stored in the computer memory, cache, or obtained over a network. When data is obtained over a network the data may be processed by other computers on the network, e.g., a cloud of computing resources.

One or more embodiments can also be fabricated as computer-readable code on a non-transitory computer-readable medium, e.g., a storage device. The non-transitory computer-readable medium is any data storage hardware unit that can store data, which can be thereafter be read by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), magnetic tapes and other optical and non-optical data storage hardware units. The non-transitory computer-readable medium can include computer-readable tangible medium distributed over a network-coupled computer system so that the computer-readable code is stored and executed in a distributed fashion.

Although the operations above were described in a specific order, it should be understood that other housekeeping operations may be performed in between operations, or operations may be adjusted so that they occur at slightly different times, or may be distributed in a system which allows the occurrence of the processing operations at various intervals associated with the processing, as long as the processing of the overlay operations are performed in the desired way.

One or more features from any embodiment may be combined with one or more features of any other embodiment without departing from the scope described in various embodiments described in the present disclosure.

Although the foregoing embodiments have been described in some detail for purposes of clarity of understanding, it will be apparent that certain changes and modifications can be practiced within the scope of the appended claims. Accordingly, the present embodiments are to be considered as illustrative and not restrictive, and the embodiments are not to be limited to the details given herein, but may be modified within the scope and equivalents of the appended claims.

The invention claimed is:

1. A plasma system comprising:
a master radiofrequency (RF) generator for generating a first portion of a master RF signal during a first state of a digital pulsed signal, a second portion of the master RF signal during a second state of the digital pulsed signal, and a third portion of the master RF signal during a third state of the digital pulsed signal, wherein the master RF signal is a sinusoidal signal;
a slave RF generator for generating a slave RF signal in synchronization with the master RF generator, wherein the slave RF generator is configured to generate a first portion of the slave RF signal during the first state of the digital pulsed signal, a second portion of the slave RF signal during the second state of the digital pulsed signal, and a third portion of the slave RF signal during the third state of the digital pulsed signal, wherein during the first state, the digital pulsed signal has a first horizontal level, during the second state, the digital pulsed signal has a second horizontal level, and during the third state, the digital pulsed signal has a third horizontal level, wherein the third horizontal level is different from the first horizontal level and from the second horizontal level and the second horizontal level is different from the first horizontal level, wherein the digital pulsed signal transitions from an instance of the first horizontal level to an instance of the second horizontal level, transitions from the instance of the second horizontal level to an instance of the third horizontal level, and transitions from the instance of the third horizontal level to another instance of the first horizontal level to repeat the first, second, and third horizontal levels periodically;
an impedance matching circuit coupled to the master RF generator via an RF cable, wherein the impedance matching circuit is coupled to the slave RF generator via another RF cable, wherein the impedance matching circuit is configured to modify the master RF signal and the slave RF signal to generate a modified RF signal; and
a plasma chamber having an electrode coupled to the impedance matching circuit via an RF transmission line, the plasma chamber is configured to generate plasma based on the modified RF signal received by the electrode,
wherein an envelope of the first portion of the master RF signal has a positive slope,
wherein an envelope of the second portion of the master RF signal has a slope different from the positive slope of the envelope of the first portion of the master RF signal, and
wherein an envelope of the third portion of the master RF signal has a slope of zero and the slope of zero is different from the slope of the envelope of the second portion of the master RF signal.

2. The plasma system of claim 1, wherein the slave RF generator is coupled to the master RF generator for receiving a first portion of the digital pulsed signal during the first state from the master RF generator and a second portion of the digital pulsed signal during the second state from the master RF generator, wherein the slave signal is a sinusoidal signal,
wherein an envelope of the first portion of the slave RF signal has a positive slope.

3. The plasma system of claim 2, wherein the envelope of the first portion of the slave RF signal has the positive slope during at least a portion of a time in which the envelope of the first portion of the master RF signal has the positive slope.

4. The plasma system of claim 1, wherein the master RF signal has frequency and power.

5. The plasma system of claim 1, wherein the electrode is included within a chuck, the plasma system further comprising:

a gap control system coupled to the master RF generator for generating a first portion of a gap signal and a second portion of the gap signal,
wherein the plasma chamber includes an upper electrode facing the chuck,
the gap control system further coupled to the upper electrode of the plasma chamber via a motor for changing a gap between the upper electrode and the chuck,
wherein the first portion of the gap signal has a positive slope.

6. The plasma system of claim 1, wherein the electrode is included within a chuck, the plasma system further including an upper electrode and a gap sensor for determining an amount of gap between the upper electrode and the chuck.

7. The plasma system of claim 1, wherein the plasma chamber has a chuck and an upper electrode, the plasma system further comprising:

a host system for generating the digital pulsed signal; and
a phase delay circuit coupled to the host system for delaying a phase of the digital pulsed signal based on an amount of gap between the upper electrode and the chuck, the host system coupled to the master RF generator via the phase delay circuit.

8. The plasma system of claim 1, wherein the impedance matching circuit modifies the master RF signal and the slave RF signal by matching an impedance of a load coupled to the impedance matching circuit with that of a source coupled to the impedance matching circuit.

9. The plasma system of claim 1, wherein the positive slope is non-zero and finite.

10. The plasma system of claim 1, wherein RF values of the third portion of the master RF signal are zero.

11. The plasma system of claim 1, wherein each of the first state, the second state, and the third state occupies an amount of time during a clock cycle, wherein the envelope of the first portion of the master RF signal has the positive slope during one of the amounts of time of the clock cycle, wherein during another one of the amounts of time of the clock cycle, the envelope of the second portion of the master RF signal has the different slope, wherein during an additional one of the amounts of time of the clock cycle, the envelope of the third portion of the master RF signal has the slope of zero.

12. The plasma system of claim 1, wherein the envelope of the first portion of the master RF signal is an amplitude of the first portion of the master RF signal, wherein the envelope of the second portion of the master RF signal is an amplitude of the second portion of the master RF signal, and wherein the envelope of the third portion of the master RF signal is an amplitude of the third portion of the master RF signal.

13. The plasma system of claim 1, wherein the digital pulsed signal is generated by a logic circuit.

14. The plasma system of claim 1, wherein during the first state, an envelope of a first portion of the slave RF signal has a positive slope, during the second state, an envelope of the second portion of the master RF signal has a negative slope, and during the second state, an envelope of a second portion of the slave RF signal has a negative slope.

15. A plasma system comprising:

a first radiofrequency (RF) generator for generating a first portion of a first RF signal during a first state of a digital pulsed signal, a second portion of the first RF signal during a second state of the digital pulsed signal, and a third portion of the first RF signal during a third state of the digital pulsed signal, wherein the first RF signal is a sinusoidal signal,
a second RF generator for generating a second RF signal in synchronization with the first RF generator, wherein the second RF generator is configured to generate a first portion of the second RF signal during the first state of the digital pulsed signal, a second portion of the second RF signal during the second state of the digital pulsed signal, and a third portion of the second RF signal during the third state of the digital pulsed signal, wherein during the first state, the digital pulsed signal has a first horizontal level, during the second state, the digital pulsed signal has a second horizontal level, and during the third state, the digital pulsed signal has a third horizontal level, wherein the third horizontal level is different from the first horizontal level and from the second horizontal level and the second horizontal level is different from the first horizontal level, wherein the digital pulsed signal transitions from an instance of the first horizontal level to an instance of the second horizontal level, transitions from the instance of the second horizontal level to an instance of the third horizontal level, and transitions from the instance of the third horizontal level to another instance of the first horizontal level to repeat the first, second, and third horizontal levels periodically,
wherein the first RF generator is coupled to an impedance matching circuit via an RF cable, wherein the second RF generator is coupled to the impedance matching circuit via another RF cable, wherein the impedance matching circuit is coupled to an electrode of a plasma chamber, wherein an envelope of the first portion of the first RF signal has a positive slope, wherein an envelope of the second portion of the first RF signal has a slope different from the positive slope of the envelope of the first portion of the first RF signal, and wherein an envelope of the third portion of the first RF signal has a slope of zero and the slope of zero is different from the slope of the envelope of the second portion of the first RF signal.

16. The plasma system of claim 15, wherein the second RF signal is a sinusoidal signal, and wherein an envelope of the first portion of the second RF signal has a positive slope.

17. The plasma system of claim 15, wherein RF values of the third portion of the first RF signal are zero.

18. The plasma system of claim 15, wherein the envelope of the first portion of the first RF signal is an amplitude of the first portion of the first RF signal, wherein the envelope of the second portion of the first RF signal is an amplitude of the second portion of the first RF signal, and wherein the envelope of the third portion of the first RF signal is an amplitude of the third portion of the first RF signal.

19. The plasma system of claim 15, wherein each of the first state, the second state, and the third state occupies an amount of time during a clock cycle, wherein the envelope of the first portion of the first RF signal has the positive slope during one of the amounts of time of the clock cycle, wherein during another one of the amounts of time of the clock cycle, the envelope of the second portion of the first RF signal has the different slope, wherein during an additional one of the amounts of time of the clock cycle, the envelope of the third portion of the first RF signal has the slope of zero.

20. The plasma system of claim 15, further comprising a host computer system coupled to the first RF generator and to the second RF generator, wherein the host computer system is configured to generate the digital pulsed signal and supply the digital pulsed signal to the first and second RF generators.

* * * * *